United States Patent
Shimogishi et al.

(10) Patent No.: US 7,327,026 B2
(45) Date of Patent: **\*Feb. 5, 2008**

(54) VACUUM DIODE-TYPE ELECTRONIC HEAT PUMP DEVICE AND ELECTRONIC EQUIPMENT HAVING THE SAME

(75) Inventors: Kenji Shimogishi, Sakai (JP);
Yoshihiko Matsuo, Yamatotakada (JP);
Yoichi Tsuda, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 300 days.

This patent is subject to a terminal disclaimer.

(21) Appl. No.: 10/984,979

(22) Filed: Nov. 10, 2004

(65) Prior Publication Data

US 2005/0104185 A1    May 19, 2005

(30) Foreign Application Priority Data

| Nov. 12, 2003 | (JP) | ............................ P2003-382634 |
| Dec. 1, 2003 | (JP) | ............................ P2003-401376 |
| Dec. 1, 2003 | (JP) | ............................ P2003-401377 |
| Dec. 1, 2003 | (JP) | ............................ P2003-401379 |
| Dec. 15, 2003 | (JP) | ............................ P2003-416485 |
| Dec. 24, 2003 | (JP) | ............................ P2003-426417 |

(51) Int. Cl.
*H01L 23/34* (2006.01)
*H01L 23/02* (2006.01)

(52) U.S. Cl. ...................... 257/712; 257/104; 257/686; 438/979; 438/109

(58) Field of Classification Search ................ 257/712, 257/104, 686
See application file for complete search history.

(56) References Cited

U.S. PATENT DOCUMENTS

| 5,675,972 A | 10/1997 | Edelson |
| 6,417,060 B2 | 7/2002 | Tavkhelidze et al. |
| 2005/0110099 A1* | 5/2005 | Shimogishi et al. ........ 257/378 |

FOREIGN PATENT DOCUMENTS

| JP | 5-80818 U | 11/1993 |
| JP | 6-147524 A | 5/1994 |
| JP | 8-126567 A | 5/1996 |
| JP | 9-61032 A | 3/1997 |
| JP | 9-159242 A | 6/1997 |
| JP | 9-196415 A | 7/1997 |
| JP | 2001-208465 A | 8/2001 |
| JP | 2002-13757 A | 1/2002 |
| JP | 2002-162143 A | 6/2002 |
| JP | 2002-540636 A | 11/2002 |
| WO | 99/13562 A1 | 3/1999 |
| WO | 00/59047 A1 | 10/2000 |

* cited by examiner

*Primary Examiner*—Theresa T. Doan
*Assistant Examiner*—Sarah K. Salerno
(74) *Attorney, Agent, or Firm*—Nixon & Vanderhye P.C.

(57) ABSTRACT

An electronic heat pump device has an emitter and a collector, stems supporting these components, a spacing retention member for keeping a spacing between the stems constant, and a sealing member for maintaining a vacuum between the stems. The emitter has a first semiconductor substrate and an emitter electrode, while the collector has a second semiconductor substrate and a collector electrode. The emitter electrode and the collector electrode are disposed so as to be opposed to each other with a space interposed therebetween. At least one of the first and second semiconductor substrates is integrally formed with electrically and thermally insulative spacers that keep the space between the emitter electrode and the collector electrode constant.

18 Claims, 43 Drawing Sheets

VACUUM DIODE-TYPE ELECTRONIC HEAT PUMP DEVICE AND ELECTRONIC EQUIPMENT HAVING THE SAME

CROSS-REFERENCES TO RELATED APPLICATIONS

This nonprovisional application claims priority under 35 U.S.C. §119(a) on Patent Applications Nos. 2003-382634, 2003-401376, 2003-401377, 2003-401379, 2003-416485, and 2003-426417 filed in Japan on 12 Nov. 2003, 1 Dec. 2003, 1 Dec. 2003, 1 Dec. 2003, 15 Dec. 2003, and 24 Dec. 2003, respectively, the entire contents of which are hereby incorporated by reference.

BACKGROUND OF THE INVENTION

The present invention relates to an electronic heat pump device for performing, for example, conversion from electric energy to heat energy (electric to thermal energy conversion), and more specifically, relates to an electronic heat pump device in which a distance between an emitter and a collector is approximated to a nano-level distance, and a voltage is applied so as to emit electrons from the emitter side with use of electron tunneling, thereby cooling one-side surface of the apparatus while heating the other-side surface without the necessity of refrigerants and compressors and without a mechanical operation section. The present invention further relates to electronic equipment utilizing the electronic heat pump device and a method of manufacturing the electronic heat pump device.

Conventional electronic heat pump devices are typified by peltiert devices. The peltiert device is an electronic heat pump device which has, as shown in FIG. 37, a p-type semiconductor 51, an n-type semiconductor 52 and metal electrodes 53 and uses Peltier effect. In the peltiert device, voltage application and current feeding cause heat absorption or heat generation between each of the semiconductors 51, 52 and the electrodes 53, so that heat is traveled from an endothermic portion to an exothermic portion.

Moreover, as shown in FIG. 38, electronic heat pump devices different in structure from the peltiert devices are vacuum diode-type electronic heat pump devices having a vacuum gap 63 formed between an emitter 61 and a collector 62, and their concrete examples include the following first to fourth electronic heat pump devices.

As shown in FIG. 39, the first electronic heat pump device is structured such that a cathode 71 (equivalent to an emitter) which is thermally connected to a cooling target and an anode 72 (equivalent to a collector) which is thermally connected to a heating target face to each other with a vacuum gap (vacuum atmosphere) 73 interposed therebetween, and a voltage is applied to between electrodes 71a and 72a to feed current (see U.S. Pat. No. 5,675,972).

The cathode electrode 71a and the anode electrode 72a are formed from a material having a low work function such as complexes made of alkali metal, and the work function of the cathode electrode 71a is lower than the work function of the anode electrode 72a. Causing a temperature difference between the cathode 71 and the anode 72 generates an electron flow from the cathode electrode 71a to the anode electrode 72a.

The term "work function" herein refers to a physical property value representing an electron emission capability of a given material in the case where with certain energy (e.g., heat or electric field) applied to the material, electrons are extracted from the surface of the material beyond an external energy barrier (e.g., vacuum). A lower work function signifies a larger electron emission amount.

As shown in FIG. 40, the second electronic heat pump device has an emitter 81 connected to a first thermal conduction section 84, and a collector 82 connected to a second thermal conduction section 85 through a piezoelectric element 86 (see International Publication No. WO99/13562).

The vacuum gap 83 between the emitter 81 and the collector 82 is maintained to be a specified space by expanding or shrinking the piezoelectric element 86 through electric control while capacitance between the emitter 81 and the collector 82 is being regulated.

As shown in FIG. 41, the third electronic heat pump device has an emitter 81 connected to a first thermal conduction section 84 and a collector 82 connected to a second thermal conduction section 85 through a piezoelectric element 86 (see U.S. Pat. No. 6,417,060 B2).

Capacitance between the emitter 81 and the collector 82 is read at any time and the data is processed in a piezo feedback circuit 87, after which the piezoelectric element 86 is expanded or shrunk so as to maintain the vacuum gap 83 between the emitter 81 and the collector 82 to be a specified distance.

Further, in the second and third electronic heat pump devices, the emitter 81 and the collector 82 are formed by a manufacturing method in which a thin film made of Si, Ti, Mo or the like is formed as a sacrificial layer on one electrode member, and the other electrode is laid on top of the sacrificial layer to form a three-layer structure. Then, the three-layer structure is cooled to preferably −100° C. to −150° C. to destroy the sacrificial layer, and finally two electrodes that would be the emitter 81 and the collector 82 are formed. It is to be noted that there is another manufacturing method in which Cd, Zn, Na, or K is used as the sacrificial layer material, and the sacrificial layer is heated and melted so as to obtain the two electrodes.

Then, the vacuum gap 83 is regulated to be 10 nm or less, more preferably, 5 nm or less, and a voltage is applied to both the electrodes to feed current, by which an electronic heat pump device capable of cooling the emitter 81 side while heating the collector 82 side is manufactured.

As shown in FIG. 42, the fourth electronic heat pump device has an emitter 91, a collector 92 and a dielectric 94 disposed in a vacuum gap 93 between the emitter 91 and the collector 92 (see JP 2002-540636 A). The dielectric 94 is made of a material containing $Al_2O_3$ or $SiO_2$, which is formed into a spherical shape or a wire shape or is spread over the electrodes by sputtering, and becomes a barrier to maintain the spacing of the vacuum gap 93. Then, electronic filtering by the dielectric (barrier) 94 is performed to move electrons together with heat from the emitter 91.

However, the conventional electronic heat pump devices have the following problems.

In the Peltier device shown in FIG. 37, voltage application and current feeding causes heat absorption or heat generation between each of the semiconductors 51, 52 and the electrodes 53. However, since heat is generated at both ends of each of the semiconductors 51, 52, back flows of heat through the semiconductors 51, 52 occur as shown by arrow 50 to deteriorate thermal conversion efficiency, causing a problem that a specified cooling capability cannot be achieved without an increased power consumption.

Moreover, in the first electronic heat pump device shown in FIG. 39, it is necessary to support both the cathode 71 and the anode 72 for maintaining the vacuum gap 73 at a specified spacing. However, in this structure, the electrodes 71, 72 each are thermally in direct contact with the cooling target or the heating target, and so the cathode 71 and the anode 72 are warped by stress including the weights of the targets themselves and atmospheric pressure, which makes it difficult to maintain the specified spacing. Moreover, in the worst case, the cathode 71 and the anode 72 adhere to each other and fail to function as an electronic heat pump device.

Further, in the second electronic heat pump device shown in FIG. 40, in order to solve the problem of the first electronic heat pump device shown in FIG. 39, regulation of capacitance is performed in one electrode by a capacitance controller 88 using the piezoelectric element 86 so as to maintain the vacuum gap 83 at a specified distance. However, the gap regulation is performed based on measurement of capacitance through the piezoelectric element 86, and therefore during operation of the electronic heat pump device, heating of the collector 82 side causes the piezoelectric element 86 to have a temperature capacity change, which makes the capacitance of the emitter 81 and the collector 82 imponderable, and thereby disables the vacuum gap 83 from maintaining a specified value. That is, it becomes impossible to maintain the vacuum gap 83 at a specified spacing. Further, at the midpoint of a heat transfer path from the collector 82 where heat generates to the second thermal conduction section 85, there is present a line that links the piezoelectric element 86 and the capacitance controller 88, which causes a considerable loss in heat transfer from the collector 82 to the second thermal conduction section 85.

Further, in the third electronic heat pump device shown in FIG. 41, in order to solve the problem concerning the vacuum gap 83 involving the capacitance in the second electronic heat pump device shown in FIG. 40, the capacitance is measured directly in the emitter 81 and the collector 82 and the piezoelectric element 86 is provided as a separate circuit, which performs full-time control so as to maintain the vacuum gap 83 to be a specified distance.

In this case, a gap regulator circuit made of the piezoelectric element 86 which offers full-time operation is required, which is considered to increase power consumption in a circuit unrelated to an original electronic heat pump device. Moreover, since individual electronic heat pump devices are controlled by the aforementioned circuit, it becomes difficult to develop a unitized structure using a plurality of electronic heat pump devices in consideration of the expansion of heat pump capacity. Further, at the midpoint of a heat transfer path from the collector 82 where heat generates to the second thermal conduction section 85, there is present a line that links the piezoelectric element 86 and the capacitance controller 88, which causes a considerable loss in heat transfer from the collector 82 to the second thermal conduction section 85.

Further, in the fourth electronic heat pump device shown in FIG. 42, it is difficult to dispose the dielectric 94 so as to have a constant area ratio to the emitter 91 and the collector 92. Further, it has been stated that the dielectric 94 is spread over the electrodes by sputtering, and electronic filtering is performed to move electrons together with heat. However, as with the Peltier device, a back flow of heat through the dielectric 94 occurs, thereby causing a problem of poor cooling efficiency and increased power consumption.

SUMMARY OF THE INVENTION

Accordingly, an object of the present invention is to provide a vacuum diode-type electronic heat pump device which is low in power consumption and is no need of an additional circuit for maintaining a vacuum gap, and a manufacturing method thereof, as well as to provide various electronic equipment to which such an electronic heat pump device is applied.

In order to accomplish the above object, a vacuum diode-type electronic heat pump device according to one aspect of the present invention includes a first support member; a first semiconductor substrate having one surface connected to the first support member such that electricity and heat are able to be conducted; a first internal electrode provided on the other surface of the first semiconductor substrate; a second support member; a second semiconductor substrate having one surface connected to the second support member such that electricity and heat are able to be conducted; and a second internal electrode provided on the other surface of the second semiconductor substrate.

One of the first and second semiconductor substrates and the internal electrode corresponding to the one semiconductor substrate constitute an emitter, and the other of the first and second semiconductor substrates and the internal electrode corresponding to the other semiconductor substrate constitute a collector.

The first internal electrode and the second internal electrode are disposed so as to face each other with a space therebetween.

One or more spacers which keep the space between the first internal electrode and the second internal electrode constant and which are electrically and thermally insulative are integrally formed on at least one of the first semiconductor substrate and the second semiconductor substrate.

Also, the electronic heat pump device further includes an electrically and thermally insulative spacing retention member disposed between the first support member and the second support member for keeping a spacing between the first support member and the second support member constant, and a sealing member for maintaining a vacuum between the first support member and the second support member.

Herein, examples of the first semiconductor substrate and the second semiconductor substrate include an n-type Si wafer. Examples of the spacing retention member include an insulative washer and a resin bolt. Examples of the sealing member include a low-melting point glass. Examples of the first internal electrode include a thin film made of a conductive material formed on the surface of the first semiconductor substrate. Examples of the second internal electrode include a thin film made of a conductive material formed on the surface of the second semiconductor substrate. The space in a vacuum state performs filtering for high-energy electrons moving from the emitter side to the collector side. The spacer(s) integrally formed on the semiconductor substrate (at least one of the first semiconductor substrate and the second semiconductor substrate) include(s) a spacer(s) formed by applying thermal oxidation to a surface of a substrate, which is an Si wafer, to form an $SiO_2$ film and then etching the $SiO_2$ film.

According to the electronic heat pump device of the present invention, a space (vacuum gap) is present between the first internal electrode and the second internal electrode, which makes it possible to provide a vacuum gap diode structure to the electronic heat pump device, and thereby allows prevention of the back flow of heat to achieve power consumption smaller than that of the Peltier device.

Further, the spacer(s) which keep(s) the space constant and which are(is) electrically and thermally insulative are(is) integrally formed in at least one of the first semiconductor substrate or the second semiconductor substrate, which makes it possible to maintain the vacuum gap at a specified spacing while the back flow of heat is prevented in a simple structure with a smaller number of component parts. More particularly, the piezoelectric element, the capacitance controller, the piezo feedback circuit and the like, which have been required as means to maintain the vacuum gap between the emitter and the collector at a specified spacing in the conventional electronic heat pump device of vacuum gap diode structure, become unnecessary, which makes it possible to reduce the number of component parts, thereby allowing reduction in size, weight and cost.

Further, adjusting the thickness of the spacer(s) so as to approximate the size of the space (vacuum gap) to a nano level enables the barrier height to be decreased and the electron emission effect of the emitter to be enhanced. More specifically, the space constitutes a barrier against electron tunneling between the emitter and the collector, and decreasing the spacing between the first internal electrode and the second internal electrode allows reduction of a physical barrier height.

In one embodiment, the sealing member is in contact with the first sealing member and the second sealing member and is electrically and thermally insulative. It is to be noted that the sealing member may be a one-piece member which seals the first support member and the second support member, or the sealing member may be composed of separate portions: a portion for sealing a space between the first support member and the spacing retention member; and a portion for sealing a space between the second support member and the spacing retention member.

According to the embodiment, the sealing member ensures maintenance of a vacuum between the first support member and the second support member.

In one embodiment, values of maximum roughness Rz of a surface of the first internal electrode and a surface of the second internal electrode are not more than ½ of a minimum value of the space between the first internal electrode and the second internal electrode.

The "maximum roughness Rz" is an unevenness caused by, for example, warpage, waviness and rough surface.

According to the embodiment, the surfaces of both the internal electrodes are smoothed so as to reduce defects, which would be caused by roughness due to surface asperity of the internal electrodes. For example, it becomes possible to reduce short circuit failures caused by contact between both the internal electrodes due to surface protruding portions facing to each other, and to mitigate a drop in the electron emission amount and cooling amount caused by expansion of a space (vacuum gap) due to surface recess portions opposed to each other. More specifically, if a value of the maximum roughness Rz exceeds ½ of a maximum value of the spacing, then the electron emission amount from the emitter is reduced by expansion of the space (vacuum gap) due to the surface recess portions facing each other and warpage, and thereby the cooling amount is reduced, while the surface protruding portions facing each other may bring the two internal electrodes into contact with each other, thereby causing short circuit failures.

In one embodiment, the first internal electrode and the second internal electrode are of any one of a single metal, a metal alloy, a metal-nonmetal compound, a semiconductor material, or an impurity-doped semiconductor material. More specifically, they may be, for example, silicide, $TiSi_2$, $CoSi_2$, $WSi_2$, $PtSi$, $MoSi_2$, $Pd_2Si$, $TaSi_2$ and the like.

According to the embodiment, smooth surfaces of both the internal electrodes and electron discharge or release from the emitter can effectively be achieved.

In one embodiment, of the first internal electrode and the second internal electrode, at least an emitter-side internal electrode is made of a material containing at least any one of cesium (Cs), carbon (C), titanium (Ti), molybdenum (Mo), tungsten (W), chromium (Cr), vanadium (V), nickel (Ni), copper (Cu), silicon (Si), tantalum (Ta), zirconium (Zr), silver (Ag), gold (Au), platinum (Pt), or aluminum (Al).

These materials are low in work function. According to the embodiment, therefore, if at least the emitter-side internal electrode (e.g., the first internal electrode) is made of any one of the above-stated materials, particularly an electrode material containing Cs, then a considerable decrease in the work function may be achieved. More particularly, it becomes possible to implement an electronic heat pump device capable of enhancing electron emission from the emitter side, reducing a voltage application amount, and reducing power consumption.

In one embodiment, the first support member and the second support member have respective hollow sections, both the hollow sections and the space between the first internal electrode and the second internal electrode are vacuum, and both the hollow sections and the space have an identical degree of vacuum by means of air holes provided in the first support member and the second support member.

According to the embodiment, since the emitter and the collector are interposed between the hollow sections of the first and second support members, only the outermost portions of both the support members are affected by stress of atmospheric pressure. Consequently, stress is not directly exerted to the emitter and the collector, which makes it possible to implement an electronic heat pump device free from deformation and breakage due to pressure deflection.

In one embodiment, a work function of the first internal electrode is almost equal to or lower than a work function of the second internal electrode.

The term "work function" herein refers to a physical property value representing an electron emission capability of a given material in the case where certain energy (e.g., heat and electric field) is applied to the material, and electrons are extracted from a surface of the material beyond an external energy barrier (e.g., vacuum), where a lower work function signifies a larger electron emission amount.

According to the embodiment, in the case where the work function of the first internal electrode is almost equal to the work function of the second internal electrode, inverting the direction of current feeding makes it possible to implement an electronic heat pump device capable of inverting the thermal transfer direction. In this case, the first internal electrode and the second internal electrode may be composed of a conductive composite material, and may be structured such that the surface of a thin film made of, for example, Ag, Ti or Au is covered with cesium oxide.

In the case where the work function of the first internal electrode is lower than the work function of the second internal electrode, the first internal electrode may be used as an emitter-side electrode and the second internal electrode is used as a collector-side electrode, so that when a temperature difference is generated between the two electrodes, it becomes possible to reduce an amount of thermionic emission due to heating of the collector side as well as an amount of voltage application, which allows implementation of an electronic heat pump device capable of reducing power consumption.

Further, in one embodiment, the spacers are made of $SiO_2$ having low thermal conductivity and are dispersed in the state of being in contact with the first internal electrode, and when a ratio of a total area of the spacers in contact with the first internal electrode to an area of the first internal electrode is referred to as a spacer area ratio, a relationship shown below is satisfied:

(Spacer area ratio)×(spacer thermal conductivity [W/m·K])÷(spacer thickness [nm])≦7.6×10$^{-7}$, and preferably, (Spacer area ratio)×(spacer thermal conductivity [W/m·K])÷(spacer thickness [nm])≦4.7×10$^{-8}$.

According to the embodiment, the area of the spacers, a dispersion pitch of the spacers and a thickness of the spacers can properly be set. The cooling efficiency drop due to the back flow of heat through the spacers can be confined to 10% or less, resulting in reduction of power consumption. Moreover, it becomes possible to implement an electronic heat pump device capable of preventing short circuit from occurring even if the emitter and/or the collector is deformed by stress or warpage.

In one embodiment, the first support member and the second support member each have a copper vessel-like element and a copper plate which covers the vessel-like element and which is provided with the air hole.

According to the embodiment, heat generated in the emitter and the collector is effectively transmitted to an external thermal conduction section.

In one embodiment, the hollow section of the first support member and the hollow section of the second support member each are filled with a thermal-conductivity material lower in coefficient of thermal expansion than both the support members.

According to the embodiment as well, heat generated in the emitter and the collector is effectively transmitted to an external thermal conduction section.

In one embodiment, the thermal-conductivity material is a deformable material which contains at least any one of Ti, Al, Zr, Fe or V, and which has a thin-line shape or a plate shape.

According to the embodiment, it becomes possible to implement an electronic heat pump device capable of absorbing internally-generated gases by the thermal-conductivity material at the time of vacuum sealing and during the vacuum maintenance without reducing the thermal conduction effect so as to maintain the cooling effect.

In one embodiment, the spacing retention member is made of a material containing $SiO_2$ as a main constituent, and has a coefficient of thermal expansion equal to or lower than that of the emitter and the collector.

According to the embodiment, the spacing retention member (insulative washer) has a function, in manufacturing process of the electronic heat pump device, to maintain both the support members at a constant interval and to disperse stress so as not to inflict sharp and crucial breaking stress upon the spacers by external stress such as vibration and inclination in the emitter, the collector and both the support members thereof. Also, the spacing retention member has a function to protect the first internal electrode and the second internal electrode from the sealing member, which might otherwise reach them during the vacuum sealing operation.

In one embodiment, a rare gas is present in the space between the first internal electrode and the second internal electrode, and the following relationship is satisfied:

(free molecule heat conductivity of the rare gas [m/s·K])×(degree of vacuum of the space [Pa]) ≦670, and preferably, (free molecule heat conductivity of the rare gas [m/s·K])×(degree of vacuum of the space [Pa]) ≦67.

Herein, the rare gas may preferably be any one of argon, neon, krypton or xenon.

According to the embodiment, a degree of vacuum of the space between the first internal electrode and the second internal electrode can be set properly. A loss caused by decrease in the cooling efficiency of the emitter side due to a back flow of heat from the collector side through the space (a vacuum gap) can be reduced to 10% or less of the cooled heat amount, resulting in reduction of power consumption.

In one embodiment, the first support member and the second support member each have a vessel-like element, and a plate which covers the vessel-like element and which is provided with the air hole. Also, the first semiconductor substrate and the second semiconductor substrate are disposed between the first support member and the second support member in a state of being joined with the corresponding plates.

According to the embodiment, the stress due to the atmospheric pressure is decreased by the vessel-like elements of the support members, which prevents the emitter and the collector from being influenced by the stress. Moreover, it becomes possible to surely avoid the spacers from being broken by the atmospheric pressure.

In one embodiment, the first support member and the second support member each are made of Cu or a Cu alloy.

According to the embodiment, heat generated in the emitter and the collector is effectively be transmitted to an external thermal conduction section.

The first support member and the second support member may be in an almost circular shape or in an almost rectangular parallelepiped shape. In the case of the almost rectangular parallelepiped shape, the electronic heat pump device can be formed into an almost rectangular parallelepiped chip shape, which facilitates incorporation of the electronic heat pump device in new or existing electronic equipment.

Further, the first support member and the second support member may be solid. In this case, the electronic heat pump device can be formed thinner and smaller, thereby allowing further downsizing of electronic equipment incorporating the electronic heat pump device. In this case, tungsten, tungsten carbide, copper or silicon may be used as a material of the first support member and the second support member.

Further, the electronic equipment of the present invention comprises the electronic heat pump device.

Herein, examples of the electronic equipment include optical pickup devices using semiconductor laser, refrigerators and air conditioners.

According to the electronic equipment of the present invention, which incorporates the aforementioned electronic heat pump device, it is possible, with a simple structure, to reduce power consumption, keep the vacuum gap at a specified size, reduce costs and to improve performance.

There is also provided, according to another aspect of the present invention, a method of manufacturing an electronic heat pump device, comprising:

integrally forming one or more spacers on at least one of a surface of a first semiconductor substrate or a surface of a second semiconductor substrate;

forming a first internal electrode on the surface of the first semiconductor substrate;

forming a second internal electrode on the surface of the second semiconductor substrate; and placing the first and second semiconductor substrates one on the other with the surfaces of the first and second semiconductor substrates facing each other to form a space between the first internal electrode and the second internal electrode by means of the spacers.

According to the manufacturing method of the electronic heat pump device in the present invention, the spacer/ spacers is/are integrally formed on at least either one surface of the first semiconductor substrate or one surface of the second semiconductor substrate. This makes it possible to implement an electronic heat pump device which keeps the vacuum gap at a specified size while preventing a back flow of heat with a simple structure. More specifically, the piezoelectric element, the capacitance controller, the piezo feedback circuit and the like, which have been required as means to maintain a specified vacuum gap between the emitter and the collector in the conventional electronic heat pump device of vacuum gap diode structure, become unnecessary, which makes it possible to reduce the number of component parts, thereby allowing reduction in size, weight and cost. Naturally, the power consumption becomes smaller than that of the Peltier device because the space is formed by the spacer(s).

A plurality of the electronic heat pump devices may electrically be connected so as to form a module.

One example of such a heat pump module has an electric and thermal insulator, and a plurality of the vacuum diode-type electronic heat pump devices embedded in the electrical and thermal insulator and electrically connected to each other.

Another example of the heat pump module comprises two thermally conductive plates and a plurality of the vacuum diode-type electronic heat pump devices that are disposed between the thermally conductive plates and electrically connected to each other.

According to another aspect of the present invention, a beverage warming and cooling apparatus, including:

a housing having a receiving section for receiving a beverage container; and a vacuum diode-type electronic heat pump device which cools or heats the receiving section of the housing and which has thermally separated endothermic side and exothermic side.

The "vacuum diode-type electronic heat pump device" here refers to, for example, a device in which a distance between two electrodes is approximated to a nano level (e.g., 1 nm to 10 nm) to form a vacuum gap, and a voltage is applied to emit electrons from the emitter side to the collector side with use of electron tunneling, thereby performing cooling and heating operations.

According to the beverage warming and cooling apparatus in the present invention, due to provision of the vacuum diode-type electronic heat pump device in which an endothermic side and an exothermic side are thermally separated from each other, power consumption is considerably reduced without application of the Peltier effect compared to the cooling and heating mechanism of the Peltier device. Moreover, since harmful substances used as materials of the Peltier device are not used, the apparatus becomes environment-friendly.

In one embodiment, the beverage warming and cooling apparatus has a cooling mechanism for cooling the exothermic side of the electronic heat pump device which is in a state of cooling the receiving section of the housing.

According to the embodiment, it is possible to forcibly discharge heat of the electronic heat pump device to outside, which allows enhancement of the cooling effect.

In one embodiment, the cooling mechanism has a heat sink that is thermally in contact with the exothermic side of the electronic heat pump device; and a cooling fan for cooling the heat sink.

According to the embodiment, heat is surely discharged with a simple structure.

In one embodiment, the cooling mechanism has a cooling jacket, a reserve tank, a heat sink, and a pump, which are circularly connected in sequence, and the cooling jacket is disposed so as to be thermally in contact with the exothermic side of the electronic heat pump device.

According to the embodiment, heat is surely discharged with a simple structure. Moreover, the cooling mechanism may be, for example, a water-cooling type cooling mechanism, which provides a silent apparatus in which noise is prevented from being generated.

Furthermore, according to still another aspect of the present invention, there is provided a beverage warming and cooling coaster, comprising:

a coaster main body; and a vacuum diode-type electronic heat pump device attached to the coaster main body, in which an endothermic side for cooling one surface side of the coaster main body and an exothermic side for heating the other surface side of the coaster main body are thermally separated from each other.

The definition of the term "vacuum diode-type electronic heat pump device" is as stated in connection with the beverage warming and cooling apparatus.

In one embodiment, the beverage warming and cooling coaster has a current switch means for switching direction of a current fed to the electronic heat pump device to enable heating of the one surface side of the coaster main body and cooling of the other surface side thereof.

According to the embodiment, the current switch means allows easy and swift switching between heating and cooling in the beverage warming and cooling coaster.

In one embodiment, the coaster main body has two thermally conductive plates for sandwiching the electronic heat pump therebetween; an outer frame fixed to the thermally conductive plates in such a manner that the outer frame encircles the electronic heat pump device; and a power supply case integrally attached to an outer circumferential surface of the outer frame, the power supply and includes a power supply for the electronic heat pump device.

According to the embodiment, the power supply case is integrally attached to the outer peripheral surface of the outer frame, and therefore the coaster is suitable for the carrying purpose and offers improved usability.

In one embodiment, a lateral surface of the outer frame and a lateral surface of the power supply case are almost coplanar.

According to the embodiment, when the beverage warming and cooling coaster is placed on a table, it will not rattle, and therefore it become possible to prevent a container, such as a cup, filled with beverage seated on the beverage warming and cooling coaster from falling down.

Further, according to one aspect, there is provided a refrigerator, comprising:

at least one freezing chamber and at least one chilling chamber;

a first cooling mechanism for cooling an inside of the freezing chamber; and a second cooling mechanism for cooling an inside of the chilling chamber and an exothermic side of the first cooling mechanism; wherein at least one of the first cooling mechanism and the second cooling mechanism has a vacuum diode-type electronic heat pump device in which an endothermic side and an exothermic side are thermally separated from each other.

According to the refrigerator of the present invention, at least one of the first cooling mechanism and the second cooling mechanism has the vacuum diode-type electronic heat pump device, and therefore the refrigerator provides an electronic heat pump mechanism which neither uses a refrigeration cycle involving vapor compression and expansion of a refrigerant nor utilizes the Peltier effect.

As may be understood from above, the refrigerator of the present invention achieves drastic reduction in size and weight compared to the one using a vapor-compression refrigeration cycle and also achieves considerable reduction in power consumption compared to the cooling mechanism of the Peltier device, thereby accomplishing downsizing and decreased power consumption.

Moreover, the first cooling mechanism cools the inside of the freezing chamber, and the second cooling mechanism cools the inside of the chilling chamber and the exothermic side of the first cooling mechanism. Consequently, by the second cooling mechanism, the inside of the chilling chamber and the exothermic side of the first cooling mechanism can be cooled at the same temperature, which facilitates control of the second cooling mechanism and allows reduction in power consumption of the second cooling mechanism.

It goes without saying that the freezing chamber may perform quick freezing operation without deteriorating a cooling capability of other chambers such as the chilling chamber. Furthermore, usage of refrigerants and harmful substances, which are used as materials of the Peltier device, does not increase from that of conventional products, which makes the refrigerator environment-friendly.

In one embodiment, the first cooling mechanism has the electronic heat pump device, and the second cooling mechanism has a refrigeration cycle utilizing vapor compression and expansion of a refrigerant.

According to the embodiment, a combined use of the single cooling mechanism involving a vapor compression refrigeration cycle and the environment-friendly electronic heat pump device as a freezing chamber cooling mechanism makes it possible to reduce usage of refrigerants and harmful substances, increase a capacity of the freezing chamber, and to further achieve weight saving and lower power consumption. Moreover, the cooling mechanism involving an economic vapor compression refrigeration cycle suitable for large-capacity cooling performs primary cooling of the refrigerator, which makes it possible to diminish the number of electronic heat pump devices mounted.

In one embodiment, the first cooling mechanism and the second cooling mechanism each have the electronic heat pump device.

According to the embodiment, neither refrigerants which have an action to deplete the ozone layer and affect the global environment nor flammable refrigerants are used, which secures high safety and silence.

There is also provided, according to a further aspect of the present invention, a vehicular warming and cooling case for installation in vehicles, comprising:

a case main body; and a cooling/heating unit which sucks air to cool or heat the sucked air and discharges the cooled or heated air to an inside of the case main body, wherein the cooling/heating unit has a vacuum diode-type electronic heat pump device which cools or heats the sucked air and which has thermally separated endothermic side and exothermic side.

The definition of the term "vacuum diode-type electronic heat pump device" is as stated above.

In one embodiment, the cooling/heating unit has a heat sink thermally connected to the electronic heat pump device, and a fan for leading air to the heat sink and discharging air cooled or heated by the heat sink to the inside of the case main body.

According to the embodiment, the heat sink enables air to be cooled and heated effectively, and the fan enables the inside of the case main body to be cooled and heated swiftly.

In one embodiment, the cooling/heating unit sucks air inside the case main body while discharging air to the inside of the case main body so as to circulate the air inside the case main body, for example, in one direction.

According to the embodiment, the air inside the case main body is cooled or heated while being circulated, which makes it possible to cool or heat the inside of the case main body effectively, swiftly and evenly.

In one embodiment, the case main body has an openable and closable door. And, when the cooling/heating unit discharges cooled air to the inside of the case main body, the cooling/heating unit sucks air inside the case main body from a lower side of the case main body and discharges air from an upper side of the case, main body, and the case main body has an air path through which air in a vicinity of the door flows from the upper side of the case main body to the lower side of the case main body.

According to the embodiment, an air flow from the upper side to the lower side of the case main body in the vicinity of the door of the case main body forms an air curtain in an opening portion of the case main body when the door is opened, and therefore interaction of air (heat) inside and outside of the case main body is blocked. This makes it possible to enhance the cooling effect of the vehicular warming and cooling case.

In one embodiment, when the cooling/heating unit discharges heated air to the inside of the case main body, the cooling/heating unit sucks air inside the case main body from an upper side of the case main body and discharges air from a lower side of the case main body, and the case main body has an air path through which air in the vicinity of the door flows from the lower side of the case main body to the upper side of the case main body.

According to the embodiment, an air flow from the lower side to the upper side of the case main body in the vicinity of the door of the case main body forms an air curtain in the opening portion of the case main body when the door is opened, and therefore interaction of air (heat) inside and outside of the case main body is blocked. This makes it possible to enhance the cooling effect of the vehicular warming and cooling case.

According to a still further aspect of the present invention, there is provided an air conditioner for conditioning air in a delimited space, comprising:

a cooling/heating unit which sucks air in the space to cool or heat the sucked air and discharges the cooled or heated air to the space, wherein the cooling/heating unit has a vacuum diode-type electronic heat pump device which directly or indirectly cools or heats the sucked air and which has thermally separated endothermic side and exothermic side.

The term "delimited space" herein refers to the inside of, for example, a room in a building, a bathroom, an underfloor space, a ceiling space, a vehicle, a train, a ship, a plane, a warehouse, a storage and so forth. Further, the vacuum diode-type electronic heat pump device herein refers to, for example, an apparatus in which a distance between two electrodes is approximated to a nano level (e.g., 1 nm to 10 nm) to form a vacuum gap, and a voltage is applied to emit electrons from the emitter side to the collector side with use of electron tunneling, thereby performing cooling and heating operations.

Because the air conditioner of the present invention has a vacuum diode-type electronic heat pump device whose endothermic side and exothermic side are thermally separated from each other, mechanical moving parts are dispensed with and noise generated in the conventional compressor is prevented. Moreover, it becomes possible to considerably reduce power consumption without application of the Peltier effect compared to the cooling and heating mechanism of the Peltier device. Moreover, since harmful substances used as materials of the Peltier device are not used, the air conditioner becomes environment-friendly.

In one embodiment, the cooling/heating unit comprises a heat exchange fin thermally connected to the electronic heat pump device, and a fan for leading air to the heat exchange fin and discharging the air cooled or heated by the heat exchange fin.

According to the embodiment, the heat exchange fin enables air to be cooled or heated effectively, and the fan facilitates the space to be cooled or heated swiftly.

In one embodiment, the cooling/heating unit has a heat exchange stirrer disposed opposite to the heat exchange fin, an opposed surface of the cooling/heating unit that faces the heat exchange fin being uneven.

According to the embodiment, the cooling/heating unit is capable of stirring and retaining air flowing in between the heat exchange fin and the heat exchange stirrer so as to improve a heat exchange efficiency. More specifically, when air flows in between the heat exchange fin and the heat exchange stirrer, the air flowing along the uneven surface from a recess portion to a projecting portion of the heat exchange stirrer facing the heat exchanger is changed in flow velocity and is deflected so as to be led to the heat exchange fin. Further, in the recess portion of the heat exchange stirrer, air cooled or heated by the heat exchange fin is retained. Thus, it becomes possible to effectively transfer heat from the electronic heat pump device.

In one embodiment, the cooling/heating unit comprises:
a circulation passage through which a heat transfer medium flows;
a pump provided in the circulation passage for circulating the heat transfer medium;
a first heat exchanger which is provided in the circulation passage and is thermally connected to the electronic heat pump device;
a second heat exchanger provided in the circulation passage for heat-exchanging the heat transfer medium with the air; and
a fan for leading the air to the second heat exchanger and discharging the air cooled or heated by the second heat exchanger.

According to the embodiment, heat transfer is performed through the heat transfer medium, which allows more efficient heat exchange.

In each of the beverage warming and cooling apparatus, the beverage warming and cooling coaster, the refrigerator, the vehicular warming and cooling case, and the air conditioner, there may be a plurality of the electronic heat pump devices which are electrically connected to each other to form a module. This increases cooling and heating capabilities and also facilitates handling of the electronic heat pump devices when the electronic heat pump devices are mounted on equipment.

Further, in each of the beverage warming and cooling apparatus, the beverage warming and cooling coaster, the refrigerator, the vehicular warming and cooling case and the air conditioner, the electronic heat pump device according to the aforementioned first aspect of the present invention may be used as the electronic heat pump device incorporated. The actions and effects of the equipment with such electronic heat pump device are as described above.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE PREFERRED EMBODIMENTS

The present invention will hereinbelow be described in detail in conjunction with the embodiments with reference to the drawings.

First Embodiment

Figure 1:
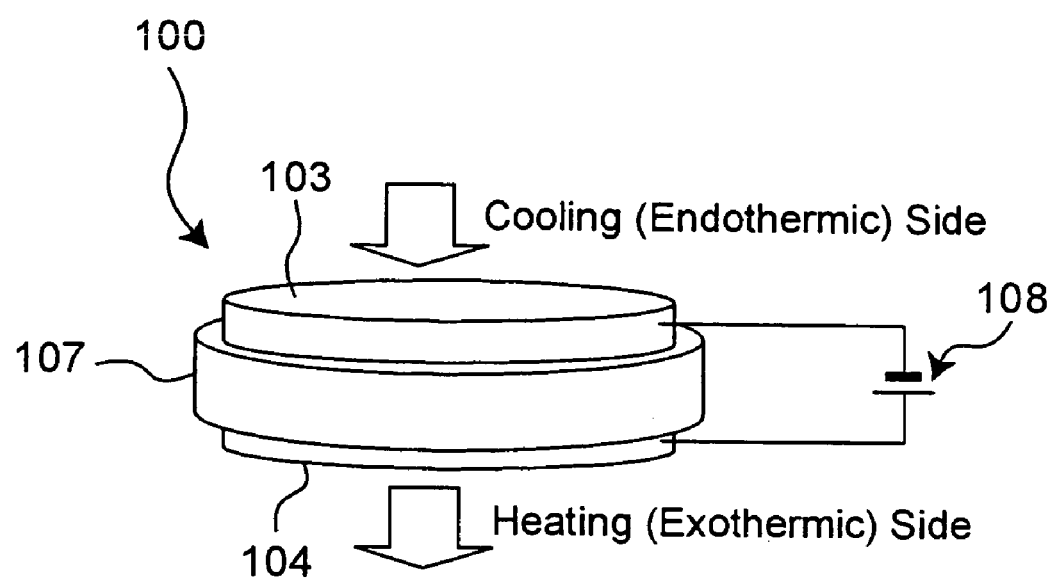
FIG. 1 is a perspective view showing an electronic heat pump device in one embodiment of the present invention.
Figure 2:
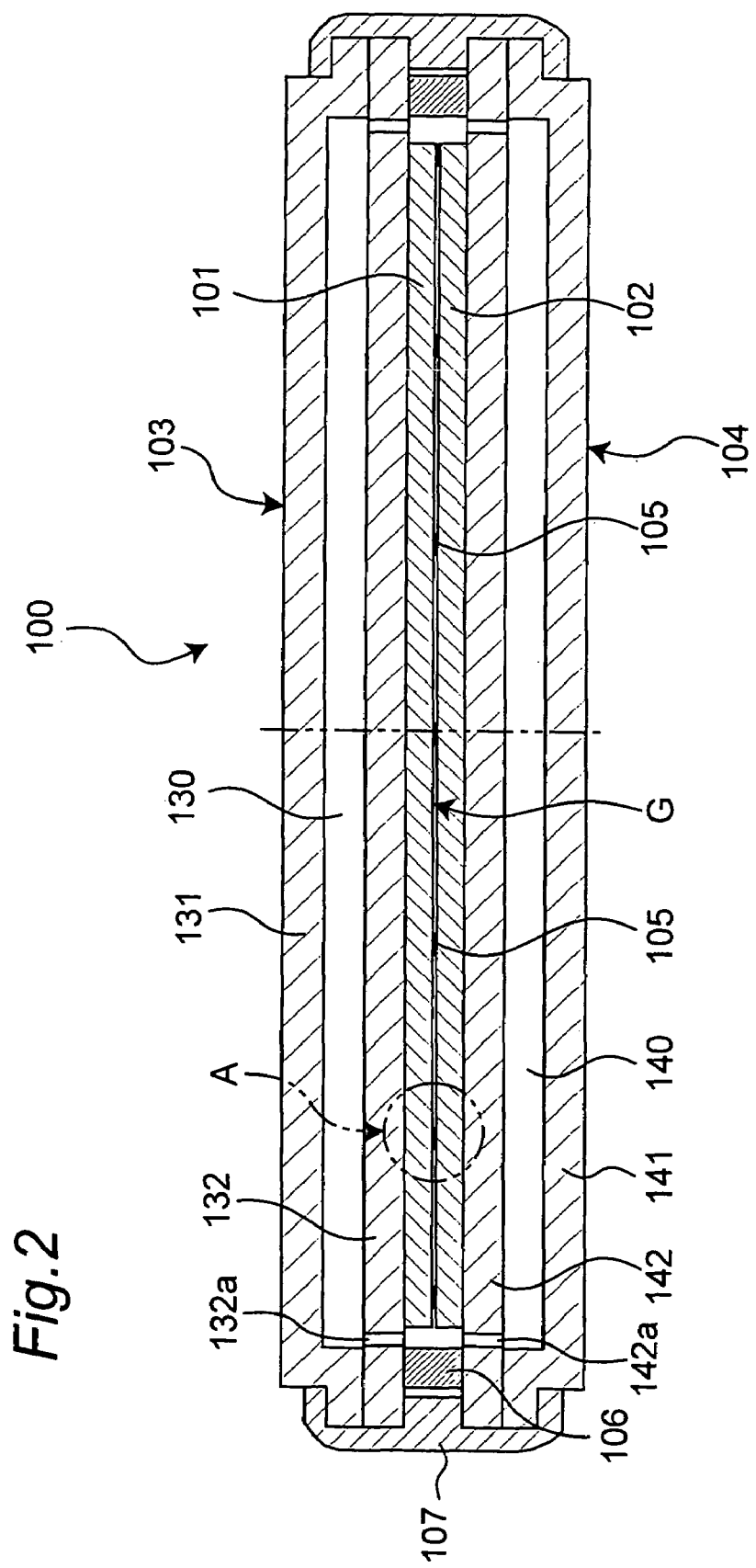
FIG. 2 is a vertical cross sectional view showing the electronic heat pump device.
Figure 3:
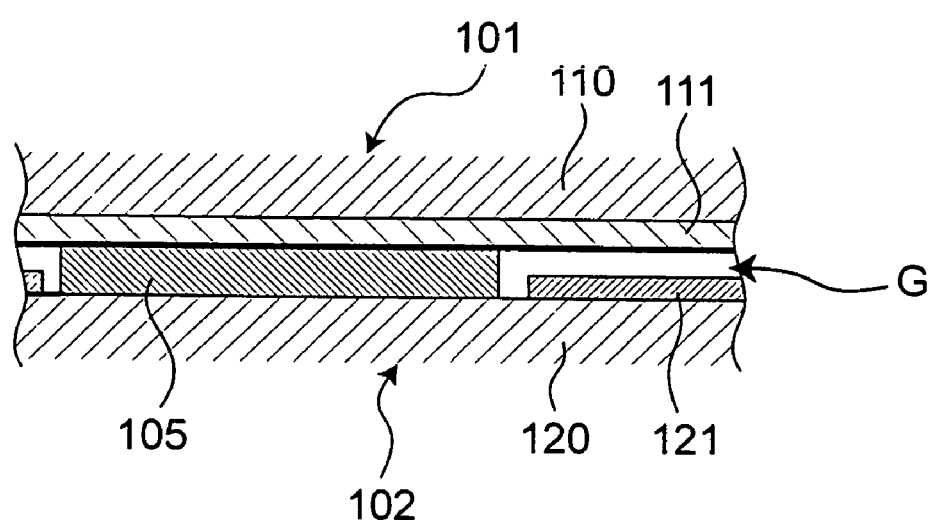
FIG. 3 is an enlarged cross sectional view showing the section A of FIG. 2.

FIG. 1 is a perspective view showing an electronic heat pump device in one embodiment of the present invention. FIG. 2 is a vertical cross sectional view showing the electronic heat pump device, and FIG. 3 is an enlarged cross sectional view showing the section A of FIG. 2;

The electronic heat pump device 100 has a first support member 103 having electrical and thermal conductivity, a first semiconductor substrate 110 having one surface connected to the first support member 103 so as to be able to conduct electricity and heat, a first internal electrode 111 provided on the other surface of the first semiconductor substrate 110, a second support member 104 having electrical and thermal conductivity, a second semiconductor substrate 120 having one surface connected to the second support member 104 so as to be able to conduct electricity and heat, a second internal electrode 121 provided on the other surface of the second semiconductor substrate 120, an electrically and thermally insulative spacing retention member 106 disposed between the first support member 103 and the second support member 104 for keeping a space between the first support member 103 and the second support member 104 constant, and a sealing member 107 for maintaining vacuum between the first support member 103 and the second support member 104.

The electronic heat pump device 100 is in an almost disk shape, and by switching the direction of current flowing through the electronic heat pump device 100, one surface of the electronic heat pump device 100 becomes an endothermic side and the other surface of the electronic heat pump device 100 becomes an exothermic side, or the one surface of the electronic heat pump device 100 becomes the exothermic side and the other surface of the electronic heat pump device becomes the endothermic side.

In conformity to the direction of current flowing through the electronic heat pump device 100, the first semiconductor substrate 110 and the first internal electrode 111 function as an emitter to discharge electrons or a collector to receive the electrons, while the second semiconductor substrate 120 and the second internal electrode 121 function as a collector or an emitter. In the following description, the first semiconductor substrate 110 and the first internal electrode 111 form an emitter 101 to release electrons, while the second semiconductor substrate 120 and the second internal electrode 121 form a collector 102 to receive the electrons.

Moreover, the first support member 103 and the second support member 104 are stems each having a hollow section, and will respectively be referred to as an emitter-side stem and a collector-side stem in the following description.

The emitter 101 and the collector 102 are disposed so as to face each other, and a space (vacuum gap) G is present between the emitter 101 and the collector 102. An emitter-side stem 103 and a collector-side stem 104 are connected to a power supply 108.

Figure 15:
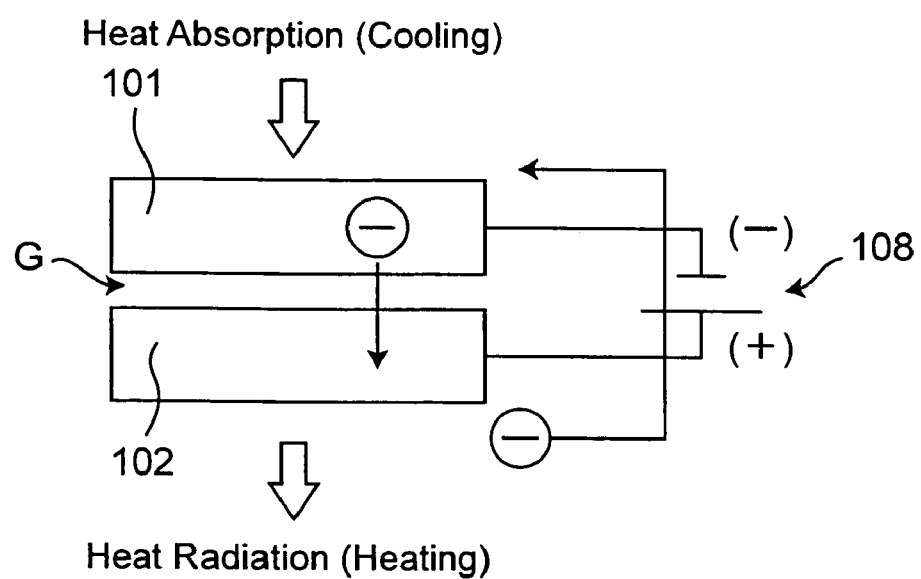
FIG. 15 is an explanatory view showing the operation of the electronic heat pump device.

Description is now given of the operation of the electronic heat pump device 100. As shown in FIG. 1 and FIG. 15, upon application of a current from the power supply 108 to the emitter-side stem 103 and the collector-side stem 104, electrons shift from the emitter 101 to the collector 102 as an arrow indicates. At this time, the electrons are small in kinetic energy. However, because the physical gap is narrow, the electrons can go through the space (barrier) G because of a phenomenon called "electron tunneling" and shift to the collector 102 side. Moreover, the electrons having kinetic energy (thermal energy) (i.e., electrons moving through the barrier) shift from the emitter 101 to the collector 102, as a result of which the emitter 101 runs short of energy and cooling by endothermy, or heat absorption occurs on the emitter 101 side. By such a phenomenon, the emitter 101 side (the stem 103) becomes a cooling (endothermic) side while the collector 102 side (the stem 104) becomes a heating (exothermic) side.

The emitter 101 has a first semiconductor substrate 110 having one surface joined to the emitter-side stem 103 so as to be able to conduct electricity and heat and an emitter electrode 111 provided over the other surface of the first semiconductor substrate 110.

The collector 102 has a second semiconductor substrate 120 having one surface joined to the collector-side stem 104 so as to be able to conduct electricity and heat and a collector electrode 121 provided on a part of the other surface of the second semiconductor substrate 120.

The emitter 101 and the collector 102 are disposed such that the emitter electrode (first internal electrode) 111 faces the collector electrode (second internal electrode) 121 with the space G therebetween.

On the semiconductor substrate 120 of the collector 102, electrically and thermally insulative spacers 105 are integrally formed, which spacers keep the space G between the emitter electrode 111 and the collector electrode 121 constant. The spacers 105 are dispersed at constant intervals on the emitter 101 and the collector 102, and the thickness of the spacers 105 determines the size of the space G.

More specifically, in the case where an n-type Si wafer is used for example as the semiconductor substrates 110 and 120, the surface of the substrate 120 is subjected to thermal oxidation to form an $SiO_2$ film, and the $SiO_2$ film is etched to form the spacers 105.

Values of maximum roughness Rz on the surface of the emitter electrode 111 and the surface of the collector electrode 121 are not more than ½, preferably not more than ¼, of a minimum value of the space between the emitter electrode 111 and the collector electrode 121.

Thus, since the values of maximum roughness Rz are not more than ½ of a maximum value of the space between the emitter electrode 111 and the collector electrode 121, the surface of both the electrodes 111 and 121 is smoothed so as to reduce defects caused by roughness due to surface asperity of both the electrodes 111 and 121.

For example, it becomes possible to reduce short circuit failures caused by contact between both the electrodes 111 and 121 due to surface protruding portions facing to each other, and to mitigate a drop in the electron emission amount and cooling amount caused by expansion of a space (vacuum gap) due to surface recess portions facing to each other. More specifically, if a value of the maximum roughness Rz exceeds ½ of a maximum value of the space, then the electron emission amount from the emitter is reduced by expansion of the space (vacuum gap) due to the surface recess portions facing each other and warpage, and thereby the cooling amount is reduced, while the surface protruding portions facing each other may bring both the electrodes 111 and 121 into contact with each other, thereby causing short circuit failures.

The emitter electrode 111 and the collector electrode 121 are any one of a single metal, a metal alloy, a metal-nonmetal compound, a semiconductor material and an impurity-doped semiconductor material, which allows effective implementation of the smooth surface of both the electrodes 111 and 121 and the electron release from the emitter 101.

At least the emitter electrode 111 out of the emitter electrode 111 and the collector electrode 121 is made of a material containing at least any one of cesium (Cs), carbon (C), titanium (Ti), molybdenum (Mo), tungsten (W), chromium (Cr), vanadium (V), nickel (Ni), copper (Cu), silicon (Si), tantalum (Ta), zirconium (Zr), silver (Ag), gold (Au), platinum (Pt) and aluminum (Al).

Thus, at least the emitter electrode 111 is made of a material low in work function, which makes it possible to enhance the electron emission from the emitter 101 side, decrease a voltage application amount and to reduce power consumption.

The work function of the emitter electrode 111 is almost equal to the work function of the collector electrode 121 or lower than the work function of the collector electrode 121.

Thus, in the case where the work function of the emitter electrode 111 is almost equal to the work function of the collector electrode 121, inverting the direction of current feeding makes it possible to implement an electronic heat pump device capable of inverting the thermal transfer direction. In the case where the work function of the emitter electrode 111 is lower than the work function of the collector electrode 121, when a temperature difference is generated between both the electrodes 111 and 121, it becomes possible to reduce an amount of thermionic emission due to heating of the collector side as well as an amount of voltage application, which allows reduction of power consumption.

The emitter-side stem 103 and the collector-side stem 104 have hollow sections 130, 140, respectively, both the hollow sections 130, 140 and the space G between the emitter electrode 111 and the collector electrode 121 are vacuum, and both the hollow sections 130, 140 and the space G share an identical degree of vacuum through air holes 132a, 142a provided in the emitter-side stem 103 and the collector-side stem 104.

More specifically, the emitter-side stem 103 has a copper vessel-like element 131 and a copper plate 132 which covers the vessel-like element 131 and which is provided with the air hole 132a. A space enclosed by the vessel-like element 131 and the plate 132 constitute the hollow section 130, and the hollow section 130 and the outside of the emitter-side stem 103 are linked through the air hole 132a.

Similarly, the collector-side stem 104 has a copper vessel-like element 141 and a copper plate 142 which covers the vessel-like element 141 and which is provided with the air hole 142a, a space enclosed by the vessel-like element 141 and the plate 142 constitute the hollow section 140, and the hollow section 140 and the outside of the collector-side stem 104 are linked through the air hole 142a.

The emitter 101 and the collector 102 are interposed in between the plate 132 of the emitter-side stem 103 and the plate 142 of the collector-side stem 104.

Thus, since the emitter 101 and the collector 102 are interposed in between the hollow sections 130 and 140 of both the stems 103 and 104, only the outermost portions (the container bodies 131, 141) of both the stems 103, 104 are affected by stress of atmospheric pressure. Consequently, stress is not directly exerted to the emitter 101 and the collector 102, which prevents deformation and breakage due to pressure deflection from occurring.

The emitter-side stem 103 and the collector-side stem 104 are respectively made of Cu or a Cu alloy, so that heat generated in the emitter 101 and the collector 102 may effectively be transmitted to an external thermal conduction section.

The spacing retention member 106 is present between the plate 132 of the emitter-side stem 103 and the plate 142 of the collector-side stem 104. The spacing retention member 106 is made of a material containing $SiO_2$ as a main constituent, and has a coefficient of thermal expansion equal to or lower than that of the emitter 101 and the collector 102.

Thus, the spacing retention member 106 has a function, in manufacturing process of the electronic heat pump device, to maintain both the stems 103, 104 at a constant interval and to disperse stress so as not to inflict sharp and crucial breaking stress upon the spacers 105 by external stress such as vibration and inclination in the emitter 101, the collector 102 and both the stems 103, 104, and also has a function to protect the sealing member 107 from reaching the emitter electrode 111 and the collector electrode 121 in vacuum sealing operation.

The sealing member 107 is in contact with the periphery of the emitter-side stem 103 and the periphery of the collector-side stem 104 in such a way as to cover them, and is electrically and thermally insulative. More specifically, the sealing member 107 is present between the plate 132 of the emitter-side stem 103 and the plate 142 of the collector-side stem 104 and covers the peripheral edge of the plate 132 of the emitter-side stem 103 and the peripheral edge of the plate 142 of the collector-side stem 104. Examples of the sealing member 104 include a low-melting point glass.

According to the above-structured electronic heat pump device, the space G (vacuum gap) is present between the emitter electrode 111 and the collector electrode 121, which makes it possible to provide vacuum gap diode structure to the electronic heat pump device, and thereby allows prevention of the back flow of heat to achieve power consumption smaller than that of the Peltier device.

Further, the spacers 105 which keep the space G constant and which are electrically and thermally insulative are integrally formed on the semiconductor substrate 120 of the collector 102, which makes it possible to maintain the vacuum gap to be a specified space while the back flow of heat is prevented in a simple structure. More particularly, the piezoelectric element, the capacitance controller, the piezo feedback circuit and the like, which have been required as means to maintain the vacuum gap between the emitter and the collector to be a specified space in the electronic heat pump device of conventional vacuum gap diode structure, become unnecessary, which makes it possible to reduce the number of component parts, thereby allowing reduction in size, weight and cost.

Further, adjusting the thickness of the spacers 105 to approximate the space G to a nano level enables the barrier height to be decreased and the electron emission effect of the emitter 101 to be enhanced.

The specific size of the electronic heat pump device is as following. The overall diameter is 11.5 mm, and the overall thickness is 2.3 mm. The thickness of each of the stems 103, 104 is 0.9 mm. The thickness of each of the emitter 101 and the collector 102 is 0.25 mm. The thickness of each of the emitter electrode 111 and the collector electrode 121 is 5 nm. The thickness of the spacer 105 is 10 nm, and the size of the planar surface of the spacer 105 is □100 nm (100 nm square). A pitch of the adjacent spacers 105, 105 is 200 nm.

Description is now given of a manufacturing method of the electronic heat pump device in the present invention.

Figure 4A:
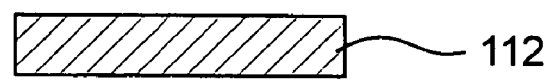
FIG. 4A is a view showing a first process of an emitter manufacturing method.

First, a manufacturing method of the emitter 101 will be described. As shown in FIG. 4A, one surface (top surface) of a mirror-finished n-type Si wafer substrate 112 that is an emitter-forming substrate is entirely polished to an extremely mirror-smooth state to the extent of a sub-nano level by, for example P-CVM (Plasma-Chemical Vaporization Machining) and EEM (Elastic Emission Machining). It is to be noted that although unshown, an Au electrode for contact is provided on the other surface (back surface) of the Si wafer substrate 112.

Figure 4B:
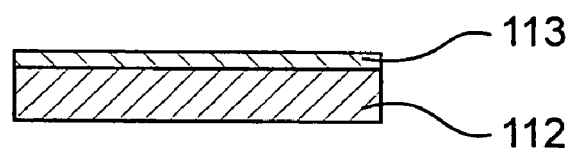
FIG. 4B is a view showing a second process of the emitter manufacturing method.
Figure 4C:
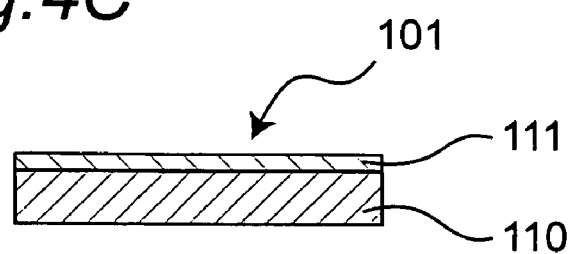
FIG. 4C is a view of a third process of the emitter manufacturing method.
Figure 5:
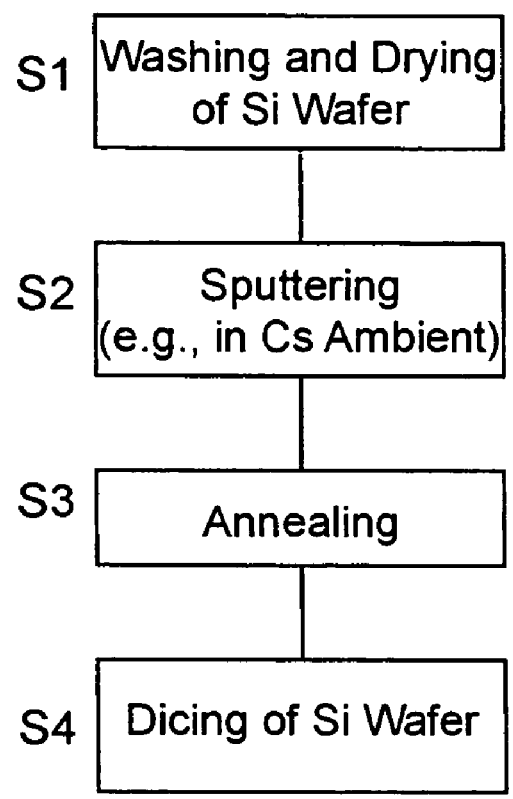
FIG. 5 is a flow chart showing the emitter manufacturing method.

Then, as shown in FIG. 4B, a Ti thin film 113 whose surface is covered with cesium by sputtering or the like is formed to a thickness of, for example, 5 nm on the smooth and clean surface of the Si wafer substrate 112. Then, the wafer is diced in specified size to manufacture the emitter 101 composed of the semiconductor substrate 110 made of the Si wafer substrate 112 and the emitter electrode 111 made of the Ti thin film 113 as shown in FIG. 4C. It is to be noted that after the sputtering step, the manufacturing operation proceeds with dry vacuum steps. A manufacturing method of the emitter 101 is shown in step S1 to step S4 in the flow chart of FIG. 5, though description thereof is omitted.

Herein, as the dicing method, for example, a method called stealth dicing of cutting a wafer without causing mechanical deformation to the wafer is most preferable. The dicing shape may be a square shape in consideration of productivity, or may be other shapes including the shape of a wafer itself which is a small-diameter circular wafer accommodated to the stem.

Figure 6A:
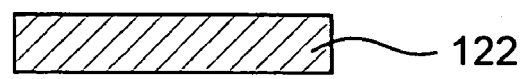
FIG. 6A is a view showing a first process of a collector manufacturing method.

Description is now given of a manufacturing method of the collector 102. As with the manufacturing method of the emitter 101, as shown in FIG. 6A, one surface (top surface) of a mirror-finished n-type Si wafer substrate 122 that is a collector-forming substrate is entirely polished to an extremely mirror-smooth state to the extent of a sub-nano level. It is to be noted that although unshown, an Au electrode for contact is provided on the other surface (back surface) of the Si wafer substrate 122.

Figure 6B:
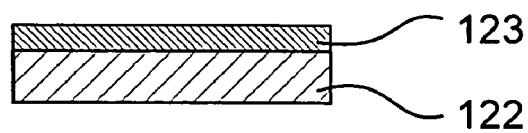
FIG. 6B is a view showing a second process of the collector manufacturing method.
Figure 6C:
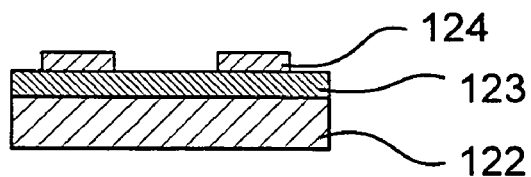
FIG. 6C is a view showing a third process of the collector manufacturing method.
Figure 6D:
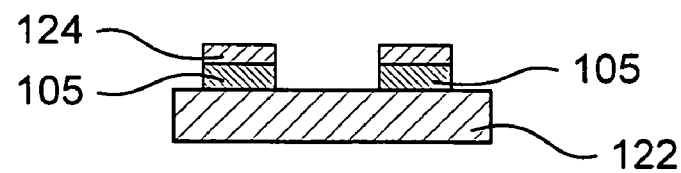
FIG. 6D is a view showing a fourth process of the collector manufacturing method.

Then, as shown in FIG. 6B, the smooth and clean surface of the Si wafer substrate 122 is subjected to thermal oxidation to form an $SiO_2$ insulating oxide with a thickness of, for example, 10 nm, and a first resist 24 is placed over the $SiO_2$ insulating oxide 123 as shown in FIG. 6C. Then, as shown in FIG. 6D, photoetching is performed to pattern the $SiO_2$ insulating oxide 123 into a size of 100 nm square so as to form oxide silicon spacers 105 disposed in a square lattice configuration at a pitch of 200 nm.

Figure 6E:
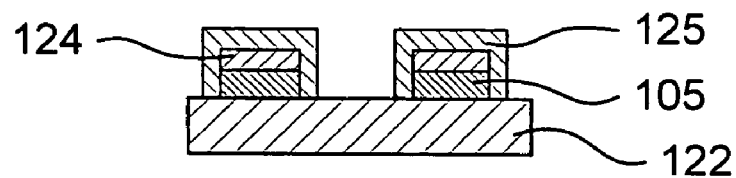
FIG. 6E is a view showing a fifth process of the collector manufacturing method.
Figure 6F:
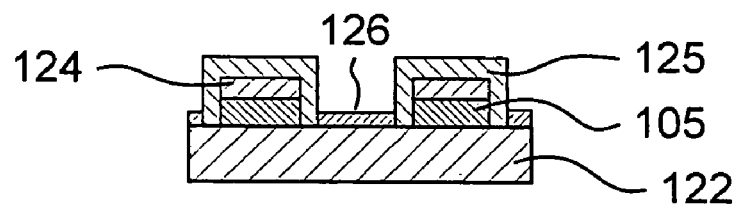
FIG. 6F is a view showing a sixth process of the collector manufacturing method.

Then, after the Si wafer substrate 122 is cleaned and dried, a second resist 125 is placed over the spacers 105 and the first resist 124 as shown in FIG. 6E, and on one surface of the Si wafer substrate 122, an Ag thin film 126 is formed to a thickness of, for example, 5 nm by sputtering and the like as shown in FIG. 6F.

Figure 6G:
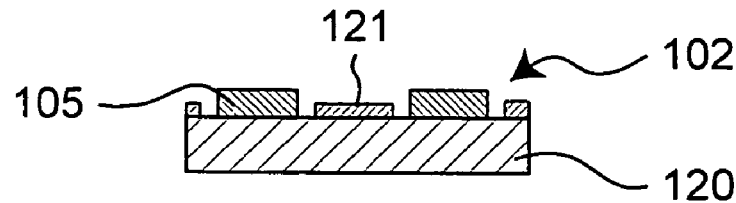
FIG. 6G is a view showing a seventh process of the collector manufacturing method.
Figure 7:
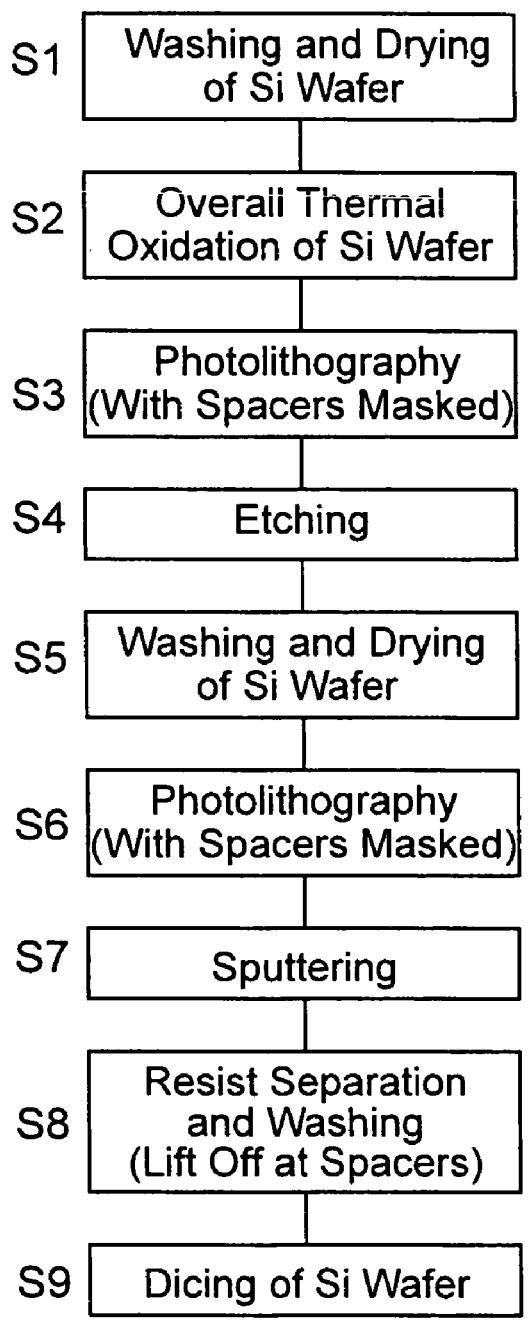
FIG. 7 is a flow chart showing the collector manufacturing method.

After that, the first resist 124 and the second resist 125 are removed, and the Si wafer substrate 122 is cleaned and diced into a specified size, by which the collector 102 having the semiconductor substrate 120 composed of the Si wafer substrate 122 with the spacers 105 integrally formed on one surface thereof and the collector electrode 121 made of the Ag thin film 126 is manufactured as shown in FIG. 6G. A manufacturing method of the collector 102 is shown in step S1 to step S9 in the flow chart of FIG. 7, though description thereof is omitted.

Figure 8A:
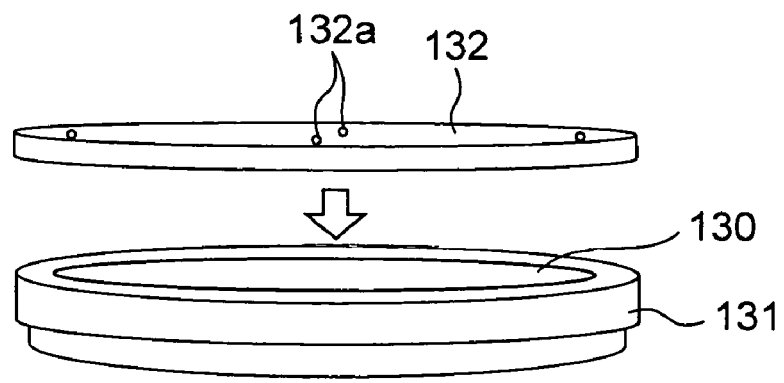
FIG. 8A is a view showing a first process of a stem manufacturing method.
Figure 8B:
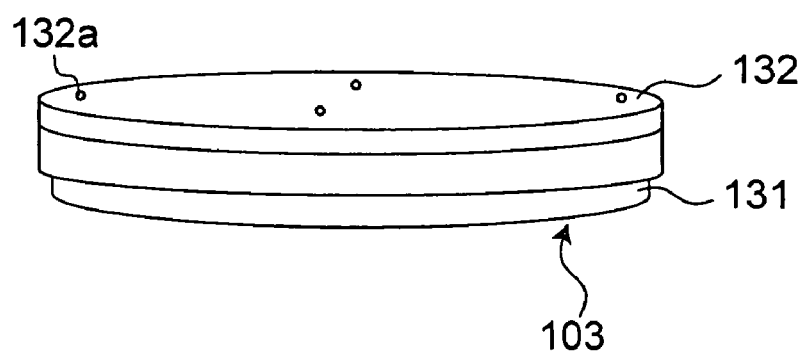
FIG. 8B is a view showing a second process of the stem manufacturing method.

Description is now given of a manufacturing method of the emitter-side stem 103. As shown in FIG. 8A, a plate 132 having air holes 132a is bonded to an aperture of a hat-shaped vessel-like element 131, and the aperture of the vessel-like element 131 is covered with the plate 132 as shown in FIG. 8B, by which the emitter-side stem 103 is manufactured. Though unshown, the collector-side stem 104 is manufactured in the same way as the emitter-side stem 103.

Figure 9:
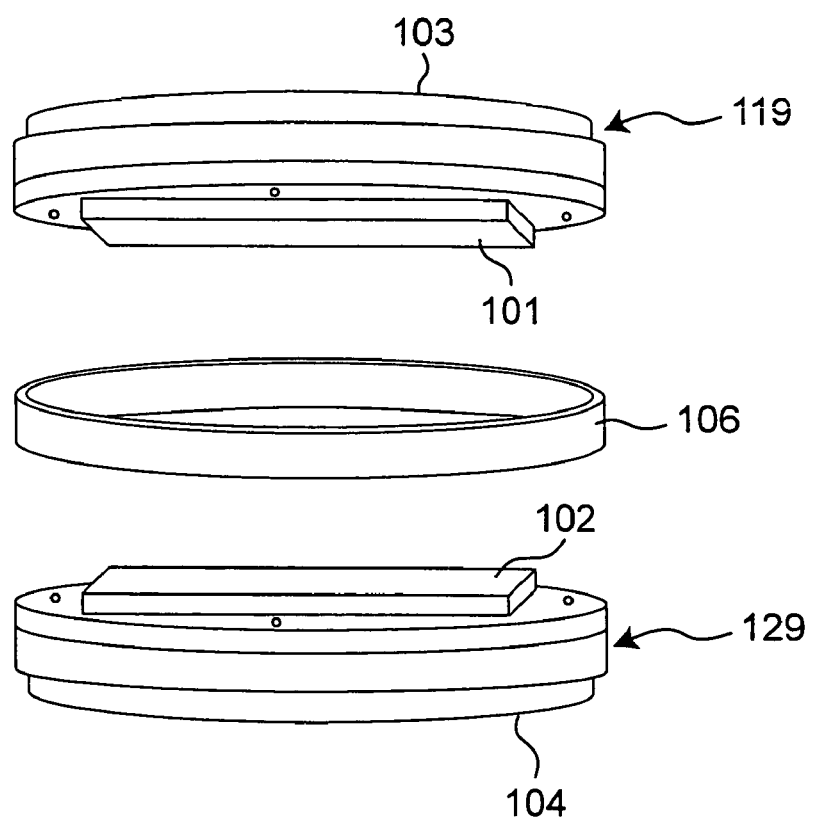
FIG. 9 is a perspective view showing the electronic heat pump device in a first assembled state.

Next, as shown in FIG. 9, the emitter-side stem 103 is electrically and thermally joined to the emitter 101 to form an emitter-side unit 119, while the collector-side stem 104 is electrically and thermally joined to the collector 102 to form a collector-side unit 129. It is to be noted that the joining method includes Au—Sn eutectic soldering.

Figure 10:
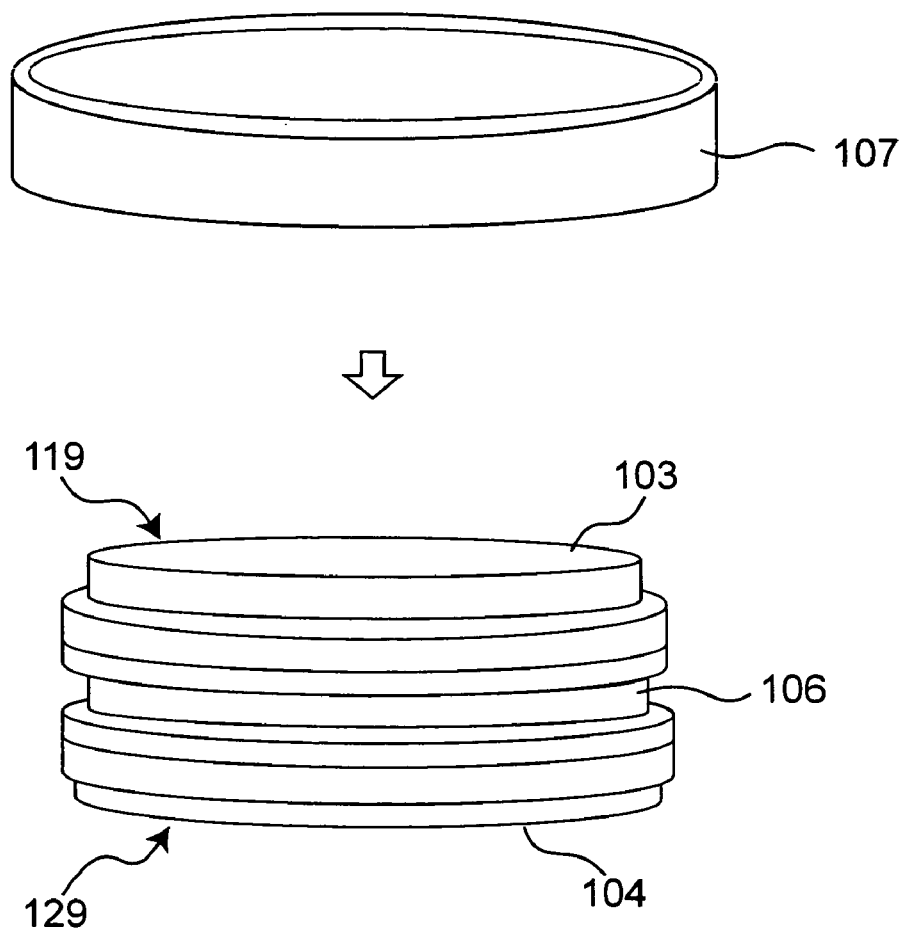
FIG. 10 is a perspective view showing the electronic heat pump device in a second assembled state.
Figure 11:
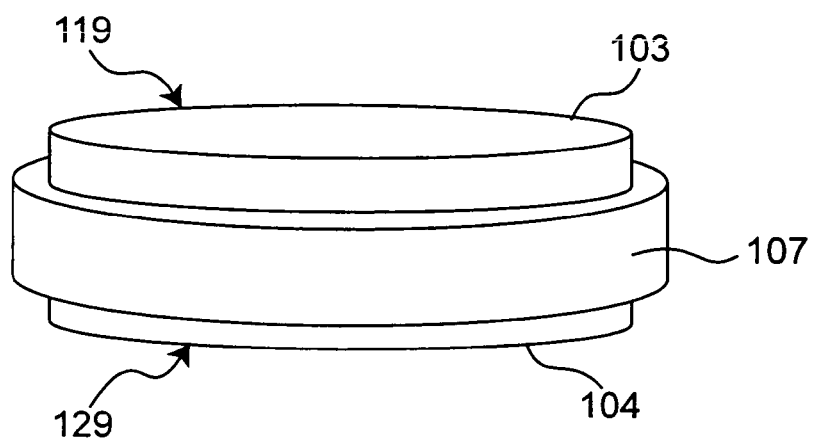
FIG. 11 is a perspective view showing a completed electronic heat pump device.

Then, while vacuum heat treatment (vacuum degassing treatment) is performed, the emitter-side unit 119 and the collector-side unit 129 are laid on top of each other via the spacing retention member 106. Then, as shown in FIG. 10, the sealing member 107 that is a preform made of a low-melting point glass material is attached so as to cover the periphery of both the stems 103, 104, and heat treatment is applied so that the sealing member 107 is melted and a frit seal is completed, by which the electronic heat pump device containing a vacuum inside is completed as shown in FIG. 11.

According to the above-structured manufacturing method of the electronic heat pump device, the spacers 105 are integrally formed on one surface of the semiconductor substrate 120 of the collector 102. This makes it possible to implement an electronic heat pump device which, with a simple structure, keeps the vacuum gap at a specified size while preventing a back flow of heat. More specifically, the piezoelectric element, the capacitance controller, the piezo feedback circuit and the like, which have been required as measures to maintain the vacuum gap between the emitter and the collector at a specified size in the conventional electronic heat pump devices of vacuum gap diode structure, become unnecessary, which makes it possible to reduce the number of component parts, thereby allowing reduction in size, weight and cost.

Figure 12:
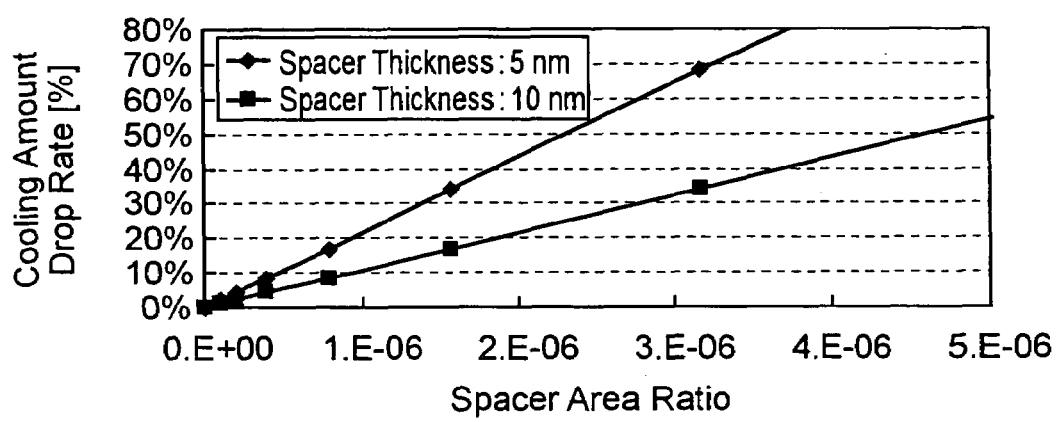
FIG. 12 is a graph chart showing the relationship between a spacer area ratio and a cooling amount drop rate.

Now, FIG. 12 shows the relation between a spacer area ratio and a cooling amount drop rate.

FIG. 12 is a graph on which Table 1 below is plotted.

TABLE 1

| Spacer area ratio | Cooling Amount Drop Rate | |
|---|---|---|
| | Spacer thickness 5 nm | Spacer thickness 10 nm |
| 9.9E-08 | 2.1% | 1.1% |
| 2.0E-07 | 4.3% | 2.1% |
| 3.9E-07 | 8.5% | 4.3% |
| 7.9E-07 | 17.1% | 8.5% |
| 1.6E-06 | 34.1% | 17.1% |
| 3.2E-06 | 68.2% | 34.1% |

The "spacer area ratio" herein refers to a total area of the spacers in contact with the emitter electrode divided by an area of the emitter electrode, and the "cooling amount drop rate" is a loss due to heat conduction of the spacers divided by a cooled heat amount transported by electrons. Each spacer is made of $SiO_2$ having low thermal conductivity, and the thermal conductivity of the spacer is 1.2 W/m·K.

As shown in FIG. 12, the spacer area and the heat amount which is a loss due to heat conduction are in proportional relation, and the size and pitch of the spacers are determined by the heat conduction loss. More specifically, assuming that the thickness of the spacers is 10 nm, and the spacer area ratio is $2.0 \times 10^{-7}$, then the cooling amount drop due to the presence of the spacers would be about 2%. Accordingly, in the embodiment, the spacers are disposed at a pitch of 200 μm to achieve the spacer area ratio of $2.5 \times 10^{-7}$.

The following condition should be satisfied:

(Spacer area ratio)×(spacer thermal conductivity [W/m·K])÷(spacer thickness [nm])$\leq 4.7 \times 10^{-8}$.

It is naturally understood that spacers with predetermined shapes can achieve the same level of thermal conductivity even with a pitch varied to 150 μm or 1 mm if the spacer total area is identical.

In the case where the spacer area ratio is $6.3 \times 10^{-6}$, a spacer heat loss becomes around 68% that is a considerable heat loss amount, and if the spacer total area becomes larger than that, a heat pump fails to function properly.

More precisely, the configuration and size of the spacers are determined so as to satisfy the following condition:

(Spacer area ratio)×(spacer thermal conductivity [W/m·K])÷(spacer thickness [nm])$\leq 7.6 \times 10^{-7}$.

Therefore, a cooling efficiency drop due to a back flow of heat through the spacer can be confined to 10% or less, resulting in reduction of power consumption. Moreover, it becomes possible to implement an electronic heat pump device capable of preventing short circuit from occurring even if the emitter and collector are deformed by stress or warpage.

Figure 13:
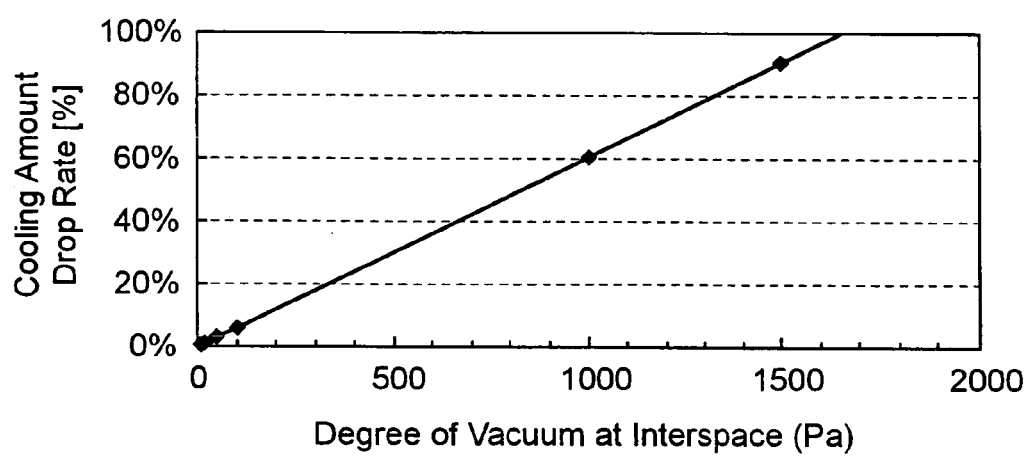
FIG. 13 is a graph chart showing the relation between the vacuum degree of a space and the drop rate of a cooling amount.

Next, FIG. 13 shows the relation between a degree of vacuum and a cooling amount drop rate.

FIG. 13 is a graph on which Table 2 below is plotted.

TABLE 2

| Degree of vacuum (Pa) | Cooling amount drop rate |
|---|---|
| 10 | 0.6% |
| 20 | 1.2% |
| 50 | 3.0% |
| 100 | 6.0% |
| 1000 | 60.3% |
| 1500 | 90.5% |

The "degree of vacuum" herein refers to a degree of vacuum of the space (vacuum gap), and the "cooling amount drop rate" is a loss due to heat conduction in the space (vacuum gap) divided by a cooled heat amount transported by electrons. Argon gas with free molecule thermal conductivity of 0.67 m/s·K is encapsulated in the space.

As shown in FIG. 13, a final degree of vacuum in the vacuum gap between the emitter and collector and a cooling amount drop rate are in proportional relation, and the degree of vacuum is determined by the heat conduction loss. More specifically, by keeping the vacuum so that a degree of vacuum is 100 Pa or less, a loss due to heat conduction in the vacuum gap can be confined to about 6%.

That is, the following condition is satisfied:

(Rare gas free molecule thermal conductivity [m/s·K])×(degree of vacuum of the space [Pa]) $\leq 67$.

In the case where a degree of vacuum is lowered to about 1000 Pa, a heat conduction loss of the vacuum gap becomes around 60%, and if the degree of vacuum becomes lower than that, a heat conduction loss becomes substantive.

More precisely, the degree of vacuum is kept so as to satisfy the following condition:

(Rare gas free molecule thermal conductivity [m/s·K])×(degree of vacuum of the space [Pa]) $\leq 670$.

A loss caused by decrease in the cooling efficiency of the emitter side due to a back flow of heat from the collector side through the space (vacuum gap) may be reduced to not more than 10% of the cooled heat amount, resulting in reduction of power consumption.

It is clearly understood that in the aforementioned respective manufacturing steps, other processing methods such as deposition and CVD may be used to manufacture films and the like. Further, it is appropriate that the spacer 105 is integrally formed on at least either the semiconductor substrate 110 of the emitter 101 or the semiconductor substrate 120 of the collector 102.

Second Embodiment

Figure 14:
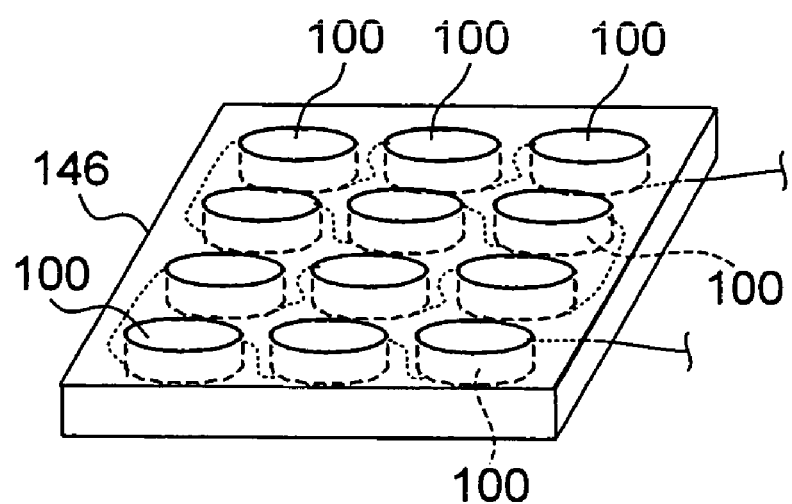
FIG. 14 is a perspective view showing a module incorporating the electronic heat pump devices.

FIG. 14 is a view of another embodiment of the present invention, showing a module with use of a plurality of the electronic heat pump devices 100 of the first embodiment. More precisely, the module has a box-shaped electrical and thermal insulator 146 containing, for example, $SiO_2$ as a main constituent, and a plurality of the electronic heat pump devices 100 embedded in the electrical and thermal insulator 146. A plurality of the electronic heat pump devices 100 are connected in series, though they may be connected in parallel or connected in series-parallel combination. Further, the number of the electronic heat pump devices 100 used in the module is determined in conformity to application, and therefore it is easily understood that the number is not limited to that shown in the drawing.

According to the above-structured module, in the case of requiring a cooling capability not satisfied by a single device, modularization makes it possible to fulfill a cooling panel with a wide are area.

Third Embodiment

As another embodiment of the present invention, there is a modification of the structure in FIG. 2. In this embodiment, the hollow section 130 of the first support member (emitter-side stem) 103 and the hollow section 140 of the second support member (collector-side stem) 104 shown in FIG. 2 are each filled with a thermal-conductivity material (unshown) lower in coefficient of thermal expansion than both the stems 103, 104. This thermal-conductivity material enables heat generated in the emitter 101 and the collector 102 to be transmitted to an external thermal conduction section.

The thermal-conductivity material is a deformable characteristic material which contains at least any one of Ti, Al, Zr, Fe or V and which has a thin-line shape or a plate shape. This makes it possible to absorb internally-generated gases at the time of vacuum sealing and vacuum maintenance by the thermal-conductivity material without reducing the thermal conduction effect so as to maintain the cooling effect.

It is easily understood that the structure according to the present embodiment may be applied to the module in the second embodiment.

The electronic heat pump device and the module may be mounted on various electronic equipment. Description is now given of several type of electronic equipment equipped with the electronic heat pump device or the module.

Fourth Embodiment

Figure 16:
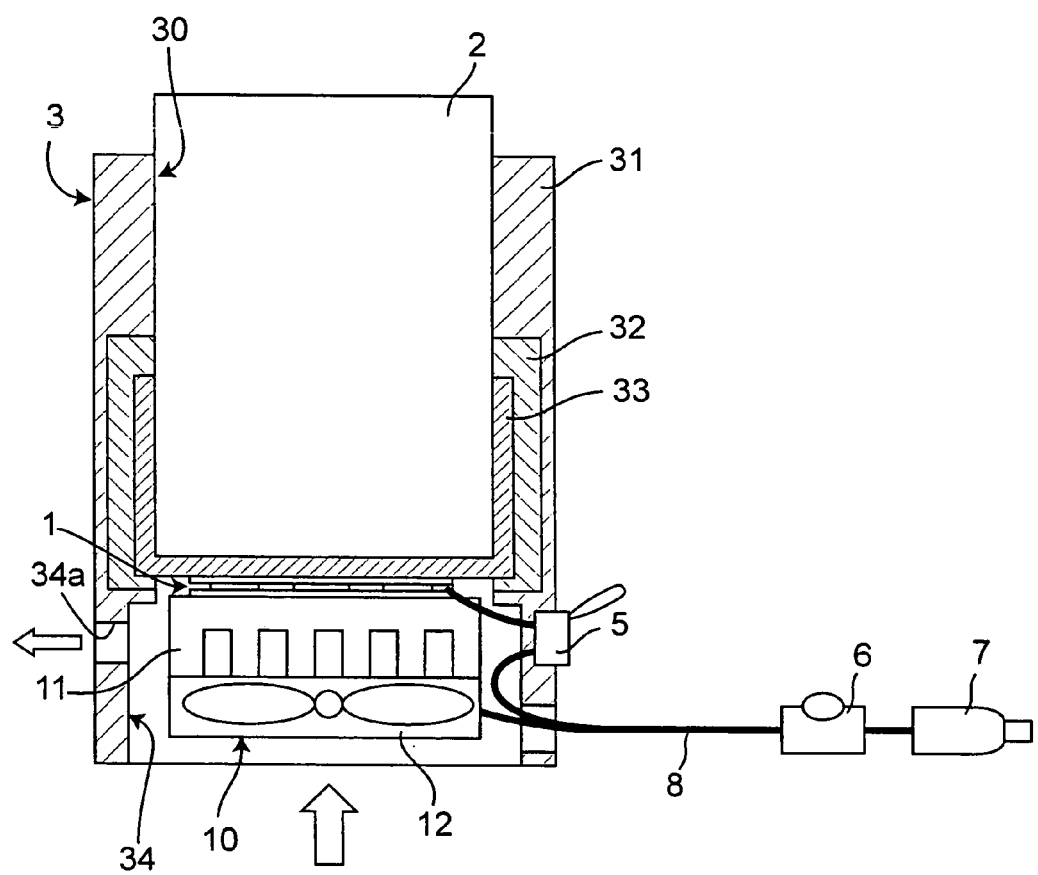
FIG. 16 is a vertical cross sectional view showing a beverage warming and cooling apparatus in one embodiment of the present invention.

FIG. 16 is a fragmentary vertical cross sectional view showing a beverage warming and cooling apparatus in one embodiment of the present invention.

The beverage warming and cooling apparatus has a housing 3 having a receiving section 30 for receiving a beverage container 2 and an electronic heat pump module 1 for cooling or heating the receiving section 30 of the housing 3.

Examples of the beverage container 2 include a can and a PET bottle containing beverages such as juice, tea and coffee.

The housing 3 has a cylinder-shaped container body 31, a cylinder-shaped heat insulator 32 attached to the inside of the container body 31, and a heat transfer case 33 which is attached to the inside of the heat insulator 32 and which is in the shape of a cylinder having a bottom portion.

The container body 31 is formed from resin and the like, the heat insulator 32 is formed from a heat insulator such as urethane, and the heat transfer case 33 is formed from a material having good thermal conductivity such as aluminum and magnesium.

The receiving section 30 is defined by the inner surface of the container body 31, the inner surface of the heat insulator 32 and the inner surface of the heat transfer case 33. More precisely, when received in the receiving section 30, the beverage container 2 is received in the heat transfer case 33.

The electronic heat pump module 1 is formed into an almost plate shape, and is disposed such that one surface side (upper surface side) of the electronic heat pump module 1 is thermally in contact with the outside (lower side) of the bottom portion of the heat transfer case 33, by which the beverage container 2 housed in the heat transfer case 33 is heated or cooled through the heat transfer case 33.

The electronic heat pump module 1 is electrically connected in sequence to a selector switch 5, a power supply switch 6 and a DC jack 7 through a lead wire 8.

The selector switch 5 switches between cooling or heating of the one surface side of the electronic heat pump module 1. More specifically, if the selector switch 5 is switched to "cooling", then the temperature of the one surface side (upper surface side) of the electronic heat pump module 1 decreases while the temperature of the other surface side (lower surface side) of the electronic heat pump module 1 increases. If the selector switch 5 is switched to "heating", then the temperature of the one surface side (upper surface side) of the electronic heat pump module 1 increases while the temperature of the other surface side (lower surface side) of the electronic heat pump module 1 decreases.

The power supply switch 6 switches power ON/OFF of the electronic heat pump module 1. The DC jack 7 is plugged into an AC adapter or an automobile cigarette socket to supply power.

Description is given of the operation of the beverage warming and cooling coaster. If the selector switch 5 is set to "cooling", the temperature of the one surface side of the electronic heat pump module 1 decreases, and through the heat transfer case 33, the electronic heat pump module 1 cools the beverage container 2 that is in contact with the heat transfer case 33. If the selector switch 5 is set to "heating", then the temperature of the one surface side of the electronic heat pump module 1 increases, and through the heat transfer case 33, the electronic heat pump module 1 heats the beverage container 2 that is in contact with the heat transfer case 33. It is to be noted that the heat that is transferred through the heat transfer case 33 is blocked from the container body by the heat insulator 32, which allows effective heating or cooling of the beverage container 2.

The housing 3 has an aperture 34 open to the opposite side of the receiving section 30. A cooling mechanism 10 is provided in the aperture 34 so as to be thermally in contact with the other surface side (lower surface side) of the electronic heat pump module 1.

The cooling mechanism 10 has a heat sink 11 that is thermally in contact with the other surface side of the electronic heat pump module 1, and a cooling fan 12 for cooling the heat sink 11. The heat sink 11 is formed from a material having good thermal conductivity such as metal.

Description is given of the operation of the cooling mechanism 10. When the selector switch 5 is set to "cooling" and the electronic heat pump module 1 is in the state of cooling the receiving section 30, the heat on the other surface side (exothermic side) of the electronic heat pump module 1 is transmitted to the heat sink 11, and air is blown from the cooling fan 12 to the heat sink 11 so as to remove the heat of the heat sink 11, by which the other surface side (exothermic side) of the electronic heat pump module 1 is cooled. Therefore, it becomes possible to forcibly discharge the heat of the electronic heat pump module 1 to the outside, which allows enhancement of the cooling effect.

It is to be noted that the container body 31 of the housing 3 is provided with an air hole 34a for linking the aperture 34 to the outside, which enables air sucked from the outside by the cooling fan 12 to be discharged to the outside through the air hole 34a as shown by an arrow, ensuring discharge of the heat of the electronic heat pump module 1.

Figure 17:
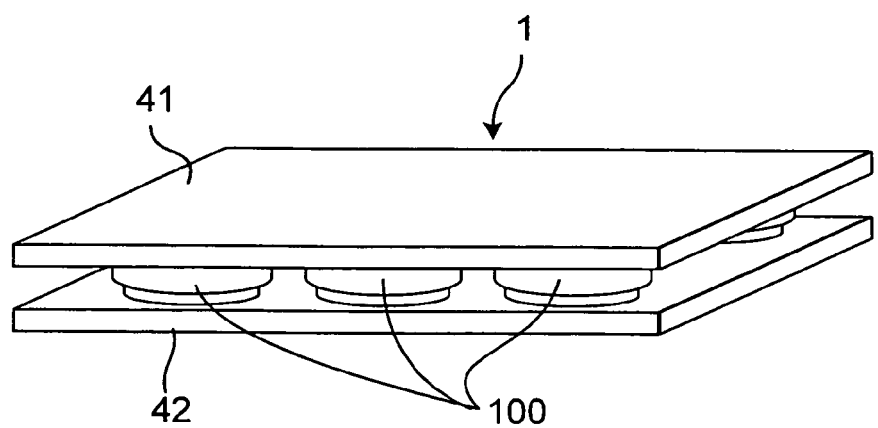
FIG. 17 is a perspective view showing an electronic heat pump module with electronic heat pump devices mounted thereon.

As shown in FIG. 17, the electronic heat pump module 1 has, for example, first and second heat transfer plate 41, 42 formed from a material having good thermal conductivity such as metal, and a plurality of vacuum diode-type electronic heat pump devices 100 interposed between the heat transfer plate 41 and 42. A plurality of the electronic heat pump devices 100 are the electronic heat pump devices according to the first embodiment or the third embodiment, and are electrically connected in series, in parallel, or in series-parallel combination.

Thus, a plurality of the electronic heat pump devices 100 are modularized, which allows swift cooling or heating of a large-capacity beverage container 2.

The electronic heat pump device 100 is structured such that an endothermic side and an exothermic side are thermally separated from each other, and constitutes an electronic heat pump mechanism that does not use the Peltier effect. Moreover, between the endothermic side and the exothermic side of the electronic heat pump device 100, there are present thermally insulative spacers for thermally separating the endothermic side from the exothermic side, which eliminates the necessity of additionally providing, for example, a mechanism for thermally separating the emitter and the collector, and thereby makes it possible to simplify the structure.

The electronic heat pump device 100 is in an almost disk shape, and by switching the direction of current flowing through the electronic heat pump device 100 by the selector switch 5, one surface of the electronic heat pump device 100 becomes an endothermic side and the other surface of the electronic heat pump device 100 becomes an exothermic side, or one surface of the electronic heat pump device 100 becomes the exothermic side and the other surface of the electronic heat pump device becomes the endothermic side. More precisely, the first heat transfer plate 41 is thermally in contact with one surface of the electronic heat pump device 100, and the second heat transfer plate 42 is thermally in contact with the other surface of the electronic heat pump device 100.

In the case where the electronic heat pump module 1 (the electronic heat pump device 100) cools the beverage container 2, the first semiconductor substrate 110 and the first internal electrode 111 form an emitter 101 to discharge electrons, while the second semiconductor substrate 120 and the second internal electrode 121 form a collector 102 to receive the electrons (see FIGS. 2 and 3).

Herein, the first support member (emitter-side stem) 103 (see FIGS. 1 and 2) is thermally in contact with the first heat transfer plate 41, and the first heat transfer plate 41 is thermally in contact with the heat transfer case 33.

It is to be noted that in the case where the electronic heat pump device 100 heats the beverage container 2, current should be applied to the first stem 103 and the second stem 104 in the reverse direction. In this case, the first semiconductor substrate 110 and the first internal electrode 111 form a collector to receive electrons, while the second semiconductor substrate 120 and the second internal electrode 121 form an emitter 101 to discharge electrons.

According to the above-structured beverage warming and cooling apparatus, there is provided the vacuum diode-type electronic heat pump device 100 in which an endothermic side and an exothermic side are thermally separated from each other, so that power consumption is considerably reduced compared to the cooling and heating mechanism of the Peltier device. Moreover, since harmful substances used as materials of the Peltier device are not used, the apparatus becomes environment-friendly.

Fifth Embodiment

Figure 18:
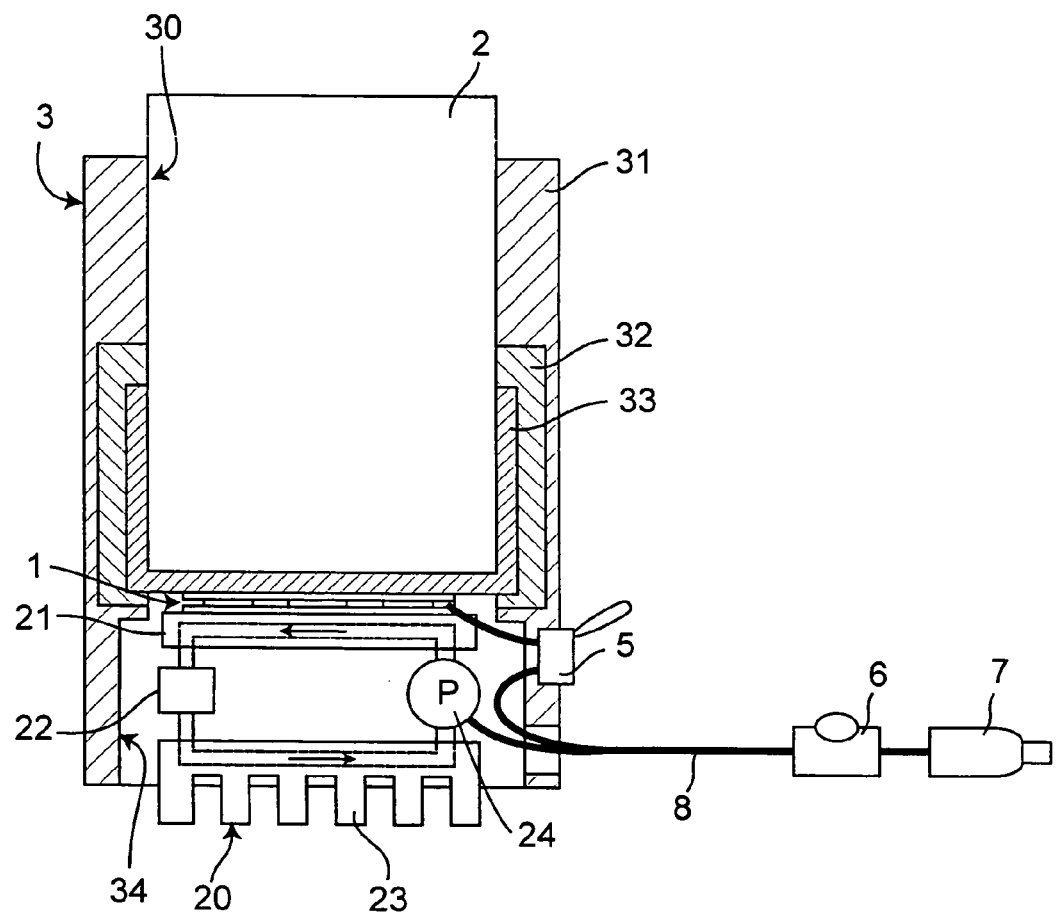
FIG. 18 is a vertical cross sectional view showing a beverage warming and cooling apparatus in another embodiment of the present invention.

FIG. 18 shows another embodiment of the cooling mechanism. The cooling mechanism 20 has a cooling jacket 21, a reserve tank 22, a heat sink 23 and a pump 24, which are circularly connected in sequence through piping to form a refrigeration cycle. The cooling mechanism 20 uses, for example, a glycol-based antifreeze as a coolant. It is to be noted that component members in FIG. 18 designated by the same reference numerals as the fourth embodiment (FIG. 16) share the same structure.

The cooling jacket 21 is disposed so as to be thermally in contact with the other surface side (lower surface side) of the electronic heat pump module 1 and is formed from a material with good thermal conductivity such as aluminum and copper.

The reserve tank 22 absorbs expansion or shrink caused by temperature change of the coolant. The heat sink 23 is formed from a material having good thermal conductivity such as metal. The pump 24 circulates the coolant in the refrigeration cycle.

Description is given of the operation of the cooling mechanism 20. When the electronic heat pump module 1 is in the state of cooling the receiving section 30, heat generated on the other surface side (exothermic side) of the electronic heat pump module 1 is transferred to the coolant that is circulating inside the cooling jacket 21. Through the coolant, the heat circulates the heat sink 23, and the heat transferred to the heat sink 23 is discharged to the outside (outside air). Moreover, if, for example, a material with good thermal conductivity such as copper is used as the piping through which the coolant is circulated, heat is also discharged from the piping.

It is to be noted that a blower such as cooling fans may be separately provided on the inside of the heat sink 23 so as to forcibly discharge heat to the outside for increasing the cooling effect. In this case, even with the decreasing rotation speed of the cooling fan, the same cooling effect may still be obtained, and therefore noise may be reduced.

Since the pump 24 only needs a capability to circulate the coolant from the cooling jacket 21 to the heat sink 23, s small-sized light-weight pump with low discharge pressure may be used, which allows implementation of a beverage warming and cooling apparatus with low noise and low vibration.

Thus, the heat on the exothermic surface of the electronic heat pump module 1 is effectively transported from the cooling jacket 21 to the heat sink 23 through the coolant and discharged therefrom, which makes it possible to reliably discharge heat while preventing noise from being generated in a simple structure.

Sixth Embodiment

Figure 19:
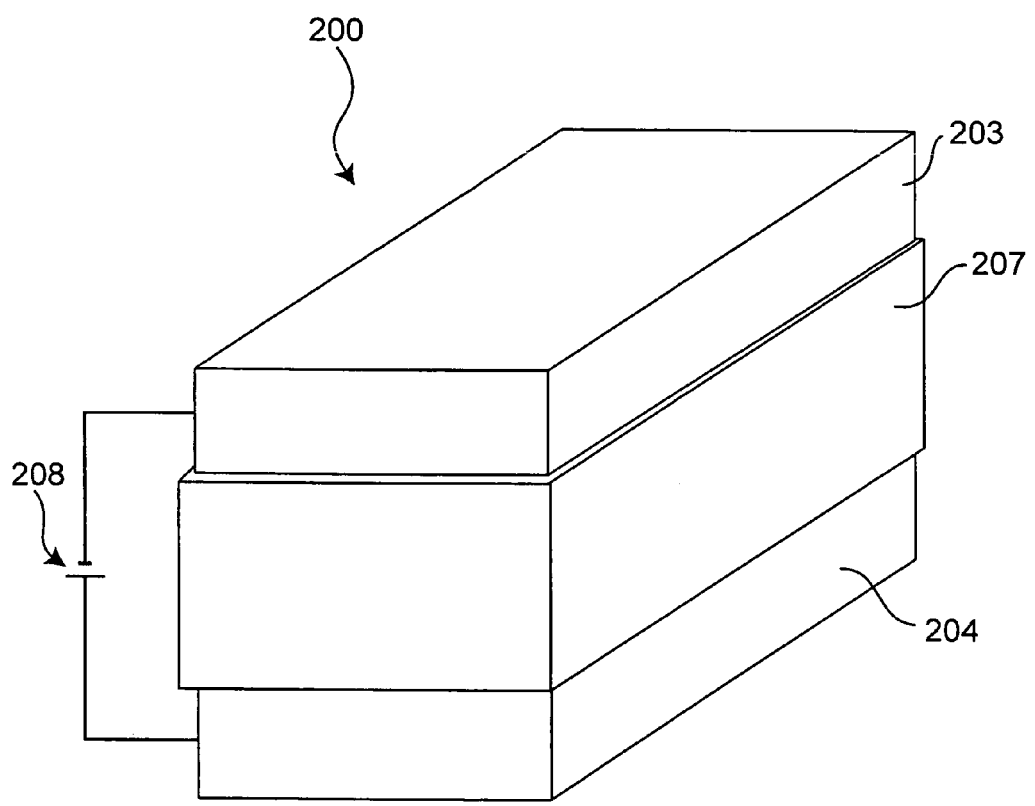
FIG. 19 is a perspective view showing another electronic heat pump device.
Figure 20:
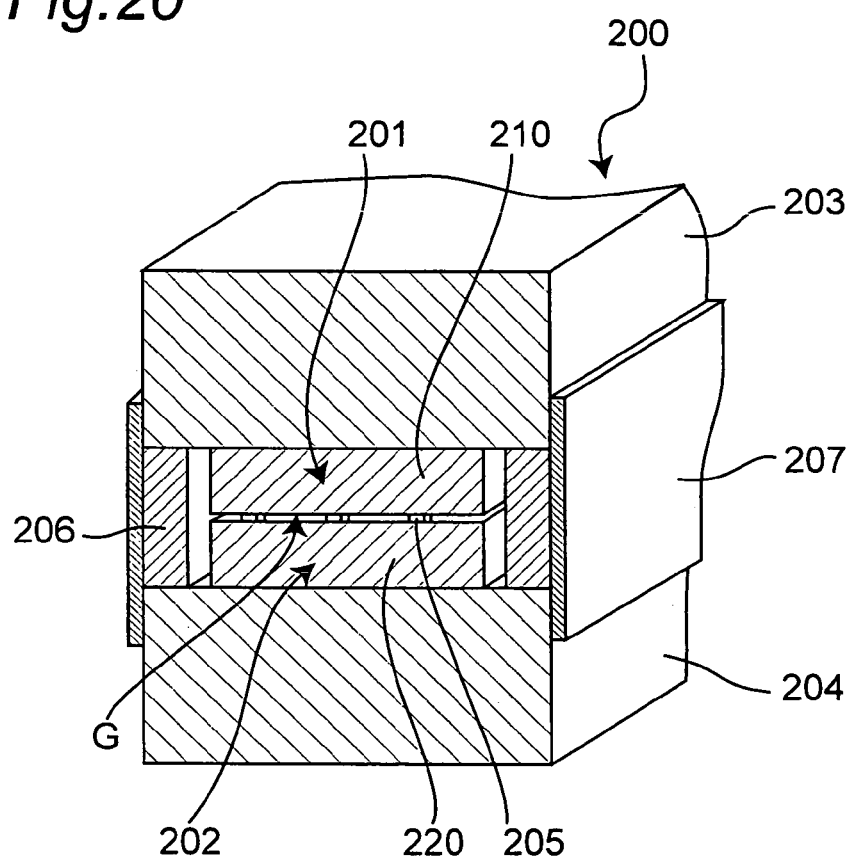
FIG. 20 is a vertical cross sectional perspective view showing the electronic heat pump device.
Figure 21:
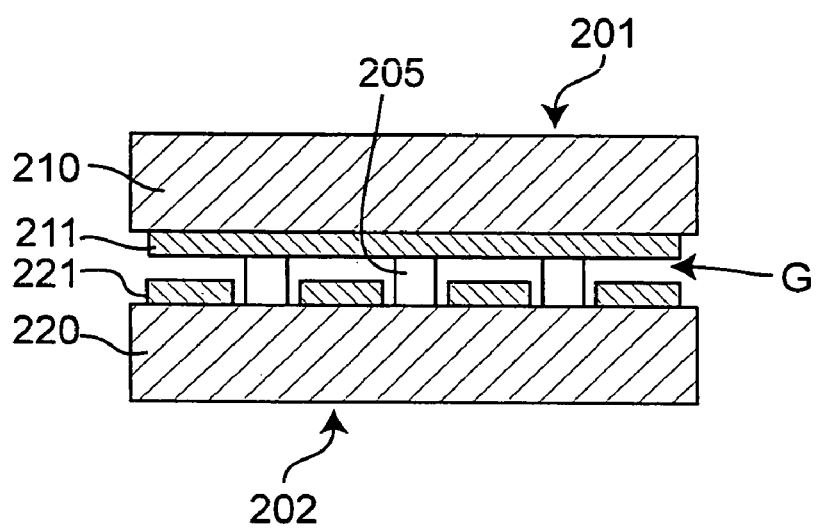
FIG. 21 is an enlarged cross sectional view showing an essential part of the electronic heat pump device.

Next, FIG. 19, FIG. 20 and FIG. 21 show another embodiment of the electronic heat pump device. The electronic heat pump device 200 has a first support member 203 which has electric and thermal conductivity and which is in an almost rectangular parallelepiped shape, a first semiconductor substrate 210 having one surface connected to the first support member 203 so as to be able to conduct electricity and heat, a first internal electrode 211 provided on the other surface of the first semiconductor substrate 210, a second support member 204 which has electric and thermal conductivity and which is in an almost rectangular parallelepiped shape, a second semiconductor substrate 220 having one surface connected to the second support member 204 so as to be able to conduct electricity and heat, a second internal electrode 221 provided on the other surface of the second semiconductor substrate 220, an electrically and thermally insulative spacing retention member 206 disposed between the first support member 203 and the second support member 204 for keeping the spacing between the first support member 203 and the second support member 204 constant, and a sealing member 207 for maintaining vacuum between the first support member 203 and the second support member 204.

Hereinbelow, description will be given of the case where the beverage container 2 is cooled by the electronic heat pump device 200. In this case, the first semiconductor substrate 210 and the first internal electrode 211 form an emitter 201 to discharge electrons, while the second semiconductor substrate 220 and the second internal electrode 221 form a collector 202 to receive the electrons.

Herein, the first support member 203 is thermally in contact with the first heat transfer plate 41 shown in FIG. 17, and the first heat transfer plate 41 is thermally in contact with the heat transfer case 33 shown in FIG. 16.

The first support member 203 and the second support member 204 are each solid.

The emitter 201 and the collector 202 are disposed so as to face each other, and a space (vacuum gap) G is present between the emitter 201 and the collector 202.

The first support member 203 and the second support member 204 are connected to a power supply 208.

Description is now given of the operation of the electronic heat pump device 200. Upon application of a current from the power supply 208 to the first support member 203 and the second support member 204, a voltage is applied to the emitter 201 and the collector 202 to feed electrons. Then, the emitter 201 side (the first support member 203) becomes a cooling (endothermic) side while the collector 202 side (the second support member 204) becomes an exothermic (heating) side.

The first internal electrode 211 is provided on the almost entire other surface of the first semiconductor substrate 210. More specifically, the first semiconductor substrate 210 is an n-type silicon substrate whose surface is polished for achieving conductivity, and the first internal electrode 211 is a Ti thin film formed on the surface-polished n-type silicon substrate and whose surface is covered with cesium. The emitter 201 is in an almost rectangular parallelepiped shape.

The second internal electrode 221 is provided on the entire other surface of the second semiconductor substrate 220 except a part thereof. On the second semiconductor substrate 220, an electrically and thermally insulative spacer 205 is integrally formed.

More specifically, the second semiconductor substrate 220 is a surface-polished n-type silicon substrate for achieving conductivity, and the polished surface of the n-type silicon substrate is subjected to thermal oxidation and is patterned by photoetching to form oxide silicon spacers 205 disposed in a square lattice configuration. A Ti thin film patterned so as to exclude the periphery of the spacer 205 forms the second internal electrode 221. The collector 202 is in an almost rectangular parallelepiped shape, and a difference between the thickness of the spacers 205 and the thickness of the second internal electrode 221 of the Ti thin film constitute the space G.

A plurality of spacers 205 are formed integrally with the second semiconductor substrate 220 and are also in contact with the first internal electrode 211. Moreover, the plurality of spacers 205 are arranged so as to be distributed almost evenly on the entire second semiconductor substrate 220 at intervals between each other, by which the space G between the first internal electrode 211 and the second internal electrode 221 is kept constant and the thickness of the spacers 205 determines the size of the space G.

The first support member 203 and the second support member 204 have rigidity, Young's modulus and a thickness which prevent the first internal electrode 211 and the first internal electrode 211 from being brought into contact by compressive stress generated by a pressure difference between external atmospheric pressure and internal vacuum in a condition that the spacing retention member 206 is in contact with an outer peripheral portion of the first support member 203 and an outer peripheral portion of the second support member 204.

More specifically, the first support member 203 and the second support member 204 are made of tungsten which is a material with high rigidity so as to prevent the space G from being short-circuited by stress deformation due to compressive stress. It is to be noted that as a material of the first support member 203 and the second support member 204, tungsten carbide, copper, or silicon may be used instead of tungsten, for which the thickness of the first support member 203 and the second support member 204 should be adjusted.

Thus, according to the above-structured beverage warming and cooling apparatus, the first support member 203 and the second support member 204 are solid, which makes it possible to form the electronic heat pump device 200 thinner and smaller, thereby allowing further downsizing of the beverage warming and cooling apparatus.

Since the first support member 203 and the second support member 204 each have an almost rectangular parallelepiped shape, the electronic heat pump device 200 can be formed into an almost rectangular parallelepiped chip shape, which facilitates incorporation of the electronic heat pump device 200 in, for example, new or existing beverage warming and cooling apparatus.

It should be understood that other structures and effects of the electronic heat pump device 200 are identical to those of the electronic heat pump device 100 in the first embodiment, and therefore the description thereof is omitted herein.

It is to be noted that in the case where the electronic heat pump device 200 heats the beverage container 2, current should be applied to the first support member 203 and the second support member 204 in the reversed direction. In this case, the first semiconductor substrate 210 and the first internal electrode 211 form a collector to receive electrons, while the second semiconductor substrate 220 and the second internal electrode 221 form an emitter to discharge electrons.

It is to be noted that although the beverage warming and cooling apparatus shown in FIG. 16 and FIG. 18 uses a modularized electronic heat pump device, a single apparatus (single device) may be used instead of the modularized one. Further, it is appropriate that the spacer is integrally formed on at least either the first semiconductor substrate or the second semiconductor substrate.

Seventh Embodiment

Figure 22:
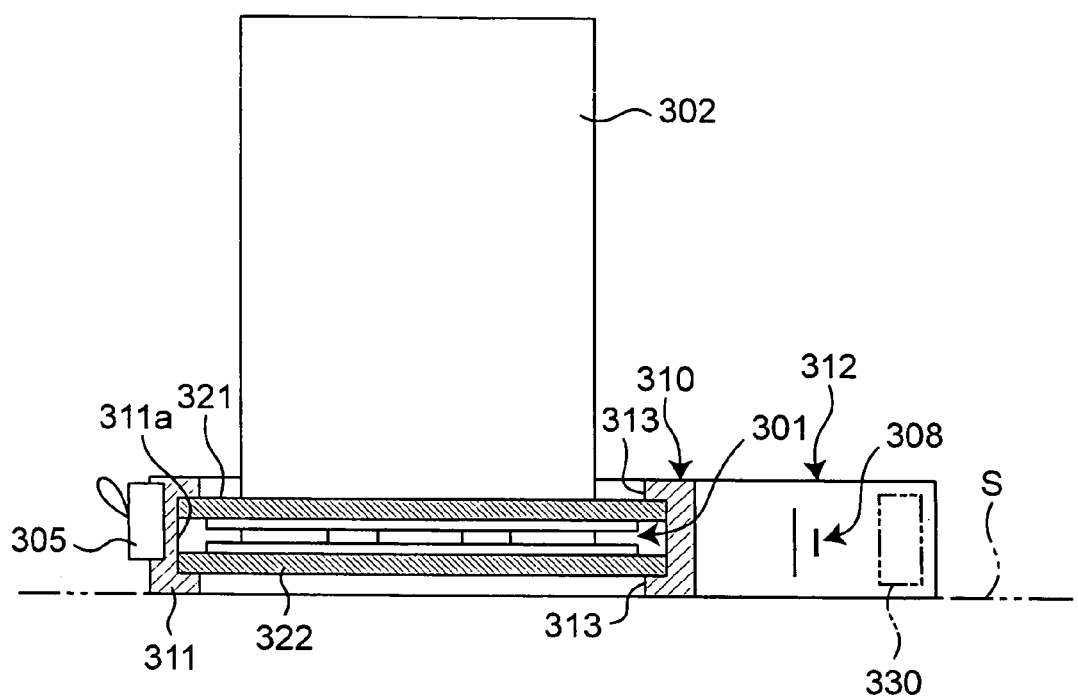
FIG. 22 is a vertical cross sectional view showing a beverage warming and cooling coaster in one embodiment of the present invention.

FIG. 22 is a vertical cross sectional view showing a beverage warming and cooling coaster in one embodiment of the present invention.

The beverage warming and cooling coaster has a coaster main body 310 and an electronic heat pump module 301 attached to the coaster main body 310 for cooling one surface side of the coaster main body 310 and heating the other surface side of the coaster main body 310. The electronic heat pump module 301 is equal or similar to the electronic heat pump module 1 shown in FIG. 17 which is used in the beverage warming and cooling coaster in the fourth embodiment, and therefore detailed description thereof will be omitted herein.

The coaster main body 310 has first and second transfer plates 321, 322 for sandwiching the electronic heat pump module 301 therebetween, an outer frame 311 which encircles the electronic heat pump module 301 and secures the periphery of the first and second transfer plates 321, 322, and a power supply case 312 which is integrally attached to the outer circumferential surface of the outer frame 311 and includes a power supply 308 for the electronic heat pump module 301.

The first and second transfer plates 321, 322 are formed from a material having good thermal conductivity such as aluminum and magnesium. The outer frame 311 is formed from a heat insulator such as urethane, which makes it possible to prevent external heat leakage.

On the inner circumferential surface of the outer frame 311, there is provided a recess 311*a*, and the first and second transfer plates 321, 322 with the electronic heat pump module 301 interposed therebetween are fit into the recess 311*a*. More specifically, the first and second transfer plates 321, 322 locate inside the lateral surface of the outer frame 311. The lateral surface of the outer frame 311 herein refers to a surface which comes into contact with an upper surface S of a mount such as tables shown by a virtual line when the beverage warming and cooling coaster is used in the state of being placed on the upper surface S of the mount.

Thus, since the first and second transfer plates 321, 322 locate inside the lateral surface of the outer frame 311, a space may be formed between the first transfer plate 321 or the second transfer plate 322 and the upper surface S of the mount when the beverage warming and cooling coaster is placed on the upper surface S of the mount and the lateral surface of the outer frame 311 is brought into contact with the upper surface S of the mount. In other words, on both sides of the coaster main body 310, a recess portion 313 is formed.

The power supply case 312 is formed from, for example, resin and the like, and the lateral surface of the power supply case 312 is almost the same plane as (almost flush with) the lateral surface of the outer frame 311. Therefore, when the beverage warming and cooling coaster is placed on the table, it will not rattle, and therefore it become possible to prevent a container such as cups filled with beverages seated on the beverage warming and cooling coaster from falling down.

The power supply 308 is a direct-current power supply such as charging batteries and solar batteries, which is electrically connected to the electronic heat pump module 301 through a power supply switch 305 attached to the outer frame 311. The power supply switch 305 switches ON/OFF of a current passage to the electronic heat pump module 301 from the power supply 308.

The electronic heat pump module 301 is formed into an almost plate shape, and one surface (upper surface) of the electronic heat pump module 301 is thermally in contact with the inside surface (lower side) of the first transfer plate 321, while the other surface (lower surface) of the electronic heat pump module 301 is thermally in contact with the inside surface (upper side) of the second transfer plate 322.

On the outside surface (upper surface) of the first transfer plate 321, a beverage container 302 is placed. Examples of the beverage container 302 include a cup, a can and a PET bottle containing juice, tea and coffee. At this point, the beverage container 302 is inserted into the recess portion 313 of the coaster main body 310, which makes it possible to prevent the beverage container 302 from falling off.

Description is now given of the usage and operation of the beverage warming and cooling coaster.

When the beverage warming and cooling coaster is placed on the upper surface S of the mount, the beverage container 302 is placed on the upper surface of the first transfer plate 321, and the power supply switch 305 is turned "ON", the temperature of one surface side of the electronic heat pump module 301 decreases, by which the electronic heat pump module 301 cools (insulates) the beverage container 302 that is in contact with the first transfer plate 321 through the first transfer plate 321. At the same time, the temperature of the other surface side of the electronic heat pump module 301 increases, by which the electronic heat pump module 301 heats the second transfer plate 322 and heat is discharged from the second transfer plate 322 to the outside.

At this point, the space (the recess portion 313) formed between the second transfer plate 322 and the upper surface S of the mount helps efficient discharge of excessive heat from the second transfer plate 322 to the atmosphere.

In the case of heating (insulating) the beverage container 302, a current from the power supply 308 is applied in opposite direction so that the temperature of one surface side of the electronic heat pump module 301 increases, by which the electronic heat pump module 301 heats the beverage container 302 through the first transfer plate 321. At the same time, the temperature of the other surface side of the electronic heat pump module 301 decreases, by which the electronic heat pump module 301 cools the second transfer plate 322.

In this case, there is provided a current switch means 330 for switching direction of a current fed to the electronic heat pump module 301 for heating one surface side of the coaster main body 310 while cooling the other surface side of the coaster main body 310. Although provided inside the power supply case 312 in FIG. 22, the current switch means 330 may be provided outside the power supply case 312.

More specifically, the current switch means 330 has, for example, a selector switch, and if the selector switch is switched to "cooling", then the temperature of the one surface side (upper surface side) of the electronic heat pump module 301 decreases while the temperature of the other surface side (lower surface side) of the electronic heat pump module 301 increases. If the selector switch is switched to "heating", then the temperature of the one surface side (upper surface side) of the electronic heat pump module 301 increases while the temperature of the other surface side (lower surface side) of the electronic heat pump module 301 decreases.

It is to be noted that instead of applying a current from the power supply 308 in opposite direction, the beverage warming and cooling coaster may be turned over (upside down) and the beverage container 302 may be placed on the upper surface of the second transfer plate 322 so that the beverage container 302 is heated by the other surface side of the electronic heat pump module 301 through the second transfer plate 322.

In the case where the electronic heat pump module 301 (the electronic heat pump device 100) cools the beverage container 302, the first semiconductor substrate 110 and the first internal electrode 111 form an emitter 101 to discharge electrons, while the second semiconductor substrate 120 and the second internal electrode 121 form a collector 102 to receive the electrons (see FIGS. 2 and 3).

Herein, the first support member (emitter-side stem) 103 (see FIGS. 1 and 2) is thermally in contact with the first heat transfer plate 41 shown in FIG. 17, and the first heat transfer plate 41 is thermally in contact with the first transfer plate 321 shown in FIG. 22.

It is to be noted that in the case where the electronic heat pump device 100 heats the beverage container 302, current should be applied to the first support member 103 and the second support member 104 in opposite direction. In this case, the first semiconductor substrate 110 and the first internal electrode 111 form a collector to receive electrons, while the second semiconductor substrate 120 and the second internal electrode 121 form an emitter to discharge electrons.

According to the above-structured beverage warming and cooling coaster, there is provided the vacuum diode-type electronic heat pump device 100 in which an endothermic side and an exothermic side are thermally separated from each other, so that power consumption is considerably reduced compared to the cooling and heating mechanism of the Peltier device. Moreover, since harmful substances used as materials of the Peltier device are not used, the apparatus becomes environment-friendly.

It is to be understood that in the present embodiment, although the module including the electronic heat pump devices 100 shown in FIGS. 1 to 3 is used as the electronic heat pump module 301, it is also acceptable to use a module including the electronic heat pump devices 200 shown in FIGS. 19 to 21 as in the sixth embodiment. The effects in that case are as described in connection with the sixth embodiment.

Further, the electronic heat pump devices may be used in a discrete manner (in the form of single devices) instead of being used in the form of a module.

Further, the first transfer plate and the second transfer plate may be removed.

Further, it is enough that the spacer is integrally formed on at least one of the first semiconductor substrate or the second semiconductor substrate.

Eighth Embodiment

Figure 23:
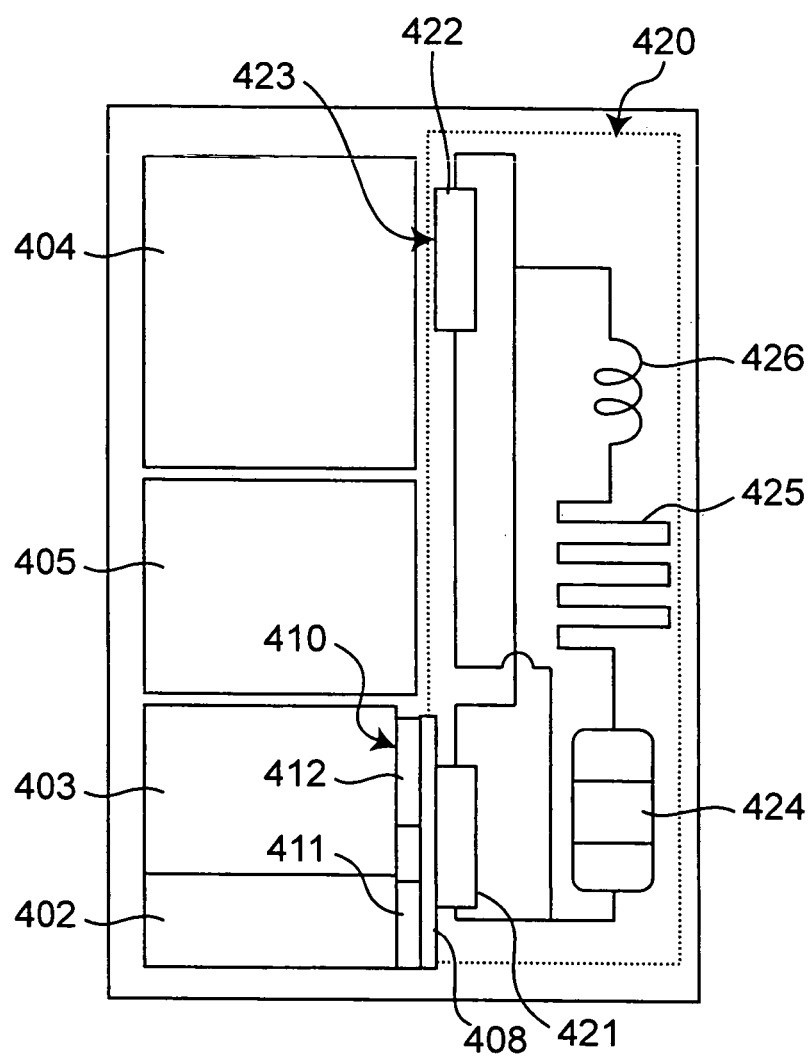
FIG. 23 is a simplified diagram showing the configuration of a refrigerator in one embodiment of the present invention.

FIG. 23 is a simplified diagram showing a refrigerator in one embodiment of the present invention.

The refrigerator has a quick-freezing chamber 402, a freezing chamber 403, a chilling chamber 404, a vegetable chamber 405, a first cooling mechanism 410 for cooling the inside of the quick-freezing chamber 402 and the freezing chamber 403, and a second cooling mechanism 420 for cooling the inside of the chilling chamber 404 and the exothermic side of the first cooling mechanism 410.

The first cooling mechanism 410 has a first electronic heat pump module 411 for cooling the quick-freezing chamber 402, and a second electronic heat pump module 412 for cooling the freezing chamber 403.

The second cooling mechanism 420, which involves a refrigeration cycle utilizing vapor compression and expansion of a refrigerant, has a compressor 424, a condenser 425, a capillary tube 426 serving as a expansion mechanism, and an evaporator group 423, which are circularly connected in sequence through piping through which the refrigerant travels.

Description is herein given of the refrigeration cycle. A refrigerant encapsulated inside is compressed at a high temperature and high pressure by the compressor 424, its heat is discharged in the condenser 425, the refrigerant is then decompressed and expanded in the capillary tube 426, absorbs heat in the evaporator group 423 and evaporates, and then the refrigerant is again inhaled to the compressor 424, which constitute a vapor compression refrigeration cycle.

The evaporator group 423 has a first evaporator 421 for cooling the exothermic side of the first cooling mechanism 410 (the first electronic heat pump module 411 and the second electronic heat pump module 412), and a second evaporator 422 for cooling the inside of the chilling chamber 404 and the vegetable chamber 405. The first evaporator 421 and the second evaporator 422 are connected in parallel.

The first cooling mechanism 410 is disposed at the rear side of the freezing chamber 402, 403, and the cooling (endothermic) side of the first cooling mechanism 410 faces the freezing chamber 402, 403 side (front side) while the exothermic (heating) side of the first cooling mechanism 410 faces the opposite side of the freezing chamber 402, 403 (rear side).

The second cooling mechanism 420 is disposed at the rear side of the freezing chamber 402, 403, the chilling chamber 404, the vegetable chamber 405 and the first cooling mechanism 410. The first evaporator 421 is thermally connected to the exothermic side of the first cooling mechanism 410 through a heat spreader 408 which is a conductor with good thermal conductivity.

According to the above-structured refrigerator, the first cooling mechanism 410 cools the inside of the freezing chamber 402, 403, and the second cooling mechanism 420 cools the inside of the chilling chamber 404 and the exothermic side of the first cooling mechanism 410. Consequently, in the second cooling mechanism 420, the inside of the chilling chamber 404 and the exothermic side of the first cooling mechanism 410 may be cooled at the same temperature, which facilitates control of the second cooling mechanism 420 and allows reduction in power consumption of the second cooling mechanism 420.

More specifically, the temperature of the first evaporator 421 needs to be decreased not up to −20° C. for freezing, but only to around −5° C. that is equivalent to the temperature of the second evaporator 422, which makes it possible to reduce a decompression amount in the capillary tube 426 and to improve the energy efficiency of the compressor 424 for about 50%, thereby achieving reduced power consumption.

As the first electronic heat pump module 411, 412, the electronic heat pump module in the second embodiment shown in FIG. 14 is used herein. The electronic heat pump module has a plurality of electronic heat pump devices 100 (see FIGS. 1 to 3) as described above.

Thus, a plurality of the electronic heat pump devices 100 are modularized, which allows swift cooling of a large-capacity freezing chamber or chilling chamber.

The specific size of the electronic heat pump module is as following. Assuming that a capacity of the freezing chamber 402, 403 is 150 lit., the electronic heat pump device 100 is in a disk shape with a diameter of 11.5 mm and a thickness of 2.3 mmt, the first electronic heat pump module 411 has outer dimensions of 50 mm×40 mm×3.3 mmt, and the second electronic heat pump module 412 has outer dimensions of 60 mm×60 mm×3.3 mmt.

The weight of these two module 411, 412 amounts to only about 100 g, so that the weight and volume of these two module 411, 412 are one several tenth of those of a conventional compressor, and therefore reduction in size and weight is achieved.

In the refrigerator of the present invention, the first cooling mechanism 410 has the electronic heat pump devices 100, which achieves drastic reduction in size and weight compared to the one using a vapor-compression refrigeration cycle and also achieves considerable reduction in power consumption compared to the cooling mechanism of the Peltier device, thereby accomplishing downsizing and decreased power consumption. Moreover, the second cooling mechanism 420 has a vapor compression refrigeration cycle, which enables the vapor compression refrigeration cycle suitable for high-capacity cooling and provided at a low cost to perform primary cooling of the entire refrigerator, thereby making it possible to diminish the number of the mounted electronic heat pump devices 100.

Ninth Embodiment

Figure 24:
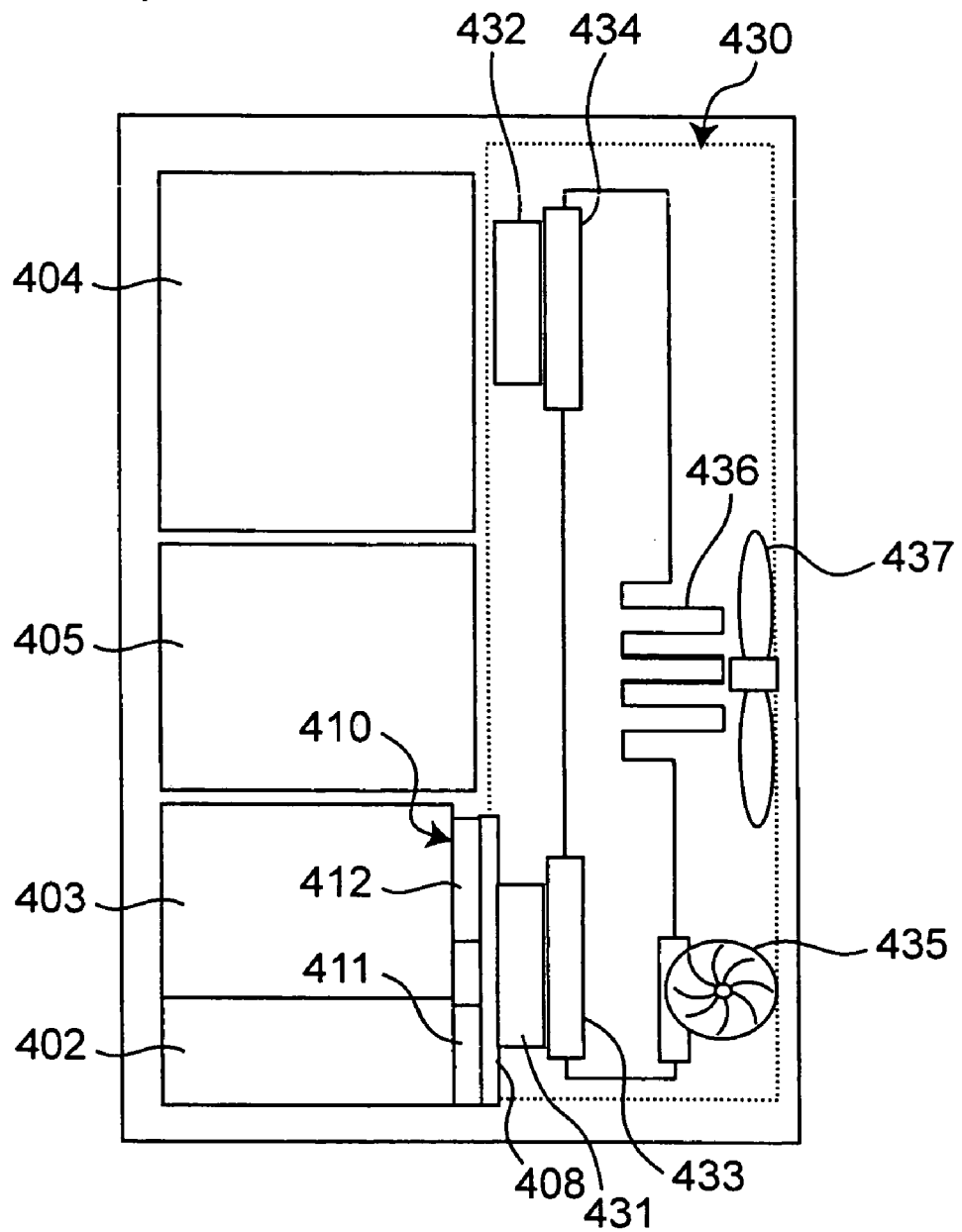
FIG. 24 is a simplified diagram showing the configuration of a refrigerator in another embodiment of the present invention.

FIG. 24 shows a refrigerator in another embodiment of the present invention. In this refrigerator, a first cooling mechanism 410 for cooling the inside of the freezing chamber 402, 403, and a second cooling mechanism 430 for cooling the inside of the chilling chamber 404 and the exothermic side of the first cooling mechanism 410 are provided with the electronic heat pump device 100. It is to be noted that component members in FIG. 24 designated by the same reference numerals as the eight embodiment (FIG. 22) share the same structure.

The second cooling mechanism 430 has a first electronic heat pump module 431 for cooling the exothermic side of the first cooling mechanism 410 through the heat spreader 408, a second electronic heat pump module 432 for cooling the inside of the chilling chamber 404 and the vegetable chamber 405, a first water cooling jacket 433 facing the exothermic side of the first electronic heat pump module 431, a second water cooling jacket 434 facing the exothermic side of the second electronic heat pump module 432, a heat exchanger 436 and a circulating pump 435.

The first water cooling jacket 433, the second water cooling jacket 434, the heat exchanger 436 and the circulating pump 435 are circularly connected in sequence through pipes.

The first and second electronic heat pump modules 431, 432 in the second cooling mechanism 430 are equipped with the electronic heat pump devices 100, and share the same structure as the first and second electronic heat pump module 411, 412 in the first cooling mechanism 410.

Description is herein given of the operation of the second cooling mechanism 430. Water (refrigerant) encapsulated in the piping is pumped by the circulating pump 435 and the water draws heat (is heated) from the first electronic heat pump module 431 in the first water cooling jacket 433. Further, the water draws heat from the second electronic heat pump module 432 in the second water cooling jacket 434 and discharges heat (is cooled) in the heat exchanger 436 before returning to the circulating pump 435. It is to be noted that in the heat exchanger 436, air is sent by a blower fan 437 for enhancing heat release from warmed water.

Since the circulating pump 435 only needs a capability to circulate water from the water cooling jacket 433, 434 to the heat exchanger 436, s small-sized light-weight pump with low discharge pressure may be used, which allows implementation of a refrigerator with low noise and low vibration.

The blower fan 437 needs to be driven only when opening and closing of a door of the refrigerator is frequent and so a maximum cooling capability is required.

Consequently, by sensing and controlling the temperature of the water cooling jacket 433, 434, the rotation of the blower fan 437 is suppressed during the operation involving less load such as the nighttime operation, which achieves reduction in generation of noise.

Examples of the water cooling jacket 433, 434 include products used for cooling CPU, which are structured such that a groove through which the refrigerant flows is provided inside a metal block with good thermal conductivity.

Thus, the heat on the exothermic surface of the electronic heat pump module 431, 432 is effectively transported from the water cooling jacket 433, 434 to the heat exchanger 436 through the water serving as a refrigerant, which enables the electronic heat pump modules 411, 412, 431, 432 to cool the freezing chamber 402, 403, the chilling chamber 404 and the vegetable chamber 405.

Therefore, according to the refrigerator, no refrigerant which has an action to deplete the ozone layer and affects the global environment nor flammable refrigerant is used, which secures high safety and silence.

It is to be noted that although in the eighth and ninth embodiments, the module equipped with the electronic heat pump device 100 shown in FIGS. 1 to 3 has been used as the electronic heat pump module, the module equipped with the electronic heat pump device 200 shown in FIGS. 19 to 21 may be used instead. The operation and effects in that case are as described in the sixth embodiment. Further, the apparatus described in the third embodiment may be used as the electronic heat pump device.

Further, the first cooling mechanism may have the refrigeration cycle, and the second cooling mechanism may have the electronic heat pump device.

Further, the electronic heat pump device may be used as a single apparatus (single device) instead of being modularized.

Further, the freezing chamber is cooled by the method of utilizing heat conduction between the inner wall of the freezing chamber with high thermal conductivity and the electronic heat pump module. However, it is also acceptable to adopt a method in which a fan is disposed and cold air is circulated from the electronic heat pump module into the freezing chamber.

Further, the spacer may be integrally formed on at least either the semiconductor substrate of the emitter or the semiconductor substrate of the collector.

Tenth Embodiment

Figure 25:
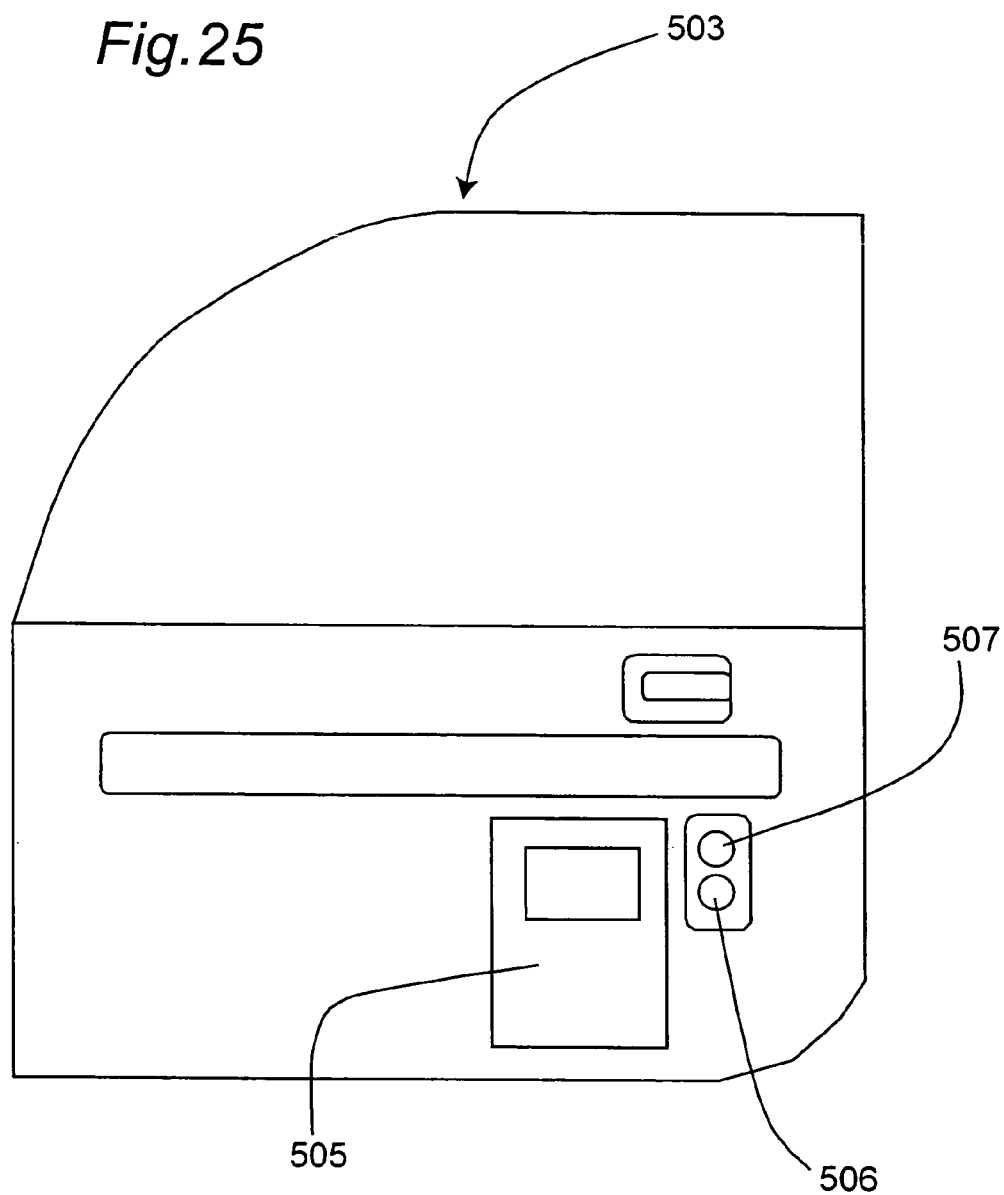
FIG. 25 is a schematic diagram showing the configuration of a vehicular warming and cooling case in one embodiment of the present invention.

FIG. 25 is a schematic diagram showing the configuration of a vehicular warming and cooling case in one embodiment of the present invention. The warming and cooling case 505 is built in the interior side of a vehicular door 503 of a car. The vehicular door 503 is provided with a power supply switch 506 and a selector switch 507 on the interior side.

The warming and cooling case 505 is structured such that the inside of the warming and cooling case 505 is cooled or heated based on the polarity of power supply voltage which is supplied through an unshown power supply code. More particularly, the power supply switch 506 switches ON/OFF of the power supply voltage to the warming and cooling case 505. The selector switch 507 switches the polarity of the power supply voltage so as to cool or heat the inside of the warming and cooling case 505. For example, if the selector switch 507 is switched to "cooling", then the warming and cooling case 505 is put in a cooling state while if the selector switch 507 is switched to "heating", then the warming and cooling case 505 is put in a heating state.

Figure 26:
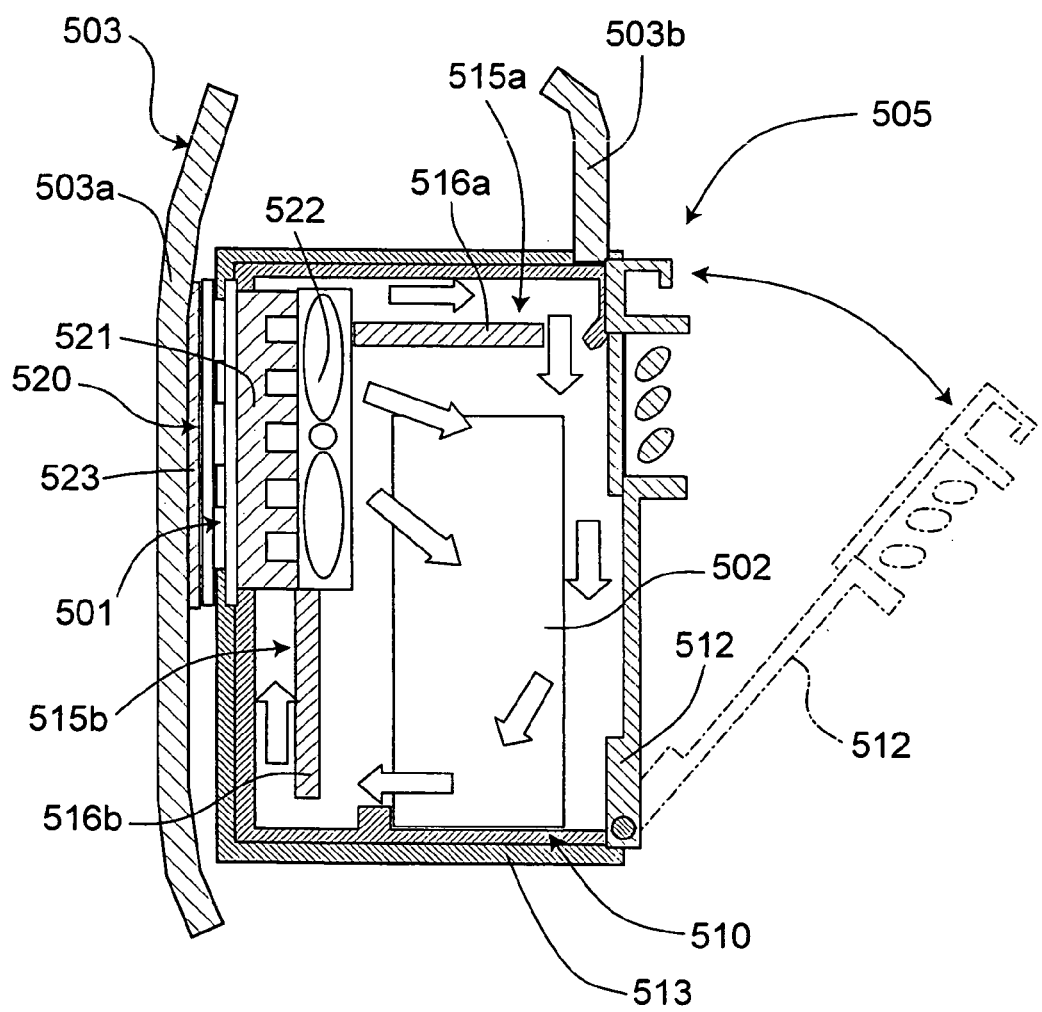
FIG. 26 is a schematic diagram showing the configuration of the vehicular warming and cooling case.

The warming and cooling case 505, as shown in the schematic diagram of FIG. 26, has a case main body 510 and a cooling/heating unit 520 for cooling or heating a housing object 502 housed in the case main body 510. Examples of the housing object 502 include containers filled with beverages and foods.

The case main body 510 is disposed in an internal space of the vehicular door 503 (i.e., a space between an outer wall 503a and an inner wall 503b of the vehicular door 503). The case main body 510 has a door 512 openable and closable so as to be exposed from the inner wall 503b, and the door 512 is opened to the interior side as shown by a virtual line in FIG. 26.

An insulator 513 such as urethane is attached to the outside of the case main body 510, and the insulator 513 makes it possible to block thermal transfer between the inside and the outside of the case main body 510.

The cooling/heating unit 520 is structured so as to suck air inside the case main body 510, cool or heat the sucked air, and discharge the cooled or heated air to the inside of the case main body 510.

More specifically, the cooling/heating unit 520 has an almost plate-shaped electronic heat pump module 501 for cooling or heating the sucked air, a heat sink 521 thermally connected to one surface of the electronic heat pump module 501, a fan 522 for leading air to the heat sink 521 and discharging the air cooled or heated through the heat sink 521 to the inside of the case main body 510, and a transfer plate 523 thermally connected to the other surface of the electronic heat pump module 501. The electronic heat pump module 501 has the structure described in the second embodiment shown in FIG. 17.

The cooling/heating unit 520 is installed so as to extend through the upper portion on the rear side of the case main body 510. The fan 522, the heat sink 521, the electronic heat pump module 501 and the transfer plate 523 are disposed in sequence from the front side to the rear side of the case main body 510. The rear side herein refers to the outer wall 503a side of the vehicular door 503 (exterior side), and the front side refers to the inner wall 503b side of the vehicular door 503 (interior side).

The fan 522 and the heat sink 521 locate inside the case main body 510. The transfer plate 523 locates outside the case main body 510 and is thermally connected to the outer wall 503a.

The heat sink 521 and the transfer plate 523 are formed from a material having good thermal conductivity such as aluminum and magnesium.

The case main body 510 has a first partition board 516a and a second partition board 516b inside the case main body 510. The first partition board 516a is disposed on the front side of the fan 522 and on the upper side of the case main body 510 so that both the surfaces of the first partition board 516 a face in vertical direction of the case main body 510. The second partition board 516b is disposed on the lower side of the fan 522 and in a rear portion of the case main body 510 so that both the surfaces of the second partition board 516b face in horizontal direction of the case main body 510.

A space between the first partition board 516a and the upper wall of the case main body 510 form a first blower path 515a The second partition board 516b and the rear wall of the case main body 510 form a second blower path 515b.

Description is now given of the usage and operation of the vehicular warming and cooling case.

The housing object 502 is housed in the case main body 510, and if the selector switch 507 is switched to "cooling" for cooling the housing object 502, then the temperature of the one surface side (inside of the case main body 510) of the electronic heat pump module 501 decreases, by which the electronic heat pump module 501 cools air that is in contact with the heat sink 521 through the heat sink 521.

Further, with the operation of the fan 522, air inside the case main body 510 is sucked through the second blower path 515b below the heat sink 521, and the sucked air passes the heat sink 521 so as to be cooled. Then the cooled air is discharged to the front side of the fan 522 through the fan 522.

It is to be noted that part of the discharged air travels through the first blower path 515 a positioned on the front side of the fan 522 and is discharged from the upper side of the case main body 510 to the directly underneath lower side along the door 512 in the vicinity of the door 512.

Then, the air discharged from the fan 522 is sucked again from the lower portion (suction hole) of the second blower path 515b to the cooling/heating unit 520, and the cooled air is circulated inside the case main body 510 in one direction.

The temperature of the other surface side of the electronic heat pump module 501 (outside of the case main body 510) increases, by which the electronic heat pump module 501 heats the transfer plate 523 and discharges heat from the outer wall 503a to outside air.

In the case of switching the selector switch 507 to "heating" for heating the housing object 502, a current is applied to the electronic heat pump module 501 in opposite direction so that the temperature of the one surface side of the electronic heat pump module 501 increases, by which the electronic heat pump module 501 heats air that is in contact with the heat sink 521 through the heat sink 521. At the same time, the temperature of the other surface side of the electronic heat pump module 501 decreases, by which the electronic heat pump module 501 absorbs heat from outside air through the transfer plate 523 and the outer wall 503a.

In this case, the air flow generated by the operation of the fan 522 may be in the same direction as that in the case of cooling the housing object 502. More particularly, the cooling/heating unit 520 sucks air inside the case main body 510 from the lower side of the case main body 510 and discharges air from the upper side of the case main body 510. Further, air in the vicinity of the door 512 flows from the upper side of the case main body 510 to the lower side of the case main body 510.

Alternatively, the air flow generated by the operation of the fan 522 may be in the direction opposite to that in the case of cooling the housing object 502. More particularly, the fan 522 is rotated in opposite direction so that the cooling/heating unit 520 sucks air inside the case main body 510 from the upper side of the case main body 510 and discharges air from the lower side of the case main body 510, in addition to which air in the vicinity of the door 512 flows from the lower side of the case main body 510 to the upper side of the case main body 510.

Thus, according to the above-structured warming and cooling case, the air inside the case main body 510 is cooled or heated while being circulated, which makes it possible to cool the inside of the case main body 510 effectively, swiftly and to an even temperature.

Moreover, since the air in the vicinity of the door 512 of the case main body 510 flows from the upper side to the lower side, or the lower side to the upper side of the case main body 510, the air flow forms an air curtain in an opening portion of the case main body 510 when the door 512 is opened, and therefore interaction of air (heat) inside and outside of the case main body 510 may be blocked. This makes it possible to enhance the cooling or heating effect of the vehicular warming and cooling case.

In the case where the electronic heat pump module 501 (the electronic heat pump device 100) cools the housing object 502, the first semiconductor substrate 110 and the first internal electrode 111 form an emitter 101 to discharge electrons, while the second semiconductor substrate 120 and the second internal electrode 121 form a collector 102 to receive the electrons (see FIGS. 2 and 3).

Herein, the first support member (emitter-side stem) 103 (see FIGS. 1 and 2) is thermally in contact with the first heat transfer plate 41 shown in FIG. 17, and the first heat transfer plate 41 is thermally in contact with the heat sink 521 shown in FIG. 26.

It is to be noted that in the case where the electronic heat pump device 100 heats the housing object 502, current should be applied to the first stem 103 and the second stem 104 in opposite direction. In this case, the first semiconductor substrate 110 and the first internal electrode 111 form a collector to receive electrons, while the second semiconductor substrate 120 and the second internal electrode 121 form an emitter to discharge electrons.

According to the above-structured vehicular warming and cooling case, there is provided the vacuum diode-type electronic heat pump device 100 in which an endothermic side and an exothermic side are thermally separated from each other, so that power consumption is considerably reduced compared to the cooling and heating mechanism of the Peltier device. Moreover, since harmful substances used as materials of the Peltier device are not used, the apparatus becomes environment-friendly.

It is to be understood that in the present embodiment, although the module 501 including the electronic heat pump device 100 shown in FIGS. 1 to 3 is used as the electronic heat pump module, it is also acceptable to use a module including a plurality of the electronic heat pump devices 200 shown in FIGS. 19 to 21 as in the sixth embodiment. The effects in that case are as shown in the description in the sixth embodiment. Further, the apparatus described in the third embodiment may be used as the electronic heat pump device.

Eleventh Embodiment

Figure 27:
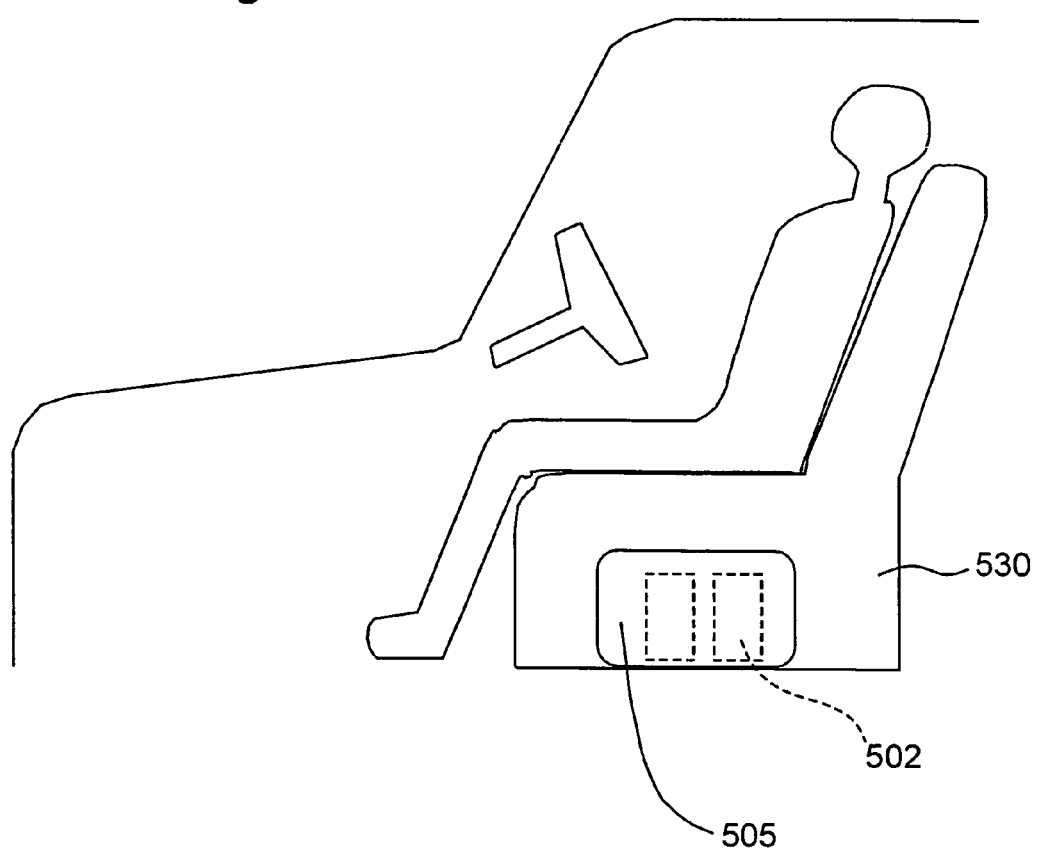
FIG. 27 is a schematic diagram showing the configuration of the vehicular warming and cooling case of the present invention in another application.

Next, FIG. 27 shows another installation example of the vehicular warming and cooling case in the present invention, in which the warming and cooling case 505 is built in the lateral surface (walkthrough portion) of an existing seat 530. Thus, use of the warming and cooling case 505 eliminates the necessity of a compressor, a refrigerant pipe and the like and diminishes capacity of the warming and cooling case, which allows downsizing, and thereby allows installation of the warming and cooling case without compromising comfortability in the interior of a car. Further, absence of a mechanical moving section makes it possible to provide the warming and cooling case with an excellent silence level free from noise typically generated in the compressor.

Twelfth Embodiment

Figure 28:
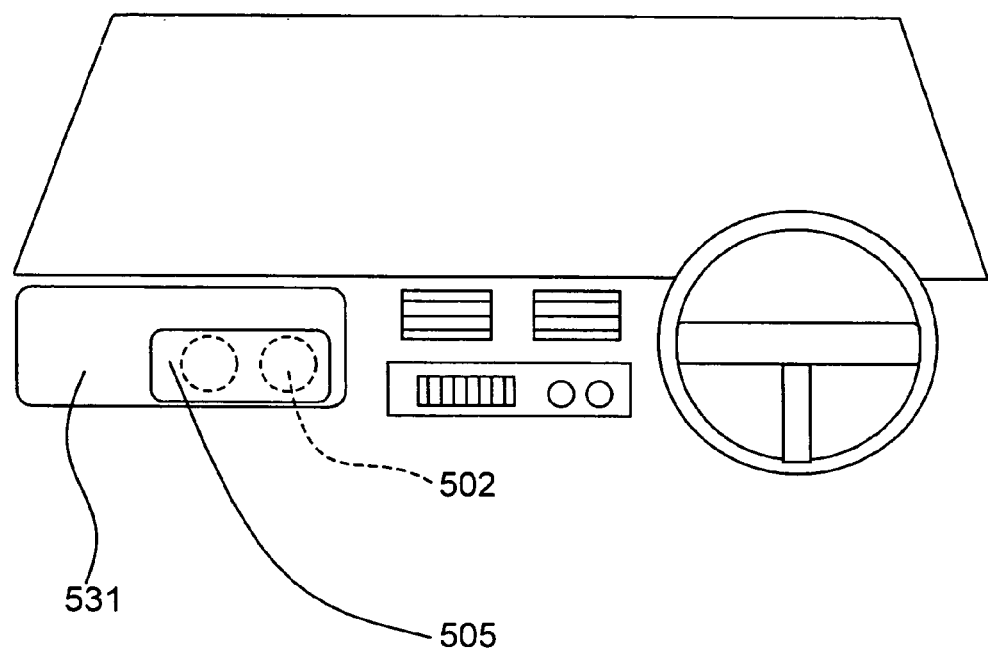
FIG. 28 is a schematic diagram showing the configuration of the vehicular warming and cooling case of the present invention in still another application.

Next, FIG. 28 shows another installation example of the vehicular warming and cooling case in the present invention, in which the warming and cooling case 505 is built in an existing dashboard 531. Thus, use of the warming and cooling case 505 eliminates the necessity of a compressor, a refrigerant pipe and the like and diminishes capacity of the warming and cooling case, which allows downsizing, and thereby allows installation of the warming and cooling case without compromising comfortability in the interior of a car. Further, absence of a mechanical moving section makes it possible to provide the warming and cooling case with an excellent silence level free from noise typically generated in the compressor.

It should be understood that the invention is not limited to the embodiments disclosed, but is capable of design modifications without departing from the spirit of the invention. For example, as the electronic heat pump device, a single apparatus (single device) may be used instead of the modularized one. Further, the spacer may be integrally formed in at least either the first semiconductor substrate or the second semiconductor substrate. Further, the cooling/heating unit may be structured without the heat sink for example. Further, the cooling/heating unit may be structured so as to suck air outside the case main body. Further, as the blower path of the case main body, a pipe may be used instead of the partition board for example. Further, the fan may be disposed either upstream or downstream from the heat sink. Further, the rotation of the fan may be reversed so as to reverse suction and discharge direction, which enables the air flow to be easily switched to the opposite direction without modification of the apparatus.

Further, the cooling/heating unit may be structured so as to discharge air from a plurality of outlets, or suck air from a plurality of inlets, or circulate air in a plurality of directions.

Thirteenth Embodiment

Figure 29:
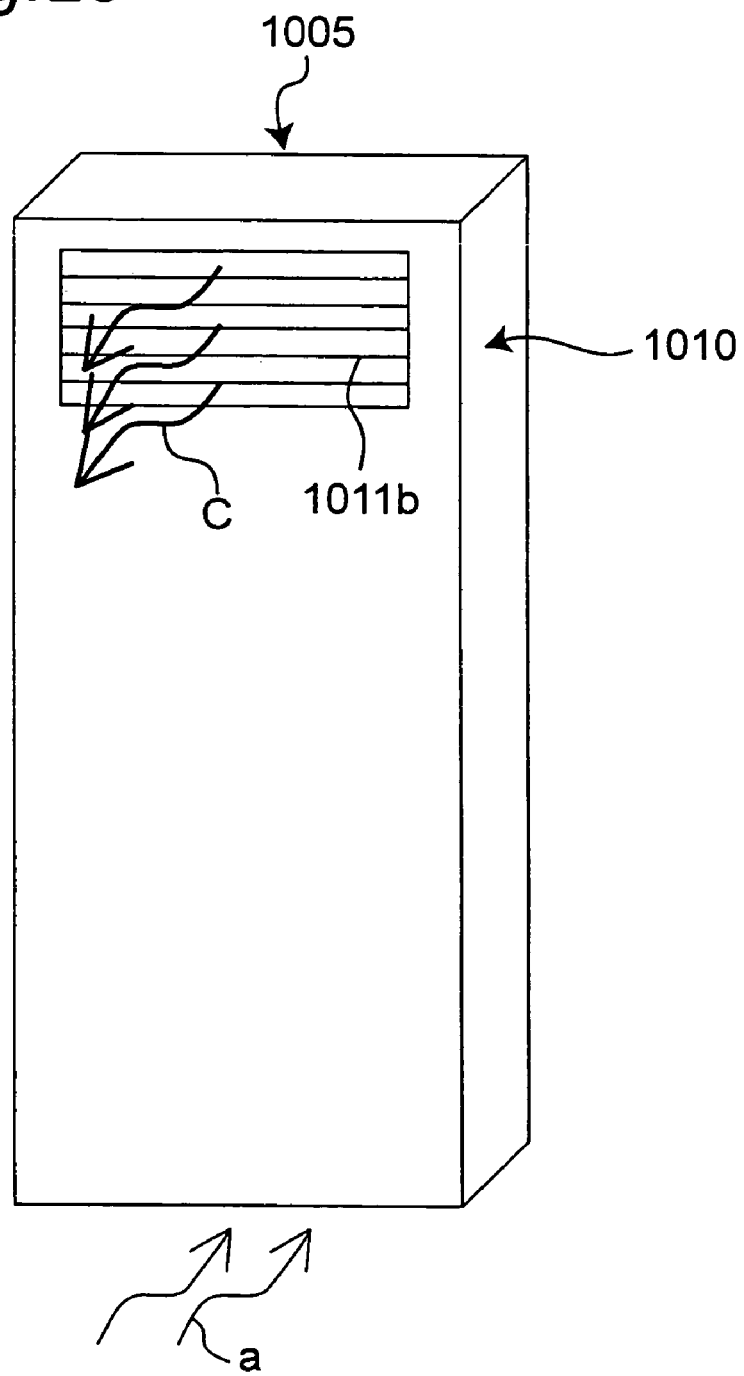
FIG. 29 is a perspective view showing an air conditioner in one embodiment of the present invention.
Figure 30:
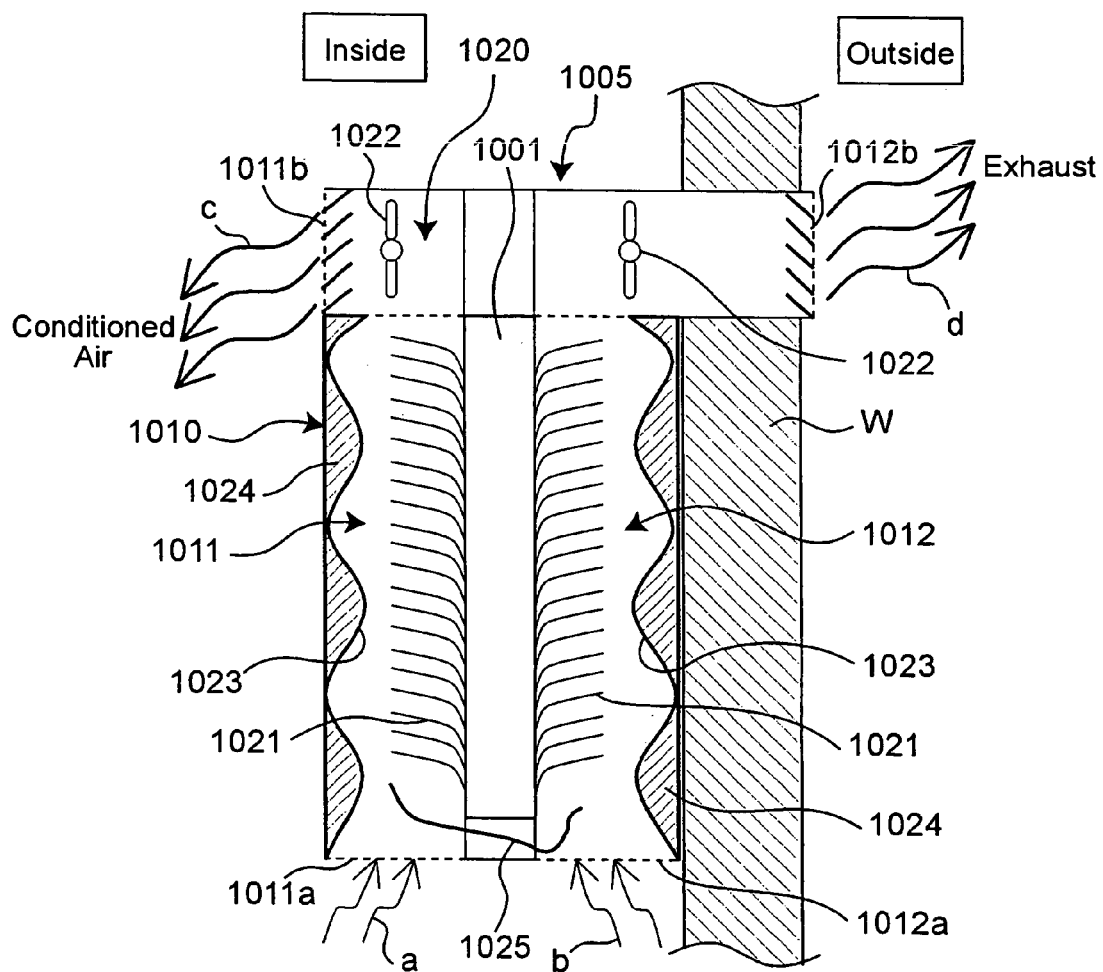
FIG. 30 is a schematic cross sectional diagram of the air conditioner.

FIG. 29 is a perspective view showing an air conditioner in a thirteenth embodiment of the present invention, and FIG. 30 is a schematic cross sectional diagram showing the air conditioner. The air conditioner 1005 is disposed in the interior of a building to cool or heat the interior thereof. It is to be noted that the interior and the exterior thereof are separated by a wall W.

The air conditioner 1005 has a case main body 1010 disposed in the interior and a cooling/heating unit 1020 housed in the case main body 1010. The case main body 1010 is provided with a first path 1011 and a second path 1012 through which air flows.

The first path 1011 has a first inlet 1011a open to the interior for sucking air in the interior, and a first outlet 1011b open to the interior for discharging air to the interior.

The second path 1012 has a second inlet 1012a open to the interior for sucking air in the interior, and a second outlet 1012b open to the exterior for discharging air to the exterior.

More particularly, the second path 1012 extends through the wall W, and the second outlet 1012b is exposed to the exterior.

The first inlet 1011a and the second inlet 1012a are open to the lower side of the case main body 1010, while the first outlet 1011b and the second outlet 1012b are open to the upper side of the case main body 1010.

The cooling/heating unit 1020 is structured so as to suck air in the interior, cool or heat the sucked air, and discharge the cooled or heated air to the interior.

More specifically, the cooling/heating unit 1020 has an almost plate-shaped electronic heat pump module 1001 for cooling or heating the sucked air, heat exchange fins 1021, 1021 respectively thermally connected to both surfaces (one surface and the other surface) of the electronic heat pump module 1001, fans 1022, 1022 for leading air to each of these two heat exchange fins 1021, 1021 and discharging the cooled or heated air through the heat exchange fins 1021, 1021, and heat exchange stirrers 1023, 1023 which are disposed in the state of facing the respective two heat exchange fins 1021, 1021 and whose surfaces facing the heat exchange fins 1021, 1021 are uneven.

More particularly, one surface of the electronic heat pump module 1001, the heat exchange stirrer 1023 facing one surface of the electronic heat pump module and the like form the first path 1011. Moreover, the other surface of the electronic heat pump module 1001, the heat exchange stirrer 1023 facing the other surface of the electronic heat pump module and the like form the second path 1012. In a word, the electronic heat pump module 1001 is disposed in between the first path 1011 and the second path 1012.

The electronic heat pump module 1001 is equal or similar to the electronic heat pump module in the second embodiment shown in FIG. 14, and therefore detailed description thereof will be omitted herein.

A blower fan 1022 for supplying air is disposed in the first outlet 1011b of the first path 1011, and an exhaust fan 1022 for discharging air is disposed in the second outlet 1012b of the second path 1012.

The heat exchange stirrer 1023 is, for example, in a plate shape and the surface facing the heat exchange fin 1021 is in a recessed and protruding state. More particularly, the surface facing the heat exchange fin 1021 is in a waveform along the direction from the inlet to the outlet of the path.

A heat insulator 1024 such as urethane is provided between the heat exchange stirrer 1023 and the case main body 1010, and the heat insulator 1024 makes it possible to block thermal transfer between the inside and the outside of the case main body 1010.

Upon application of voltage from an unshown power supply to the electronic heat pump module 1001, one surface of the electronic heat pump module 1001 (surface on the side of the first path 1011) absorbs heat (is cooled) while the other surface of the electronic heat pump module 1001 (surface on the side of the second path 1012) evolves heat (is heated), or one surface of the electronic heat pump module 1001 evolves heat while the other surface of the electronic heat pump module 1001 absorbs heat.

In this case, there may be provided a current switch means (unshown) for switching direction of a current fed to the electronic heat pump module 1001, which allows easy switching between cooling and heating of the one surface of the electronic heat pump module 1001.

As the current switch means, there may be used, for example, a selector switch, and if the selector switch is switched to "cooling", then the temperature of the one surface of the electronic heat pump module 1001 decreases while the temperature of the other surface of the electronic heat pump module 1001 increases. If the selector switch is switched to "heating", then the temperature of the one surface of the electronic heat pump module 1001 increases while the temperature of the other surface side of the electronic heat pump module 1001 decreases.

Description is now given of the usage and operation of the air conditioner.

In the case where the selector switch is switched to "cooling", then the temperature of the one surface of the electronic heat pump module 1001 decreases, by which the electronic heat pump module 1001 cools air that is in contact with the heat exchange fin 1021 through the heat exchange fin 1021.

Further, with the operation of the blower fan 1022, air in the interior is sucked from the first inlet 1011a of the first path 1011 as shown by an arrow a, and the sucked air passes the heat exchange fin 1021 so as to be cooled. Then the cooled air is discharged to the interior from the first outlet 1011b of the first path 1011 through the blower fan 1022 as shown by an arrow c.

At the same time, the temperature of the other surface of the electronic heat pump module 1001 increases. With the operation of the exhaust fan 1022, air in the interior is sucked from the second inlet 1012a of the second path 1012 as shown by an arrow b, and the sucked air passes the heat exchange fin 1021 so as to be heated. Then the heated air is discharged to the exterior from the second outlet 1012b of the second path 1012 through the exhaust fan 1022 as shown by an arrow c.

In the case where the selector switch is switched to "heating", the temperature of the one surface of the electronic heat pump module 1001 increases. With the operation of the blower fan 1022, air in the interior is sucked from the first inlet 1011a of the first path 1011, and the sucked air passes the heat exchange fin 1021 so as to be heated. Then the heated air is discharged to the interior from the first outlet 1011b of the first path 1011 through the blower fan 1022.

At the same time, the temperature of the other surface of the electronic heat pump module 1001 decreases. With the operation of the exhaust fan 1022, air in the interior is sucked from the second inlet 1012a of the second path 1012, and the sucked air passes the heat exchange fin 1021 so as to be cooled. Then the cooled air is discharged to the exterior from the second outlet 1012b of the second path 1012 through the exhaust fan 1022.

In this case, the surface of the heat exchange stirrer 1023 facing the heat exchange fin 1021 is uneven, which makes it possible to stir and retain air flowing in between the heat exchange fin 1021 and the heat exchange stirrer 1023 in the first path 1011 and the second path 1012 so as to improve a heat exchange efficiency. More specifically, when air flows in between the heat exchange fin 1021 and the heat exchange stirrer 1023, the air flowing along a recess portion to a protruding portion on the surface of the heat exchange stirrer 1023 facing the heat exchange fin 1021 is changed in flow velocity and is deflected so as to be led to the heat exchange fin. Further, in the recess portion of the heat exchange stirrer 1023, air cooled or heated by the heat exchange fin 1021 is retained. Thus, it becomes possible to effectively transfer heat from the electronic heat pump module 1001.

Moreover, on the lower side of the electronic heat pump module 1001 (the side of the first inlet 1011a and the second inlet 1012a), there is provided a drain catcher 1025 for collecting drain water falling in drops from the endothermic surface (cooling surface) of the electronic heat pump module 1001. It is to be noted that the drain water may be led to the exothermic side of the electronic heat pump module 1001. In this case, it becomes possible to discharge the drain water together with exhaust from heating and evaporation, and so a drain hose which is conventionally required becomes unnecessary.

As is described in the second embodiment, the electronic heat pump module 1001 has a box-shaped electrical and thermal insulator 146, and a plurality of the vacuum diode-type electronic heat pump devices 100 embedded in the electrical and thermal insulator 146. A plurality of the electronic heat pump devices 100 are connected in series, in parallel or connected in series-parallel combination (see FIG. 14).

Thus, a plurality of the electronic heat pump devices 100 are modularized, which makes it possible to fulfill a cooling or heating panel with a wide area, thereby achieving swift cooling or heating of the interior.

In the case where the electronic heat pump module 1001 (the electronic heat pump device 100) cools the interior, the first semiconductor substrate 110 and the first internal electrode 111 form an emitter 101 to discharge electrons, while the second semiconductor substrate 120 and the second internal electrode 121 form a collector 102 to receive electrons (see FIGS. 2 and 3).

In this case, the first support member (emitter-side system) 103 (see FIGS. 1 and 2) is thermally in contact with the heat exchange fin 1021 in the first path 1011.

Although unshown, it is to be noted that in the case where the electronic heat pump device 100 heats the interior, current should be applied to the first stem 103 and the second stem 104 in opposite direction. In this case, the first semiconductor substrate 110 and the first internal electrode 111 form a collector to receive electrons, while the second semiconductor substrate 120 and the second internal electrode 121 form an emitter to discharge electrons.

According to the above-structured air conditioner, there is provided the vacuum diode-type electronic heat pump device 100 which has thermally separated endothermic side and exothermic side, which makes it possible to considerably reduce power consumption compared to the cooling and heating mechanism of the Peltier device. Moreover, since harmful substances used as materials of the Peltier device are not used, the air conditioner becomes environment-friendly.

Further, absence of a mechanical moving section makes it possible to provide the air conditioner free from noise typically generated in the compressor. Moreover, the electronic heat pump device 100 is structured such that the emitter serving as a cooling section and the collector serving as a heating section are formed inside the apparatus, which prevents exposure to external environment and influence of gaseous contamination seen in the Peltier device, making it possible to fulfill an air conditioner equipped with an electric-thermal converter with high reliability.

It is to be understood that in the present embodiment, although the module 1 including the electronic heat pump device 100 shown in FIGS. 1 to 3 is used as the electronic heat pump module 1001, it is also acceptable to use a module including the electronic heat pump device 200 shown in FIGS. 19 to 21. The effects in that case are as shown in the description in the sixth embodiment. Further, the apparatus in the third embodiment may be used as the electronic heat pump device.

Fourteenth Embodiment

Figure 31:
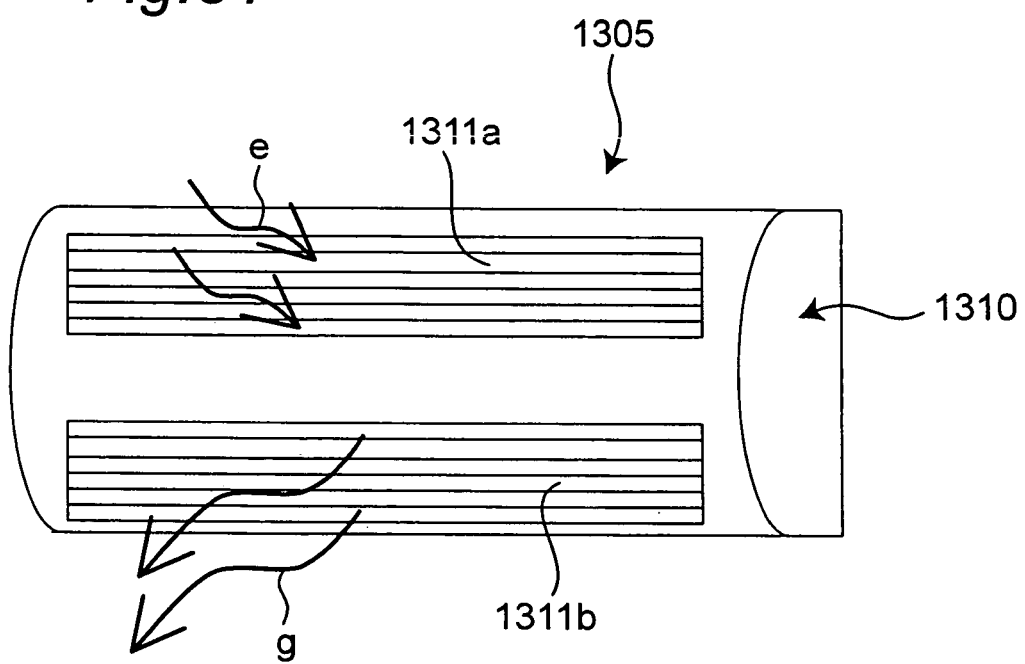
FIG. 31 is a perspective view showing an air conditioner in another embodiment of the present invention.
Figure 32:
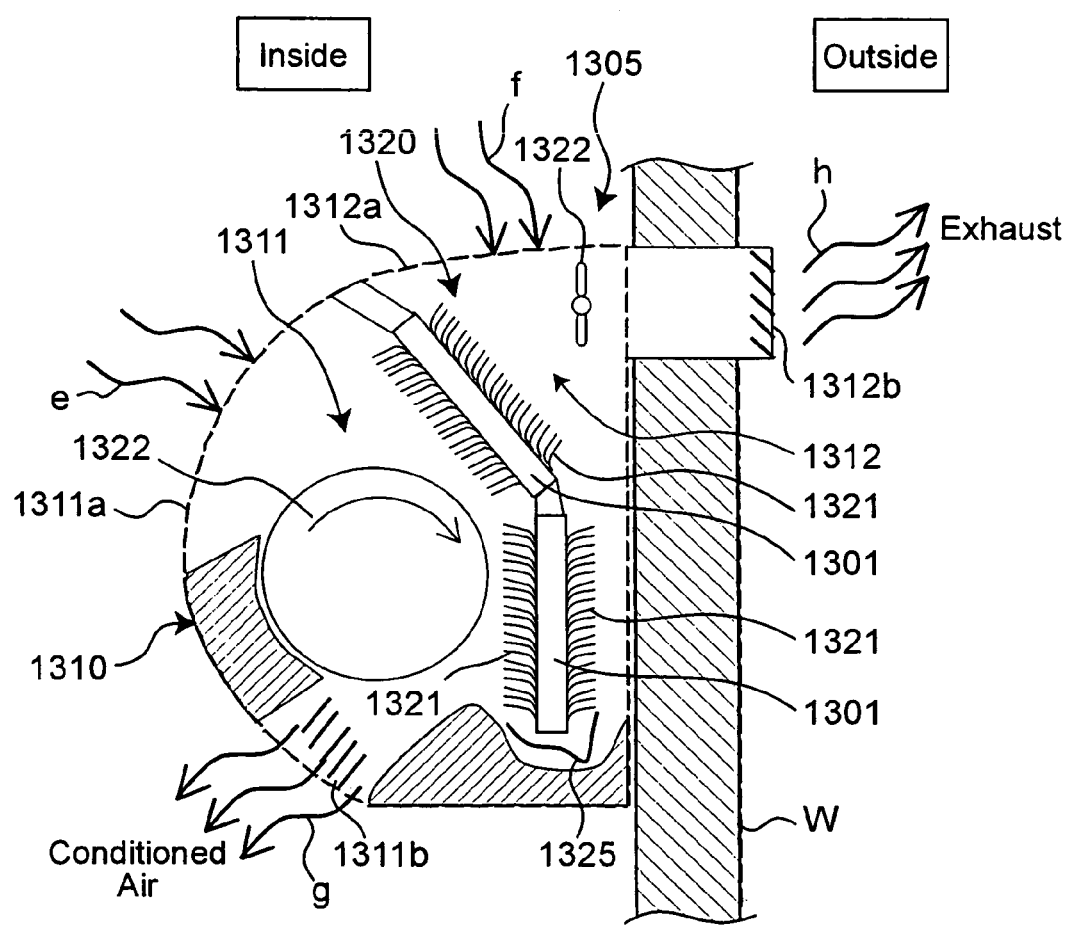
FIG. 32 is a schematic cross sectional diagram of the air conditioner.

FIGS. 31 and 32 show an air conditioner in a fourteenth embodiment of the present invention. The air conditioner 1305 is different from the air conditioner 1005 in the thirteenth embodiment in the structure of air blowing and air discharge.

More particularly, the air conditioner 1305 is structured such that a first inlet 1311a, a second inlet 1312a and a second outlet 1312b are open to the upper side of a case main body 1310, and a first outlet 1311b is open to the lower side of the case main body 1310.

A cooling/heating unit 1320 is equipped with two electronic heat pump modules 1301, 1301 which are provided in the state of being connected in a folded form. Each of the electronic heat pump modules 1301 is identical to the electronic heat pump module 1001 used in the thirteenth embodiment. A first path 1311 and a second path 1312 are connected via a drain catcher 1325 positioned below the electronic heat pump modules 1301.

Moreover, a blower fan 1322 for blowing air is disposed in a middle section of the first path 1311, and a exhaust fan 1322 for discharge air is disposed in the vicinity of the second inlet 1312a.

Description is now given of the operation of the air conditioner 1305.

With the operation of the blower fan 1322, air in the interior is sucked from the first inlet 1311a as shown by an arrow e, and the sucked air passes the heat exchange fins 1321, 1321 on one surface side of the electronic heat pump modules 1301, 1301 so as to be cooled (or heated). Then the cooled (or heated) air is discharged to the interior from the first outlet 1311b as shown by an arrow g.

At the same time, with the operation of the exhaust fan 1322, air in the interior is sucked from the second inlet 1312a as shown by an arrow f, and the sucked air passes the heat exchange fins 1321, 1321 on the other surface side of the electronic heat pump modules 1301, 1301 so as to be heated (or cooled). Then the heated (or cooled) air is discharged to the exterior from the second outlet 1312b as shown by an arrow h.

Fifteenth Embodiment

Figure 33:
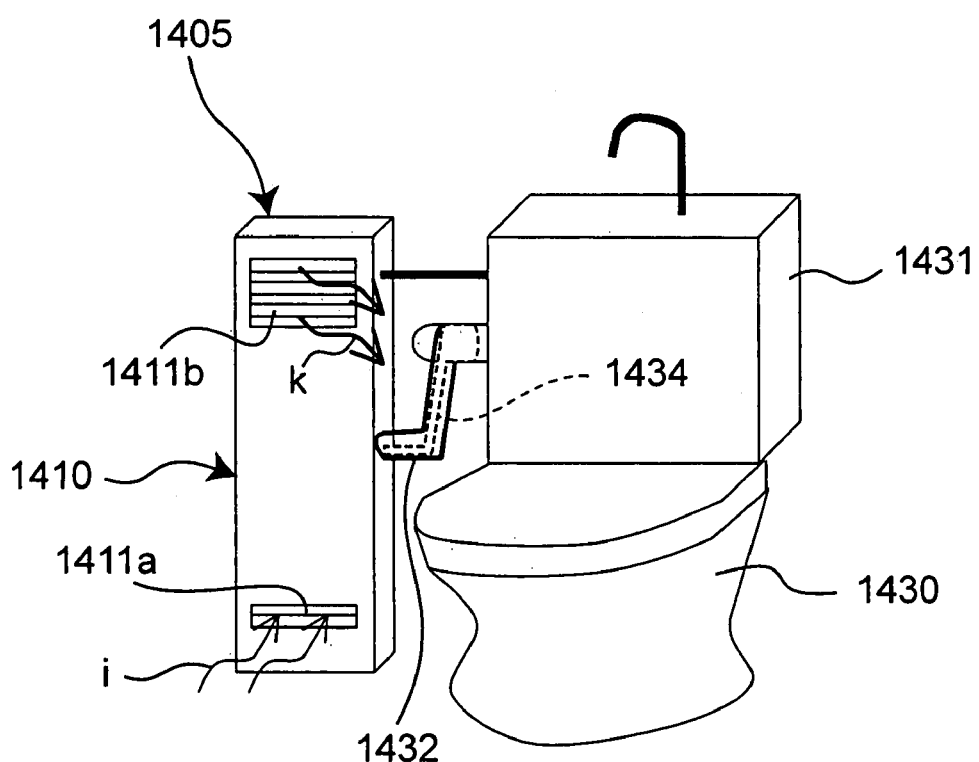
FIG. 33 is a perspective view showing an air conditioner in another embodiment of the present invention.
Figure 34:
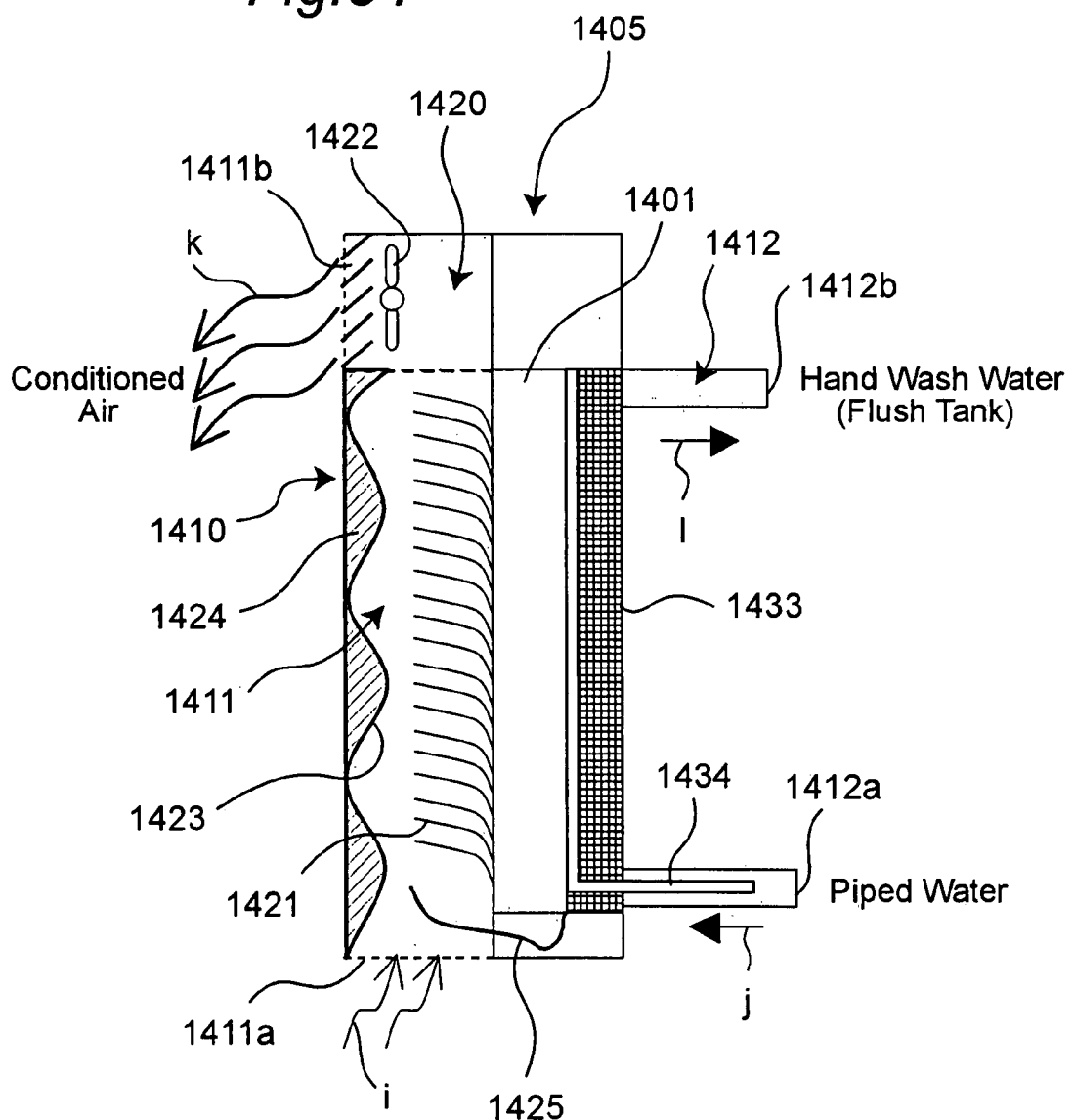
FIG. 34 is a schematic cross sectional diagram of the air conditioner.

FIGS. 33 and 34 show an air conditioner in a fifteenth embodiment of the present invention. The air conditioner 1405, which is used in a small space such as rest rooms, is different from the air conditioner 1005 of the thirteenth embodiment in the structure of the second path.

It is to be noted that an electronic heat pump module 1401, a case main body 1410, a first path 1411, a first inlet 1411a, a first outlet 1411b, a heat exchange fin 1421 connected to one surface of the electronic heat pump module 1401, a blower fan 1422, a heat exchange stirrer 1423, a heat insulator 1424 and a drain catcher 1425 in the air conditioner 1405 are same as those in the air conditioner 1005 of the thirteenth embodiment, and therefore description thereof is omitted herein.

In a second path 1412 of the air conditioner 1405, a second inlet 1412a is open to the lower side of the case main body 1410, and a second outlet 1412b is open to the upper side of the case main body 1410.

The second inlet 1412a is connected to a water pipe 1432 (branched off from a main pipe), and the second outlet 1412b is connected to a flush tank 1431 provided on the rear side of a lavatory basin 1430.

A heat exchanger 1433 thermally connected to the other surface of the electronic heat pump module 1401 is provided inside the second path 1412. The heat exchanger 1433 is provided with a heat transfer member 1434 which is thermally connected thereto. Examples of the heat transfer member 1434 include a metal plate and a heat pipe, which are thermally in contact with the water pipe 1432. The heat transfer member 1434 is thermally connected to the water pipe 1432 because the water pipe 1432 is a site having a large heat release capacity as a heat release material and allows stable heat release.

Description is now given of the operation of the air conditioner 1405.

With the operation of the blower fan 1422, air in the interior is sucked from the first inlet 1411a as shown by an arrow i, and the sucked air passes the heat exchange fin 1421 on one surface of the electronic heat pump module 1401 so as to be cooled (or heated). Then the cooled (or heated) air is discharged to the interior from the first outlet 1411b as shown by an arrow k.

Tap water in the water pipe 1432 is sucked from the second inlet 1412a as shown in an arrow j, and the sucked tap water passes the heat exchanger 1433 on the other surface of the electronic heat pump module 1401 so as to be heated (or cooled). Then, the heated (or cooled) tap water is discharged as hand wash water from the second outlet 1412b to the flush tank 1431 as shown by an arrow 1.

Therefore, according to the air conditioner having the above-structured cooling/heating unit 1420, as with the above embodiments, silence is ensured even in a location with a small space capacity such as rest rooms, and a conventional problem that mixture of cold air and warm air is provided can be avoided.

Sixteenth Embodiment

Figure 35:
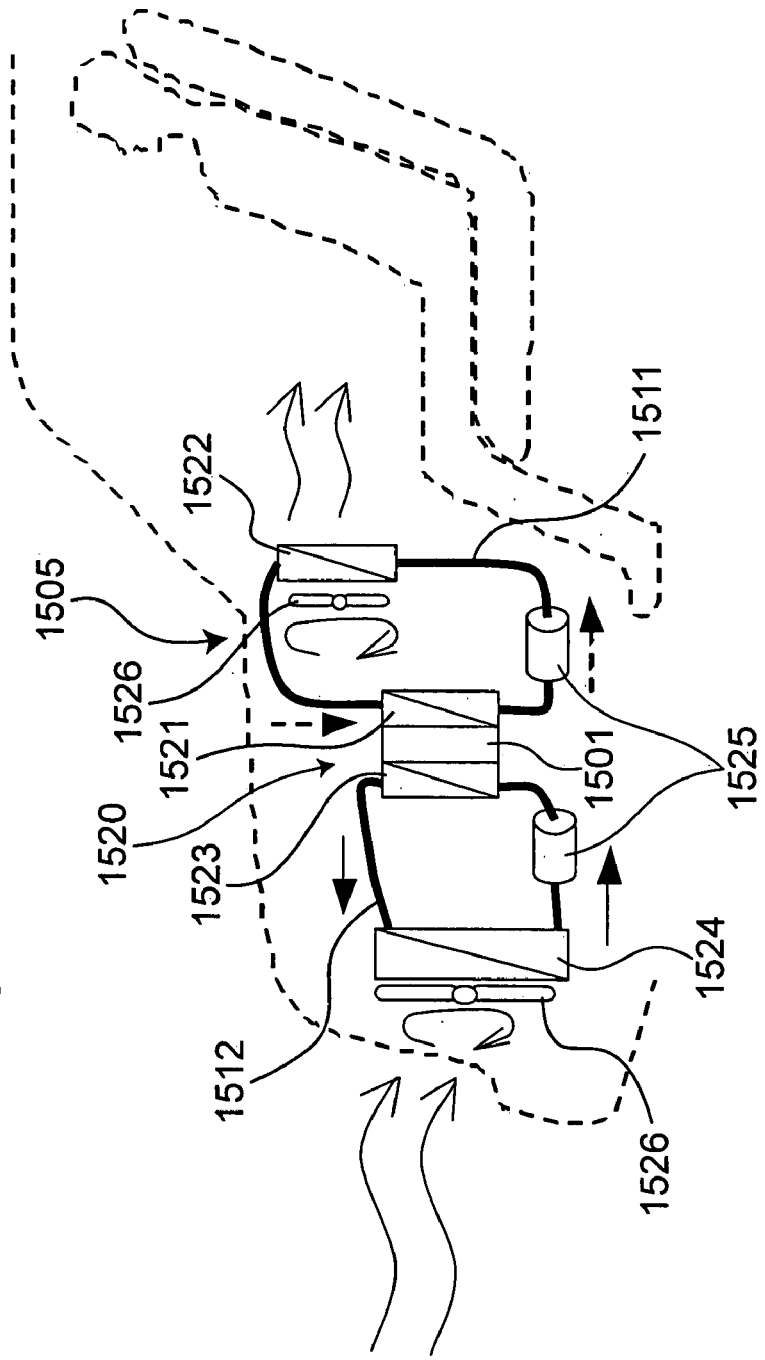
FIG. 35 is a schematic diagram showing the configuration of an air conditioner in still another embodiment of the present invention.

FIG. 35 shows an air conditioner in a sixteenth embodiment of the present invention. The air conditioner 1505 is used inside a car, and a cooling/heating unit 1520 of the air conditioner 1505 has a first circulation passage 1511 provided on one surface side of an electronic heat pump module 1501 for containing a heat transfer medium flow, a pump 1525 provided in the first circulation passage 1511 for circulating the heat transfer medium, a first heat exchanger 1521 which is provided in the first circulation passage 1511 and is thermally connected to the electronic heat pump module 1501, a second heat exchanger 1522 provided in the first circulation passage 1511 for exchanging the heat transfer medium and air, and a fan 1526 for leading the air to the second heat exchanger 1522 and discharging the air cooled (or heated) through the second heat exchanger 1522 to the inside of a car.

The air conditioner 1505 is further composed of a second circulation passage 1512 provided on the other surface side of the electronic heat pump module 1501 for containing a heat transfer medium flow, a pump 1525 provided in the second circulation passage 1512 for circulating the heat transfer medium, a third heat exchanger 1523 which is provided in the second circulation passage 1512 and is thermally connected to the electronic heat pump module 1501, a fourth heat exchanger 1524 provided in the second circulation passage 1512 for exchanging the heat transfer medium and air, a fan 1526 for leading the air to the fourth heat exchanger 1524 and discharging the air cooled (or heated) through the fourth heat exchanger 1524 to the outside of the car.

Description is now given of the operation of the air conditioner 1505.

In the case of cooling the inside of the car, heat is absorbed from the one surface of the electronic heat pump module 1501, and with the operation of the pump 1525 in the first circulation passage 1511, the second heat exchanger 1522 is cooled through the heat transfer medium (refrigerant) and air is blown to the second heat exchanger 1522 so as to introduce cool air to the inside of the car.

At the same time, heat is generated on the other surface of the electronic heat pump module 1501, and with the operation of the pump 1525 in the second circulation passage 1512, the fourth heat exchanger 1524 is heated through the heat transfer medium (refrigerant) and air is blown to the fourth heat exchanger 1524, by which heated air is discharged to the outside of the car.

More particularly, the second heat exchanger 1522 functions as an evaporator and the fourth heat exchanger 1524 functions as a condenser.

In the case of heating the inside of the car, heat is generated on the one surface of the electronic heat pump module 1501, and with the operation of the pump 1525 in the first circulation passage 1511, the second heat exchanger 1522 is heated through the heat transfer medium (refrigerant) and air is blown to the second heat exchanger 1522, by which heated air is introduced to the inside of the car.

At the same time, heat is absorbed from the other surface of the electronic heat pump module 1501, and with the operation of the pump 1525 in the second circulation passage 1512, the fourth heat exchanger 1524 is cooled through the heat transfer medium (refrigerant), and air is blown to the fourth heat exchanger 1524 so as to discharge cool air to the outside of the car.

More particularly, the second heat exchanger 1522 functions as a condenser and the fourth heat exchanger 1524 functions as an evaporator.

Therefore, according to the above-structured air conditioner, it becomes possible to remove a compressor which has conventionally generated mechanical vibration and thereby implement a silent car air conditioner for the age of fuel-cell vehicles and electric cars. Moreover, conventional refrigerant pipes and expansion valves driven at high temperature and high voltage are eliminated, which makes it possible to achieve a car air conditioner expected to improve reliability. Further, the refrigerant circulated at the pressure close to the atmospheric pressure decreases stress loading exerted on respective component members, and temperature regulation of the air conditioner is conducted through current regulation of the electronic heat pump device or flow regulation of the refrigerant transportation pump, which makes it possible to implement a car air conditioner supporting comprehensive temperature regulation.

Seventeenth Embodiment

Figure 36:
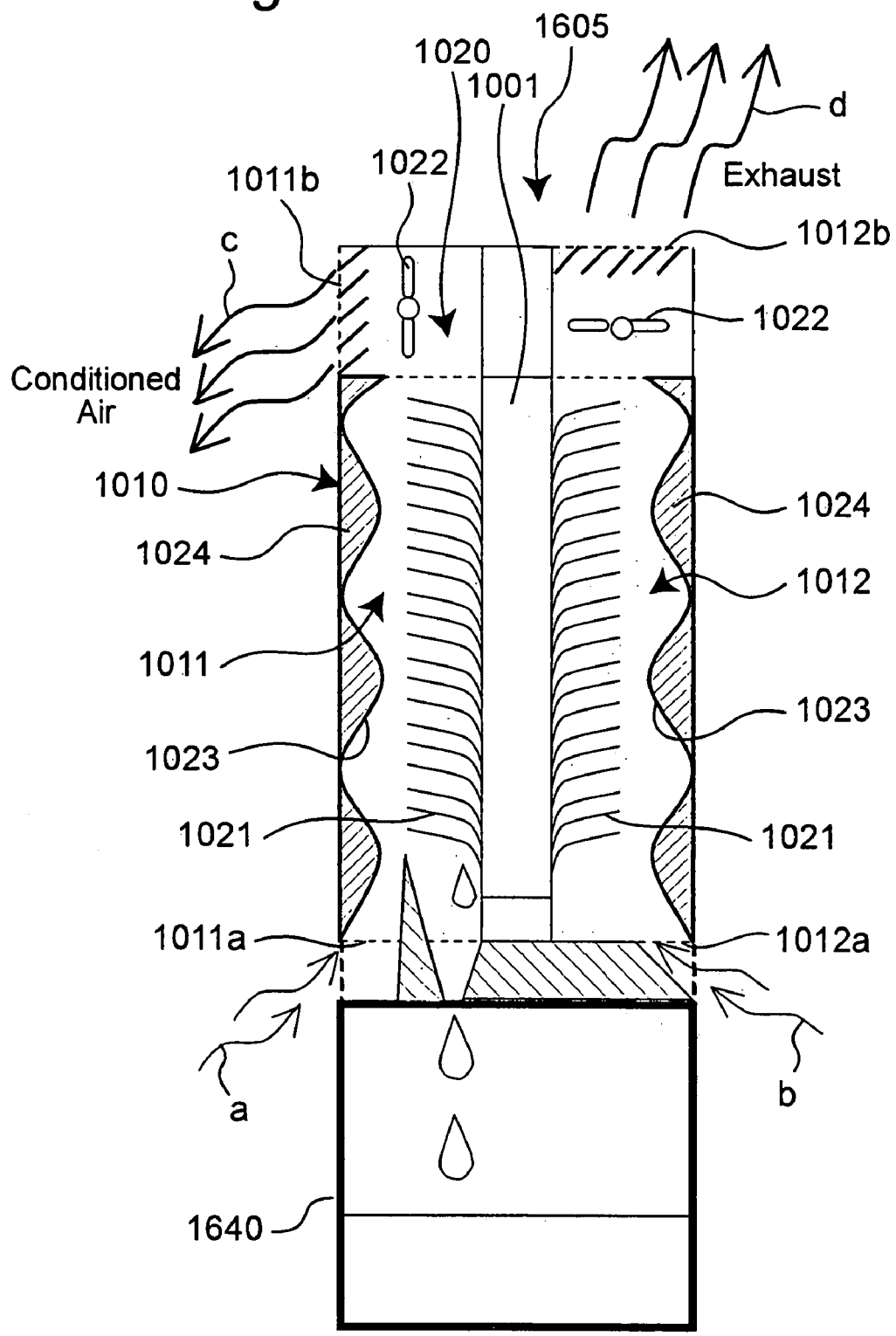
FIG. 36 is a schematic cross sectional view of an air conditioner in still another embodiment of the present invention.
Figure 37:
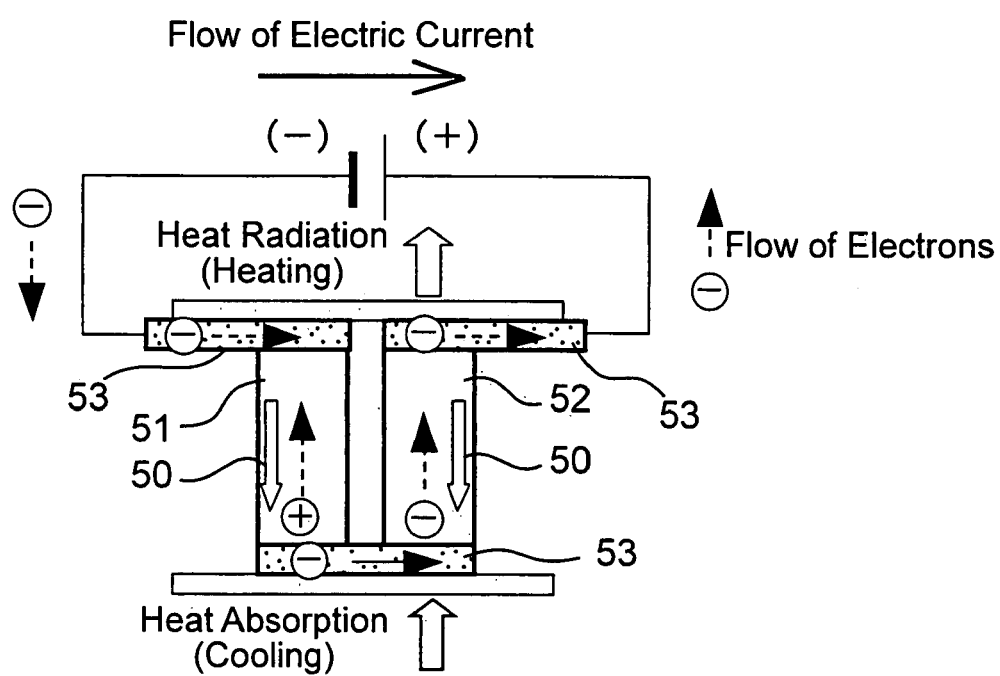
FIG. 37 is an explanatory view showing the operation of a Peltier device.
Figure 38:
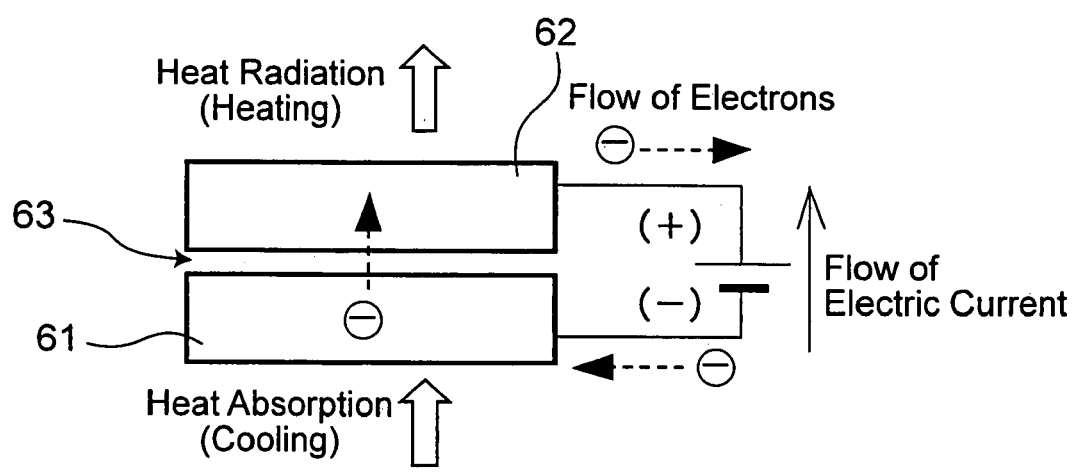
FIG. 38 is an explanatory view showing the operation of a vacuum diode-type electronic heat pump device.
Figure 39:
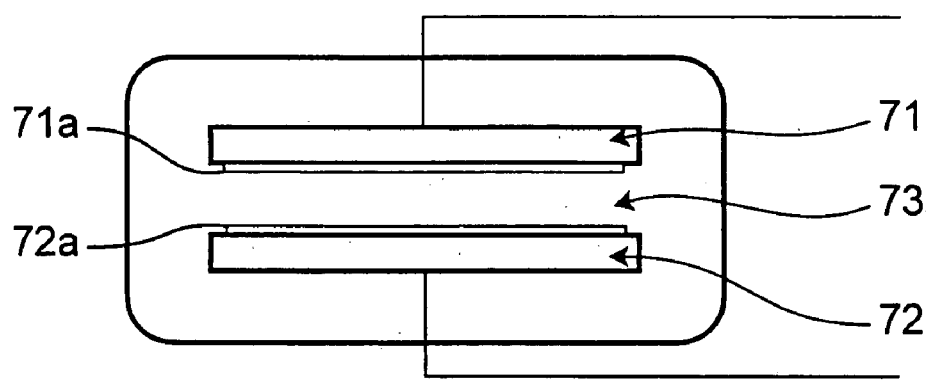
FIG. 39 is a simplified diagram showing the configuration of a first conventional electronic heat pump device.
Figure 40:
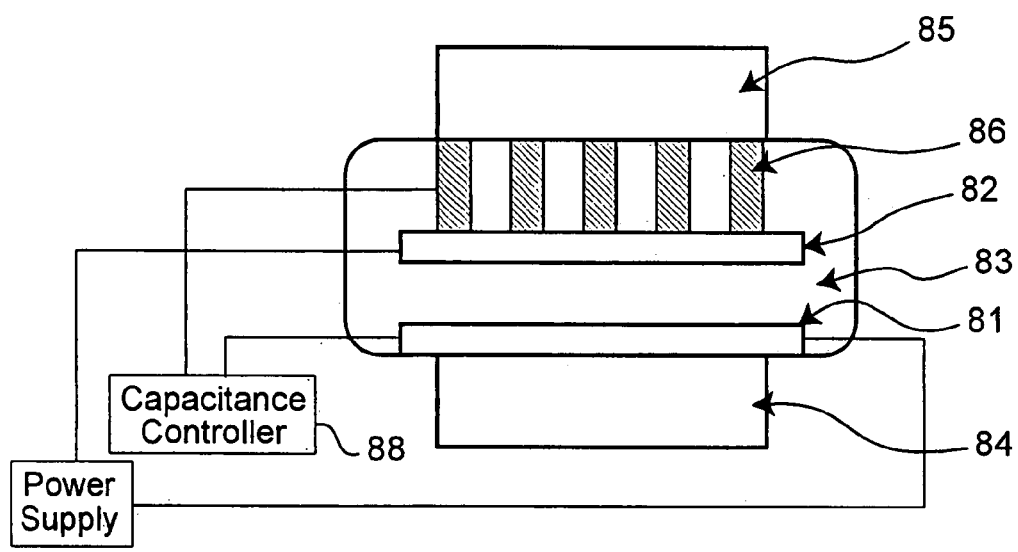
FIG. 40 is a simplified diagram showing the configuration of a second conventional electronic heat pump device.
Figure 41:
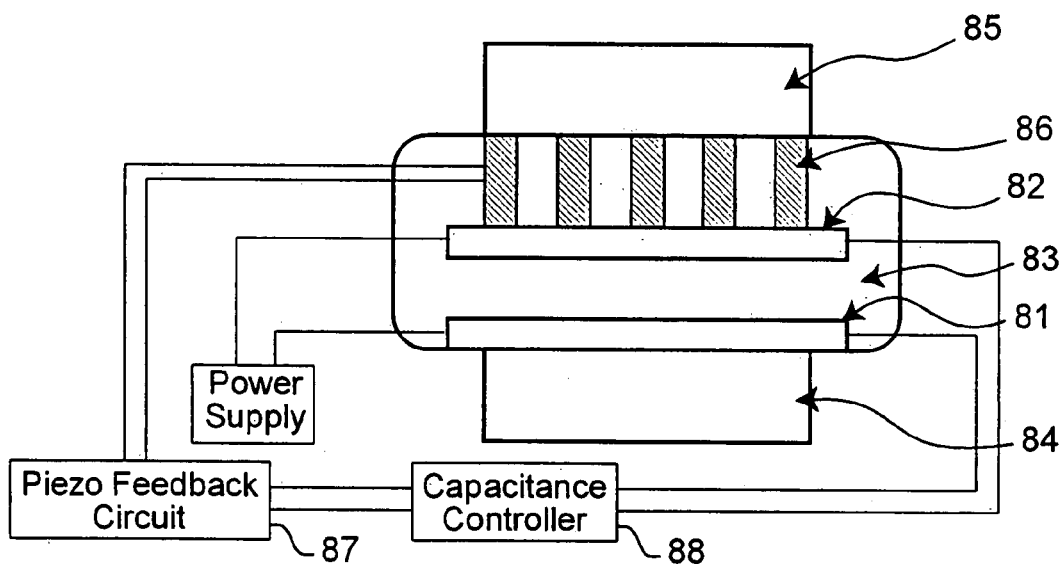
FIG. 41 is a simplified diagram showing the configuration of a third conventional electronic heat pump device.
Figure 42:
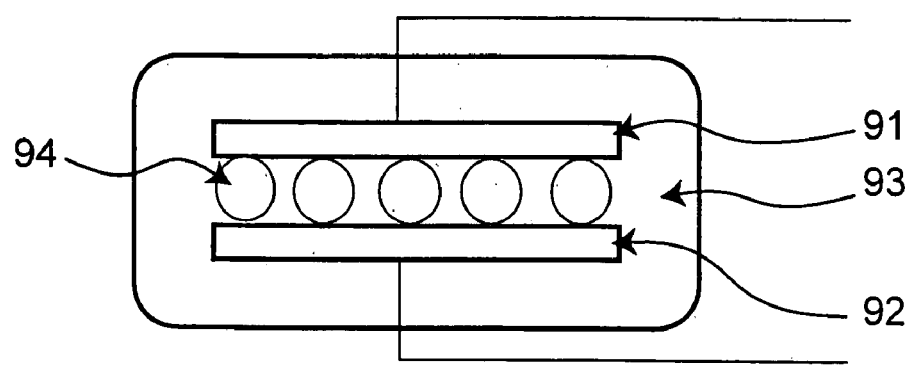
FIG. 42 is a simplified diagram showing the configuration of a fourth conventional electronic heat pump device.

FIG. 36 shows an air conditioner in a seventeenth embodiment of the present invention. It is to be noted that in FIG. 36, component members same as those shown in FIGS. 29 and 30 are designated by the same reference numerals and description thereof is omitted.

Examples of the air conditioner 1605 include a dehumidifier and a spot cooler. A dehumidifier tank 1640 is provided on the lower portion of a case main body 1010.

Therefore, according to the above-structured air conditioner, it becomes possible to reserve drain water produced on the cooling surface (endothermic surface) of the electronic heat pump module 1001 in the dehumidifier tank 1640, which makes the air conditioner most appropriate as a dehumidifier or a spot cooler.

It should be understood that the invention is not limited to the embodiments disclosed, but is capable of design modifications without departing from the spirit of the invention. For example, the electronic heat pump device may be structured as a single apparatus (single device) instead of being modularized. Further, the spacer may be integrally formed in at least either the first semiconductor substrate or the second semiconductor substrate. Further, the control structure to operate the electronic heat pump device, as well as the configuration and the size of the electronic heat pump device are not specifically limited. It is apparent that the air conditioner is applicable as an air conditioner or a ventilator for, for example, a bathroom, an under-floor space, a ceiling space, a train, a ship, a plane, a warehouse, a storage and so forth.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A vacuum diode-type electronic heat pump device, comprising:
    a first support member;
    a first semiconductor substrate having one surface connected to the first support member such that electricity and heat are able to be conducted;
    a first internal electrode provided on the other surface of the first semiconductor substrate;
    a second support member;
    a second semiconductor substrate having one surface connected to the second support member such that electricity and heat are able to be conducted; and
    a second internal electrode provided on the other surface of the second semiconductor substrate,
    wherein one of the first and second semiconductor substrates and the internal electrode corresponding to the one semiconductor substrate constitute an emitter, and the other of the first and second semiconductor substrates and the internal electrode corresponding to the other semiconductor substrate constitute a collector,
    the first internal electrode and the second internal electrode are disposed so as to face each other with a space therebetween, and
    one or more spacers which keep the space between the first internal electrode and the second internal electrode constant and which are electrically and thermally insulative are integrally formed on at least one of the first semiconductor substrate and the second semiconductor substrate, and
    the electronic heat pump device further comprises:
    an electrically and thermally insulative spacing retention member disposed between the first support member and the second support member for keeping a spacing between the first support member and the second support member constant; and
    a sealing member for maintaining a vacuum between the first support member and the second support member.

2. The electronic heat pump device as defined in claim 1, wherein
    the sealing member is in contact with the first sealing member and the second sealing member and is electrically and thermally insulative.

3. The electronic heat pump device as defined in claim 1, wherein
    values of maximum roughness Rz of a surface of the first internal electrode and a surface of the second internal electrode are not more than ½ of a minimum value of the space between the first internal electrode and the second internal electrode.

4. The electronic heat pump device as defined in claim 1, wherein
    the first internal electrode and the second internal electrode are of any one of a single metal, a metal alloy, a metal-nonmetal compound, a semiconductor material, or an impurity-doped semiconductor material.

5. The electronic heat pump device as defined in claim 1, wherein
    of the first internal electrode and the second internal electrode, at least an emitter-side internal electrode is made of a material containing at least any one of cesium (Cs), carbon (C), titanium (Ti), molybdenum (Mo), tungsten (W), chromium (Cr), vanadium (V), nickel (Ni), copper (Cu), silicon (Si), tantalum (Ta), zirconium (Zr), silver (Ag), gold (Au), platinum (Pt), or aluminum (Al).

6. The electronic heat pump device as defined in claim 1, wherein
    the first support member and the second support member have respective hollow sections,
    both the hollow sections and the space between the first internal electrode and the second internal electrode are vacuum, and
    both the hollow sections and the space have an identical degree of vacuum by means of air holes provided in the first support member and the second support member.

7. The electronic heat pump device as defined in claim 1, wherein
    a work function of the first internal electrode is almost equal to or lower than a work function of the second internal electrode.

8. The electronic heat pump device as defined in claim 1, wherein
    the spacers are made of $SiO_2$ and are dispersed in a state of being in contact with the first internal electrode, and
    when a ratio of a total area of the spacers in contact with the first internal electrode to an area of the first internal electrode is referred to as a spacer area ratio, a relationship shown below is satisfied:

(spacer area ratio)×(spacer thermal conductivity [W/m·K])÷(spacer thickness [nm])$\leq 7.6 \times 10^{-7}$.

9. The electronic heat pump device as defined in claim 6, wherein
    the first support member and the second support member each have a copper vessel-like element and a copper plate which covers the vessel-like element and which is provided with the air hole.

10. The electronic heat pump device as defined in claim 6, wherein
    the hollow section of the first support member and the hollow section of the second support member each are filled with a thermal-conductivity material lower in coefficient of thermal expansion than both the support members.

11. The electronic heat pump device as defined in claim 10, wherein
    the thermal-conductivity material is a deformable material which contains at least any one of Ti, Al, Zr, Fe or V, and which has a thin-line shape or a plate shape.

12. The electronic heat pump device as defined in claim 1, wherein
    the spacing retention member is made of a material containing $SiO_2$ as a main constituent, and has a coefficient of thermal expansion equal to or lower than that of the emitter and the collector.

13. The electronic heat pump device as defined in claim 1, wherein
    a rare gas is present in the space between the first internal electrode and the second internal electrode, and the following relationship is satisfied:

(free molecule heat conductivity of the rare gas [m/s·K])×(degree of vacuum of the space [Pa]) $\leq 670$.

14. The electronic heat pump device as defined in claim 6, wherein
the first support member and the second support member each have a vessel-like element, and a plate which covers the vessel-like element and which is provided with the air hole, and
the first semiconductor substrate and the second semiconductor substrate are disposed between the first support member and the second support member in a state of being joined with the corresponding plates.

15. The electronic heat pump device as defined in claim 1, wherein
the first support member and the second support member each are made of Cu or a Cu alloy.

16. The electronic heat pump device as defined in claim 1, wherein
the first support member and the second support member each have an almost rectangular parallelepiped shape.

17. The electronic heat pump device as defined in claim 1, wherein
the first support member and the second support member each are solid.

18. Electronic equipment comprising the electronic heat pump device as defined in claim 1.

* * * * *